US012800797B2

(12) United States Patent
Abe et al.

(10) Patent No.: US 12,800,797 B2
(45) Date of Patent: Nov. 17, 2026

(54) FILM, ELEMENT, AND EQUIPMENT

(71) Applicant: CANON KABUSHIKI KAISHA, Tokyo (JP)

(72) Inventors: Tatsuki Abe, Tochigi (JP); Kyohei Ishikawa, Saitama (JP); Kazuhiro Hoshino, Tochigi (JP); Takahito Chibana, Tochigi (JP); Hiroaki Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1226 days.

(21) Appl. No.: 17/741,575

(22) Filed: May 11, 2022

(65) Prior Publication Data

US 2022/0373717 A1 Nov. 24, 2022

(30) Foreign Application Priority Data

May 20, 2021 (JP) ................................ 2021-085226
Dec. 15, 2021 (JP) ................................ 2021-203078
May 2, 2022 (JP) ................................ 2022-075657

(51) Int. Cl.
*H10F 39/00* (2025.01)
*G02B 1/115* (2015.01)

(52) U.S. Cl.
CPC ........... *G02B 1/115* (2013.01); *H10F 39/805* (2025.01)

(58) Field of Classification Search
CPC ........... H01L 27/1462; H01L 27/14627; H01L 27/14629; H01L 27/14623; H01L 27/14621; G02B 1/115; G02B 1/116; G02B 1/113; G02B 1/11; G02B 1/10; C23C 14/0057; C23C 14/34; C23C 14/3478
See application file for complete search history.

(56) References Cited

U.S. PATENT DOCUMENTS

| | | | |
|---|---|---|---|
| 5,234,556 | A | 8/1993 | Oishi et al. |
| 5,460,877 | A | 10/1995 | Oishi et al. |
| 5,805,973 | A | 9/1998 | Coffinberry et al. |
| 6,204,203 | B1 | 3/2001 | Narwankar et al. |
| 6,368,470 | B1 | 4/2002 | Woodard |
| 6,872,452 | B2 | 3/2005 | Taninaka et al. |
| 8,227,152 | B2 | 7/2012 | Hayashi et al. |
| 8,969,868 | B2 | 3/2015 | Shieh et al. |
| 8,975,164 | B2 | 3/2015 | Liu et al. |
| 9,983,333 | B2 | 5/2018 | Scherer et al. |
| 11,114,484 | B2 | 9/2021 | Ogino et al. |
| 11,605,665 | B2 | 3/2023 | Hirota et al. |
| 12,027,562 | B2 | 7/2024 | Miyake et al. |

(Continued)

FOREIGN PATENT DOCUMENTS

| | | | |
|---|---|---|---|
| CN | 1420943 | A | 5/2003 |
| CN | 1459036 | A | 11/2003 |

(Continued)

OTHER PUBLICATIONS

Office Action in Taiwanese Application No. Application No. 111117985 (Jul. 2024).

(Continued)

*Primary Examiner* — Kretelia Graham
*Assistant Examiner* — Adin Hrnjic
(74) *Attorney, Agent, or Firm* — Venable LLP

(57) ABSTRACT

A film comprises an amorphous transition metal oxide as a main component, and 1.0 at % or more of hydrogen.

31 Claims, 29 Drawing Sheets

(56) References Cited

U.S. PATENT DOCUMENTS

2002/0195643 A1 12/2002 Harada
2003/0072882 A1 4/2003 Niinisto et al.
2004/0009678 A1 1/2004 Asai et al.
2004/0091612 A1 5/2004 Bernard et al.
2005/0008775 A1* 1/2005 Asakawa .............. C23C 16/405 427/166
2009/0194797 A1* 8/2009 Shimizu ................. H10D 30/69 257/288
2010/0279124 A1 11/2010 Scherer
2012/0068250 A1* 3/2012 Ino ....................... H10D 64/037 257/E21.21
2012/0295116 A1 11/2012 Kihara et al.
2014/0138674 A1 5/2014 Sato et al.
2015/0212240 A1* 7/2015 Cai ...................... G02B 5/0808 428/448
2015/0285957 A1 10/2015 Scherer et al.
2015/0349130 A1 12/2015 Tanemura et al.
2016/0155531 A1 6/2016 Kawakami et al.
2016/0268127 A1 9/2016 Yamazaki
2016/0359109 A1 12/2016 Kamimuta et al.
2017/0330938 A1 11/2017 Baeck et al.
2019/0371836 A1* 12/2019 Ogino ................. H10F 39/8057
2020/0158916 A1* 5/2020 Hart ....................... G02B 1/113
2020/0158917 A1 5/2020 Hart et al.
2020/0176246 A1 6/2020 Huotari et al.
2020/0341170 A1 10/2020 Akiba et al.
2022/0155619 A1* 5/2022 Hattori .................... G02F 1/035

FOREIGN PATENT DOCUMENTS

CN 101441330 A 5/2009
JP 7-311393 A 11/1995
JP 10-217377 A 8/1998
JP 2004-134451 A 4/2004
JP 2004-272284 A 9/2004
JP 2005-031462 A 2/2005
JP 2006-165589 A 6/2006
JP 2008-65014 A 3/2008
JP 2009-016651 A 1/2009
JP 2009-182207 A 8/2009
JP 2010-222214 A 10/2010
JP 2011-249674 A 12/2011
JP 2012-506950 A 3/2012
JP 2014-45075 A 3/2014
JP 2017-083789 A 5/2017
JP 2017-193755 A 10/2017
JP 2018-190993 A 11/2018
JP 2019-212737 A 12/2019
JP 2021-072435 A 5/2021
TW 201428852 A 7/2014
TW 201448251 A 12/2014
TW 202044335 A 12/2020
WO 2010/050520 A1 5/2010
WO 2014/136798 A1 9/2014
WO 2019/027526 A2 2/2019

OTHER PUBLICATIONS

Notice of Submission of Opinion in Korean Application No. 10-2022-0056347 (Mar. 2025).
First Office Action in Chinese Application No. 202210534600.0 (Mar. 2025).
Notice of Reasons for Refusal in Japanese Application No. 2022-075657 (Oct. 2023).
Extended European Search Report in European Application No. 22172830.6 (Oct. 2022).
J.M. Khoshman et al., "Amorphous Hafnium Oxide Thin Films for Antireflection Optical Coatings," 202 Surf. Coat. Technol. 2500-2502 (2008) (XP022475460).
V.H. Mudavakkat et al., "Structure, Morphology and Optical Properties of Nanocrystalline Yttrium Oxide (Y203) Thin Films," 34(5) Opt. Mater. 893-900 (Mar. 2012) (XP093238816).
Wikipedia: Transition Metal (Retrieved: Jan. 2025 at https://en.wikipedia.org/wiki/Transition_metal) (XP093238841).
PubChem: Zinc Zn (Element)—(Retrieved: Jan. 2025 at https://pubchem.ncbi.nlm.nih.gov/element/Zinc) (XP093238844).
Communication Pursuant to Art. 94(3) EPC in European Application No. 22 172 830.6 (Jan. 2025).
Notice of Reasons for Refusal in Japanese Application No. 2022-075657 (Apr. 2023).
Dave, V., et al. Influence of sputtering pressure on the structural, optical and hydrophobic properties of sputtered deposited HfO2 coatings, Thin Solid Films 549 (2013) 2-7.
Yu, Z., et al. Effects of sputtering pressure and post-metallization annealing on the physical properties of rf-sputtered Y2O3 film, Journal of Alloys and Compounds 509 (2011) 5810-5815.
Notice of Reasons for Refusal in Japanese Application No. 2024-062864 (Mar. 31, 2026).

* cited by examiner

FILM, ELEMENT, AND EQUIPMENT

BACKGROUND OF THE INVENTION

Field of the Invention

The present invention relates to a film including metal oxide.

Description of the Related Art

Application of metal oxide in the field of optical elements, electric elements, and semiconductor elements is considered.

In various pieces of optical equipments such as exposing apparatuses, an optical element is coated with an optical film to improve optical characteristics such as antireflection characteristics and reflection characteristics. In a capacitor element or a semiconductor element, an insulating film is used for insulating a capacitor electrode, a gate electrode, and the like from other components.

There is a tendency that as the standard for the performance of optical equipments becomes higher, the number of optical elements used in the equipment increases, and the number of optical surfaces that need to be coated with an optical film also increases. In addition, the optical film used for the coating is not necessarily constituted by a single layer, and may be constituted by multiple layers in some cases, and therefore there is a tendency that the total number of provided layers increases.

In the field of optical elements, it is attempted to coat an optical member such as a lens or a filter with a film including metal oxide as the optical film.

Japanese Patent Laid-Open Publication No. H10-217377 discloses that a dielectric multilayer film used for an optical element contains hydrogen to suppress deterioration of the dielectric multilayer film. The hydrogen contained in the dielectric film fills in lattice defects that cause light absorption, and thus it is attempted to elongate the lifetime of the dielectric multilayer film. Examples of a dielectric multilayer film containing hydrogen, $SiO_2$, $Al_2O_3$, $TiO_2$, $Ta_2O_5$, $HfO_2$, and $ZrO_2$ are disclosed.

Japanese Patent Laid-Open Publication No. H10-217377 discloses a technique of using a dielectric film of $SiO_2$ or $TiO_2$ containing hydrogen to provide a highly-durable dielectric multilayer film for an optical element. Although $Ta_2O_5$, $HfO_2$, $Al_2O_3$, and $ZrO_2$ containing hydrogen are suggestively listed as examples of dielectric materials other than $SiO_2$ and $TiO_2$, detailed information thereof is not disclosed.

Japanese Patent Laid-Open (Translation of PCT Application) Publication No. 2012-506950 discloses a technique of reducing the internal stress of a coating by adding 1 at % to 10 at % of silicon to suppress light absorption and light scattering in the case of using hafnium oxide as an optical film.

In the field of semiconductor elements, using a film containing hafnium oxide as a gate insulating film of a transistor is attempted. In the case of using a high-dielectric-constant film containing hafnium oxide as a gate insulating film of a transistor, there is a problem that crystallization is caused by high-temperature processing in a manufacturing process, and a leak current through crystal grain boundary or through a defect level increases.

Japanese Patent Laid-Open Publication No. 2006-165589 discloses a technique of forming a silicon-containing high-dielectric-constant film by dispersing silicon in hafnium oxide to suppress crystallization of the high-dielectric-constant material and increase in the leak current when high-temperature processing is performed after forming a gate insulating film.

Japanese Patent Laid-Open Publication No. 2017-83789 proposes a reflection-type optical element including an optical film whose designed central wavelength is 400 nm. As examples of a material used for a high-dielectric-constant layer of the optical film coating the reflection-type optical element, tantalum oxide ($Ta_2O_5$), niobium oxide ($NbO_5$), titanium oxide ($TiO_2$), zirconium oxide ($ZrO_2$), zinc oxide ($ZnO$), hafnium oxide ($HfO_2$), aluminum oxide ($AlN$), and silicon nitride ($SiN$) are disclosed.

Japanese Patent Laid-Open Publication No. H07-311393 discloses a nonlinear drive element including metal tantalum as a bottom metal, tantalum oxide as an insulating film, and a transparent conductive film as a top metal and having a hydrogen atom concentration less than 1 at % in the tantalum oxide as the insulating film.

In the field of optical elements, there has been a demand for realization of an optical film having high performance. In the field of electric elements, there has been a demand for realization of an insulating film having high performance. Therefore, it is an object of the present invention to provide a technique advantageous for controlling the characteristics of a film including metal oxide.

SUMMARY OF THE INVENTION

According to a first aspect of the present invention, a film comprises amorphous transition metal oxide as a main component, and 1.0 at % or more of hydrogen. The film is an optical film.

According to a second aspect of the present invention, a film comprises amorphous transition metal oxide as a main component, and 1.0 at % or more of hydrogen. A sum of a transition metal content, an oxygen content, a hydrogen content, and an argon content of the film is 99.0 at % or more.

Further features of the present invention will become apparent from the following description of exemplary embodiments with reference to the attached drawings.

DESCRIPTION OF THE EMBODIMENTS

Figure 1:
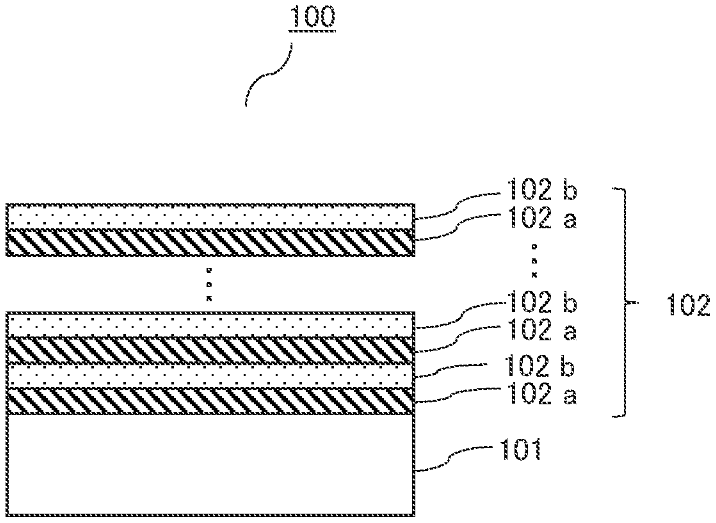
FIG. 1 is a schematic section view of an optical element according to a first embodiment.

Embodiments of the present invention will be described below with reference to drawings. A plurality of embodiments will be sequentially described, and a specific example will be described for each embodiment.

A film of the embodiments includes amorphous transition metal oxide as a main component, and contains 1.0 at % or more of hydrogen. In an element including this film, this film is disposed on a base that the element includes. Being amorphous refers to a case where, when an X-ray or electron beam is radiated onto a film serving as a measurement target at a small incident angle of about 0.5° and a diffraction pattern is observed, a clear diffraction peak is not detected, in other words, a halo pattern is observed. Therefore, being amorphous mentioned herein does not necessarily exclude a state in which a material of a slightly crystalline state is included. As used herein, "at %" refers to "atomic percentage", i.e., a ratio of a number of a specific atom of a composition of a subject relative to a total number of all atoms of the composition of a subject.

Hereinafter, a specific element of interest among transition elements will be referred to as a transition metal T. The transition metal oxide is a compound of the transition metal T and oxygen. The transition metal T is an element of one of groups 3 to 11 in the periodic table, and is a transition element. In a transition element in which a d-orbital or f-orbital thereof is not a closed shell unlike main-group elements, the hydrogen level or the oxygen level affects the characteristics of the film.

Examples of metal oxides of transition elements (first transition elements; 3d transition elements) belonging to the period 4 include titanium oxide ($Ti_2O_3$/$TiO_2$/TiO; group 4), vanadium oxide ($VO_2$; group 5), chromium oxide ($Cr_2O_3$; group 6), cobalt oxide ($Co_3O_4$; group 9), and nickel oxide (NiO; group 10).

Examples of metal oxides of transition elements (second transition elements; 4d transition elements) belonging to the period 5 include yttrium oxide ($Y_2O_3$; group 3), zirconium oxide ($ZrO_2$; group 4), niobium oxide ($Nb_2O_5$; group 5), and molybdenum oxide ($MoO_3$; group 6).

Examples of metal oxides of transition elements (third transition elements; 5d, 4f transition elements) belonging to the period 6 include lanthanum oxide ($La_2O_3$; lanthanoid), cerium oxide ($CeO_2$; lanthanoid), samarium oxide ($Sm_2O_3$; lanthanoid), ytterbium oxide ($Yb_2O_3$; lanthanoid), hafnium oxide ($HfO_2$; group 4), tantalum oxide ($Ta_2O_5$; group 5), and tungsten oxide ($WO_3$; group 6).

Typically, oxides of transition metals of groups 3 to 6 can be used. Particularly, oxide of a transition metal of group 4 or group 5 is preferable. In addition, typically, oxide of transition metals of periods 4 to 6 can be used. Particularly, oxide of a transition metal of period 5 or period 6 is preferable.

In the transition metal oxide, a content J (at %) of the transition metal T, a content K (at %) of oxygen, and a content L (at %) of hydrogen are defined, and J, K, and L>0 holds. In the transition metal oxide, a content M (at %) of an impurity A, and a content N (at %) of an impurity B are defined. M and N≥0 holds. Here, a case where elements other than the transition metal, oxygen, and hydrogen included in the transition metal oxide are two elements will be described as an example. That is, the transition metal oxide includes five elements. However, the elements other than the transition metal, oxygen, and hydrogen included in the transition metal oxide may be one element or three or more elements. That is, the number of elements included in the transition metal element oxide may be 4, 6, or more.

A film including an oxide of the transition metal T as a main component is a film in which the sum of the content J of the transition metal T and the oxygen content K is larger than each of the contents L, M, and N of the elements other than the transition metal T and oxygen included in the film ($J+K>L$, $J+K>M$, and $J+K>N$). Since the transition metal oxide film of the present embodiment includes hydrogen in addition to the transition metal and oxygen, the sum of the content J of the transition metal T and the oxygen content K is less than 100 at % ($J+K<100$ at %), and since the hydrogen content is 1.0 at % or more, the sum of the content J of the transition metal T and the oxygen content K is 99.0 at % or less ($J+K \leq 99.0$ at %).

The stoichiometric composition of oxide of a certain transition metal T is defined as $T_jO_k$. When $k \geq 1$ holds, $J \times (k-0.5)/j < K < J \times (k+0.5)/j$ can be satisfied, and when $k \geq 2$ holds, $J \times (k-1)/j < K < J \times (k+1)/j$ can be satisfied. It is preferable that the sum of the content J of the transition metal T and the oxygen content K in the transition metal oxide film is larger than the sum of the contents L, M, and N of all the other elements than the transition metal T and oxygen included in the transition metal oxide film. That is, it is preferable that $J+K>L+M+N$ is satisfied. In this case, $J+K$ is larger than 50 at %.

Typically, hydrogen in the transition metal oxide film can exist in the form of bonding to the transition metal T of the transition metal oxide so as to fill in oxygen defects of the transition metal oxide, or in the form of bonding to the oxygen of the transition metal oxide. Therefore, in the transition metal oxide film, the hydrogen content L can be lower than the oxygen content K ($L<K$). In addition, the hydrogen content L of the transition metal oxide film can be lower than the content J of the transition metal T in the transition metal oxide film ($L<J$). The content J of the transition metal T of the transition metal oxide film being higher than the hydrogen content L ($J>L$) is advantageous for obtaining a finer transition metal oxide film. Physical properties of a finer transition metal oxide film are typically farther from the physical properties of a vacuum. For example, the refractive index of the finer transition metal oxide film is farther from the physical properties of the vacuum whose refractive index is 1.0, and therefore is higher. To obtain a finer transition metal oxide film, it is preferable that the hydrogen content L is equal to or less than half of the content J of the transition metal T ($L \leq J/2$).

In the stoichiometric composition $T_jO_k$ of oxides of many transition elements, $j \leq k$, especially $j<k$ holds. Therefore, the oxygen content K is higher than the content J of the transition metal T ($K>J$).

As described above, the hydrogen content L is lower than the content J of the transition metal T and the oxygen content K ($J, K>L$). That is, typically $K>J>L$ is satisfied.

The composition of the amorphous transition metal oxide film can be typically deviated from the stoichiometric composition because the film is amorphous. That is, a ratio KJ between the content J of the transition metal T and the oxygen content K can be different from k/j of the stoichiometric composition $T_jO_k$ of the transition metal oxide. For example, in the case where the hydrogen in the film is present in the form of bonding to the transition metal of the transition metal oxide so as to fill in the oxygen defects of the transition metal oxide, $K/J>k/j$ can hold. In addition, for example, in the case where the hydrogen in the film is present in the form of bonding to the oxygen in the transition metal oxide, $K/J<k/j$ can hold.

Elements other than the transition metal, oxygen, and hydrogen that can be included in the transition metal oxide film can be transition elements or main-group elements. However, it is preferable that as less elements other than the transition metal, oxygen, and hydrogen as possible are included. Hereinafter, impurities A and B that can be included in the transition metal oxide film will be described.

The content M (at %) of the impurity A is preferably lower than the hydrogen content L ($M<L$), but may be higher than the hydrogen content L ($M>L$). The content M of the impurity A may be 0.5 at % or more and 5.0 at % or less. In the case where the impurity A is an element of the group 18 in the periodic table, that is, noble gas, since the impurity A is chemically inert, the characteristics of the transition metal oxide film can be easily controlled. The impurity A is typically argon, but may be krypton or xenon instead of argon.

The content N (at %) of the impurity B described above is lower than the content M of the impurity A ($N<M$). In addition, the content N of the impurity B is lower than the hydrogen content L ($N<L$). The content N of the impurity B is preferably less than 1.0 at %, and is more preferably 0.5 at % or less. The content N of the impurity B may be 0.05 at % or more and 0.5 at % or less. The content N of the impurity B may be 0.

The impurity B can be a metal element, a transition element, and a transition element of the same group as the transition metal T. In the case where the impurity B is of the same group as the transition metal T in the periodic table, the impurity B has a chemical similarity to the transition metal T, and therefore the characteristics of the transition metal oxide film can be easily controlled. For example, in the case where the transition metal T is hafnium, the impurity B can be zirconium, and in the case where the transition metal T is zirconium, the impurity B can be hafnium. For example, in the case where the transition metal T is tantalum, the impurity B can be niobium, and in the case where the transition metal T is niobium, the impurity B can be tantalum. For example, in the case where the transition metal T is tungsten, the impurity B can be molybdenum, and in the case where the transition metal T is molybdenum, the impurity B can be tungsten. For example, in the case where the transition metal T is yttrium, the impurity B can be a lanthanoid, and in the case where the transition metal T is a lanthanoid, the impurity B can be a different lanthanoid or yttrium.

The content of each element among main-group elements other than oxygen, hydrogen, and noble gas in the transition metal oxide film is preferably less than 1.0 at %, more preferably 0.5 at % or less, and further preferably 0.1 at % or less. The content of each element among main-group elements other than oxygen, hydrogen, and noble gas in the transition metal oxide film can be below the detection limit. Here, the main-group elements are elements of groups 1, 2, and 12 to 18 in the periodic table, and main-group elements other than noble gas are elements of groups 1, 2, and 12 to 17. A case where the content thereof is 0 is included. The content of each of main-group elements other than oxygen, hydrogen, and argon in the transition metal oxide film is preferably less than 1.0 at %, more preferably 0.5 at % or less, and further preferably 0.1 at % or less.

The total content of all impurities other than the transition metal T, oxygen, hydrogen, and impurity A is preferably less than 1.0 at %. In other words, it is preferable that the sum of the content J of the transition metal T, the oxygen content K, the hydrogen content L, and the content M of the impurity A is higher than 99.0 at % ($J+K+L+M>99.0$ at %). The total content of all impurities other than the transition metal T, oxygen, hydrogen, and impurity A is more preferably 0.5 at % or less. In other words, it is preferable that the sum of the content J of the transition metal T, the oxygen content K, the hydrogen content L, and the content M of the impurity A is 99.5 at % or higher ($J+K+L+M \geq 99.5$ at %). The total content of all impurities other than the transition metal T, oxygen, hydrogen, impurity A, and impurity B is preferably 0.1 at % or less. In other words, it is preferable that the sum of the content J of the transition metal T, the oxygen content K, the hydrogen content L, the content M of the impurity A, and the content N of the impurity B is 99.9 at % or higher ($J+K+L+M+N \geq 99.9$ at %). In the transition metal oxide film, the content of all elements other than the transition metal T, oxygen, impurity A, and impurity B may be below the detection limit. The transition metal oxide film does not have to include an element other than the transition metal T, oxygen, hydrogen, impurity A, and impurity B.

The content J (at %) of the transition metal T, the oxygen content K (at %), the hydrogen content L (at %), the content M (at %) of the impurity A, and the content N (at %) of the impurity B satisfy at least one of $J+K>L+M+N$, $J>L$, $K>L$, $L>M$, and $M>N$. Further, $L \geq 1.0$ at %, N<at %, and $J+K+L+M \geq 99.0$ at % can hold.

When approximation of $K/J \approx k/j$ and $J+K+L \approx 100$ is applied to the stoichiometric composition of $T_jO_k$ of the transition metal oxide, $L<100 \times j/(2 \times j+k)$ holds in the case where $L<J$ is satisfied, and $L<100 \times j/(3 \times j+2 \times k)$ holds in the case where $L<J/2$ is satisfied. In the case where j=1 and k=2 hold, L<25 at % needs to be satisfied to satisfy $L<100 \times j/(2 \times j+k)$. In the case where j=1 and k=3 hold, L<14 at % needs to be satisfied to satisfy $L<100 \times j/(2 \times j+k)$. In the case where j=2 and k=3 hold, L<28 at % needs to be satisfied to satisfy $L<100 \times j/(2 \times j+k)$. In the case where j=2 and k=5 hold, L<22 at % needs to be satisfied to satisfy $L<100 \times j/(2 \times j+k)$. In the case where j=1 and k=2 hold, $L \leq 14$ at % needs to be satisfied to satisfy $L \leq 100 \times j/(3 \times j+2 \times k)$. In the case where j=1 and k=3 hold, $L \leq 11$ at % needs to be satisfied to satisfy $L \leq 100 \times j\ (3 \times j+2 \times k)$. In the case where j=2 and k=3 hold, $L \leq 16.0$ at % needs to be satisfied to satisfy $L \leq 100 \times j/(3 \times j+2 \times k)$. In the case where j=2 and k=5 hold, $L \leq 12$ at % needs to be satisfied to satisfy $L \leq 100 \times j/(3 \times j+2 \times k)$.

This transition metal oxide film can be used as an optical film. An optical film is a film that utilizes an action of light, and examples of the action of light include reflection, transmission, absorption, refraction, scattering, and excitation. As a result of an amorphous film containing 1.0 at % or more of hydrogen, the refractive index and extinction coefficient (absorptance) of the film for a specific wavelength can be significantly controlled. Oxide of any transition metal can be used for the optical film as long as the transition metal oxide can be optically used, and oxides of transition metals of groups 3 to 6 can be typically used. Particularly, oxides of transition metals of groups 4 and 5 are preferable. In addition, oxides of transition metals of periods 4 to 6 can be typically used. Particularly, oxides of transition metals of periods 5 and 6 are preferable.

A wavelength λ that is included in light used for the optical film is a wavelength at which the optical characteristics of the film can significantly change depending on the hydrogen content of the film. This wavelength λ may be in the ultraviolet region (less than 400 nm), the visible light region (400 nm to 800 nm), or the infrared region (more than 800 nm). The light used for the optical film may include light of a wavelength at which the optical characteristics of the film does not change significantly depending on the hydrogen content of the film.

An optical element including the optical film may be an optical element whose optical characteristics are not changed by an action from the outside, or an optical element whose optical characteristics are changed by an action from the outside. The former optical element is a lens, a mirror, or a filter, and the optical film can be used as an antireflection film, a reflection film, or a light absorbing film. The latter optical element can be, for example, a chromic element that utilizes chromic characteristics of the optical film. For example, tungsten oxide, molybdenum oxide, titanium oxide, chromium oxide, cobalt oxide, and nickel oxide can have the chromic characteristics. Examples of actions from the outside on the chromic element include electric (electrochromic) actions and chemical (gas-chromic) actions.

The optical element including the optical film constitutes a piece of optical equipment. The optical equipment can include a light source that emits light to be used on the optical film in addition to the optical element including the optical film. In a piece of optical equipment including a light source that emits light including a specific wavelength λ, the characteristics of the optical film of the optical element can be adjusted in accordance with the wavelength λ by adjusting the hydrogen content L.

As a matter of course, the light used for the optical film may be light radiated from the outside of the optical equipment.

The optical film of the optical element, that is, the transition metal oxide film constitutes part or entirety of an optical structure on a base. In the case where the transition metal oxide film constitutes the entirety of the optical structure on the base, the optical structure is a single-layer body of the transition metal oxide film. In the case where the transition metal oxide film constitutes part of the optical structure on the base, the optical structure on the base is a laminate including a plurality of transition metal oxide films. Typically, the optical structure is a laminate of the transition metal oxide film and a different optical film. The different optical film laminated with the transition metal oxide film may have a higher refractive index or a lower refractive index than the transition metal oxide film. Since the transition metal oxide film has a relatively high refractive index, it is preferable that the transition metal oxide film is used as a high-refractive-index film, and the different optical film laminated with the transition metal oxide film is a low-refractive-index film having a lower refractive index than the transition metal oxide film. The different optical film laminated with the transition metal oxide film can be an oxide film of a main-group element. In the present embodiment, the refractive index of the transition metal oxide film can be adjusted by adjusting the hydrogen content of the transition metal oxide film.

The transition metal oxide film of the embodiment is suitable for an optical film in which a plurality of transition metal oxide films and different optical films are alternately laminated. Here, films of a first type and films of a second type being alternately laminated means that at least one film of the second type is positioned between two films of the first type, and at least one film of the first type is positioned between two films of the second type. Therefore, to alternately laminate films of a first type and films of a second type, at least four layers of films are needed. The number of layers of the plurality of transition metal oxide films in the optical structure in which the plurality of transition metal oxide films and different optical films are alternately laminated needs to be 2 or more, but may be 3 or more, 10 or more, 20 or more, 30 or more, or 40 or more. The more layers of the transition metal oxide films are provided in the optical structure, the stronger the effect of controlling the optical characteristics of the transition metal oxide film in the optical structure by adjusting the hydrogen content becomes.

Although an oxide film, a fluoride film, or the like is used as a film that is in contact with the transition metal oxide film, it is preferable that the film is an oxide film in consideration of adhesion to the transition metal oxide film. A structure in which a transition metal oxide film is disposed between a first oxide film and a second oxide film, the lower surface of the transition metal oxide film is in contact with the first oxide film, and the upper surface of the transition metal oxide film is in contact with the second oxide film is preferable because the adhesion and stability of the transition metal oxide film are high. Examples of the oxide film that is in contact with the transition metal oxide film include oxide films of main-group elements such as silicon oxide films, aluminum oxide films, magnesium oxide films, and zinc oxide films. That is, in a structure in which oxide films of a transition element and oxide films of a main-group element are alternately laminated, the characteristics of the oxide films of the transition element can be adjusted by adjusting the hydrogen content.

A film which includes amorphous transition metal oxide as a main component and in which the hydrogen content is 1.0 at % or more and the sum of the transition metal content, the oxygen content, the hydrogen content, and the argon content is higher than 99.0 at % includes little impurities, and therefore is suitable for not only an optical film but also an insulating film to be used electrically.

An electric element can include a first portion that is an electrode, a second portion that is a semiconductor layer or an electrode, and an amorphous transition metal oxide film. To insulate the first portion that is an electrode from the second portion that is a semiconductor layer or an electrode, the amorphous transition metal oxide film can be disposed between the first portion that is an electrode and the second portion that is a semiconductor layer or an electrode. In the case where the electric element is a transistor, the first portion can be a gate electrode, the amorphous transition metal oxide film can be a gate insulating film, and the second portion can be a semiconductor layer. The electric element may be a capacitor of a metal-oxide-semiconductor: MOS structure, or a capacitor of a metal-oxide-metal: MOM structure.

To form a transition metal oxide film containing hydrogen by a large amount of 1.0 at % or more, the reactive sputtering method is useful. The transition metal oxide film containing hydrogen can be formed by generating a plasma in an atmosphere containing an oxygen gas, a hydrogen gas, and an argon gas, performing sputtering of a transition metal target by using argon, and reacting the sputtered metal with oxygen and hydrogen. At this time, the crystallinity of the transition metal oxide film can be controlled by adjusting the amount of the oxygen gas. For example, the transition metal oxide film is more likely to crystallize in the case where the amount of the oxygen gas is larger, and is more likely to be amorphous in the case where the amount of the oxygen gas is smaller. Also, the crystallinity of the transition metal oxide film can be controlled by adjusting sputter power during film formation, atmospheric pressure, substrate temperature, positional relationship between target and substrate. For example, the transition metal oxide film may be more likely to be amorphous, in a case where a sputtering power is higher, or in a case where a pressure of sputtering atmosphere is higher. Further, it is also easy to amorphize by increasing the distance between the target and the substrate in the direction perpendicular to the film forming surface of the substrate and shifting the target and the substrate in the direction horizontal to the film forming surface of the substrate. However, even if any of the above-mentioned conditions advantageous for amorphization is satisfied, crystallization may occur depending on the degree of other parameters, so appropriate condition setting is required for amorphization. The hydrogen content of the transition metal oxide film can be controlled by adjusting the amount of the hydrogen gas. For example, the hydrogen content decreases when the amount of the hydrogen gas is reduced, and the hydrogen content increases when the amount of the hydrogen gas is increased. The impurity A can originate from gas such as argon, in the film-forming atmosphere, and the impurity B can originate from impurities in the target. The other impurities can be metal elements included in the film forming apparatus, or carbon, nitrogen, and fluorine attached to the sputtering target or mixed in the film forming gas. A high-quality film can be obtained by reducing such impurities as much as possible.

Hereinafter, embodiments in which hafnium oxide is used as the transition metal oxide will be described as first and second embodiments. Hafnium oxide has a high refractive index and a high dielectric constant, and therefore application thereof in the fields of optical elements and semiconductor elements is considered.

In the field of optical elements, it is attempted to coat an optical member such as a lens or a filter with a film containing hafnium oxide as an optical film. As the standard for the performance of optical equipment has become higher, the number of optical elements used in the equipment has increased, and there is a tendency that the number of optical surfaces that need to be coated with an optical film also increases. In addition, the optical film used for the coating is not necessarily constituted by a single layer, and can be constituted by multiple layers in some cases, and therefore there is a tendency that the total number of provided layers increases.

In these circumstances, for example, an optical surface of an exposing apparatus such as a semiconductor manufacturing apparatus that uses wavelengths of an ultraviolet region such as the i-line the h-line can be coated with hafnium oxide as a high-refractive-index material in which absorption by a band gap in the ultraviolet region is not likely to occur.

In the field of optical elements, realization of an optical film that contains hafnium oxide, has a high refractive index and a low light absorptance at a good balance, and has high performance has been desired.

In the field of semiconductor elements, realization of a gate insulating film that contains hafnium oxide, has a high dielectric constant and low leak current at a good balance, and has high performance has been desired.

Therefore, in one perspective of the first and second embodiments, it is aimed to provide a technique advantageous in realizing high performance for a film containing hafnium oxide.

One mode of the first and second embodiments is a film containing amorphous hafnium oxide as a main component and has a hydrogen content of 1.0 at % or more.

According to the first and second embodiments, a technique advantageous in realizing high performance in a film containing hafnium oxide by achieving a high refractive index and a low absorption at a good balance, and achieving a high dielectric constant and a low leak current at a good balance can be provided.

A hafnium oxide-containing film, a piece of equipment including the film, and the like serving as embodiments of the present invention will be described with reference to drawings.

FIRST EMBODIMENT

Optical Element

FIG. 1 is a schematic section view of an optical element according to the present embodiment. An optical element 100 includes a base 101, and an optical structure 102 formed on the base 101. In the optical structure 102, high-refractive-index layers 102*a* formed from a high-refractive-index material and low-refractive-index layers 102*b* formed from a low-refractive-index material are alternately laminated. The optical structure 102 can be also referred to as a multilayer film. Here, layers of a first type and layers of a second type being alternately laminated means that at least one layer of the second type is positioned between two layers of the first type, and at least one layer of the first type is positioned between two layers of the second type. Therefore, to alternately laminate layers of a first type and layers of a second type, at least four layers are needed.

The base 101 can be constituted by a material such as a calcium fluoride crystal, quartz glass, an optical glass such as borosilicate-crown glass BK7, resin, metal, or the like. In addition, the base 101 of various shapes such as a flat plane shape and a shape with a curved surface can be used in accordance with the use and type of the optical element such as a lens, mirror, filter, or prism.

The material used as a main component of the high-refractive-index layers 102*a* is amorphous hafnium oxide ($HfO_2$) containing hydrogen, and details thereof will be described later. To be noted, in the description below, a film containing hafnium oxide ($HfO_2$) as a main component will be also described as a hafnium oxide film in some cases. To be noted, a film containing hafnium oxide as a main component means that the sum of the hafnium content J (at %) and the oxygen content K (at %) in the hafnium oxide film is larger than each of the contents L (at %), M (at %), and N (at %) of respective elements other than hafnium and oxygen ($J+K>L$, $J+K>M$, and $J+K>N$). Although J+K is 100 at % or less in the hafnium oxide film, since the hafnium oxide film of the present embodiment contains an element other than hafnium and oxygen such as hydrogen, J+K is less than 100 at %. According to the stoichiometric composition $HfO_2$, typically $J<K<3\times J$ holds. The hafnium content J is, for example, in the range of 20 at % to 50 at %, and the oxygen content K is, for example, in the range of 50 at % to 80 at %. It is preferable that sum of the hafnium content J (at %) and the oxygen content K (at %) of the hafnium oxide film is larger than the sum of the contents L (at %), M (at %), and N (at %) of all the elements other than hafnium and oxygen contained in the hafnium oxide film ($J+K>L+M+N$). In this case, J+K is higher than 50 at %. Although a case where three elements other than hafnium and oxygen are provided has been described as an example herein, the number of elements other than hafnium and oxygen may be one, two, four, or more.

Examples of the material used for the low-refractive-index layers 102*b* include materials containing silicon oxide or aluminum oxide as a main component, but the configuration is not limited to this. For example, $MgF_2$, $CaF_2$, $LaF_3$, $CeF_3$, $YF_3$, or the like may be used.

As illustrated in FIG. 1, the optical structure 102 has a configuration in which the high-refractive-index layers 102*a* and the low-refractive-index layers 102*b* are alternately laminated in this order from the base 101 side, and the outermost layer is the low-refractive-index layer 102*b*. To be noted, the configuration may be changed in accordance with the use of the optical element. For example, a configuration in which the low-refractive-index layers 102*b* and the high-refractive-index layers 102*a* are alternately laminated in this order from the base 101 side, and the outermost layer is the low-refractive-index layer 102*b* may be employed. In addition, a protective layer may be provided on the low-refractive-index layer 102*b* serving as the outermost layer to be the outermost layer, an intermediate-refractive-index layer formed from a material having an intermediate refractive index may be disposed between the high-refractive-index layer 102*a* and the low-refractive-index layer 102*b*, and an adhesion layer may be provided between the base 101 and the optical structure 102. To be noted, the optical structure 102 does not have to have an alternate lamination structure in which the low-refractive-index layers 102*b* and the high-refractive-index layers 102*a* are alternately laminated. In addition, the optical structure 102 does not have to have a multilayer structure including a high-refractive-index layer 102*a* and a low-refractive-index layer 102*b*, and may have a single-layer structure including only one layer of the high-refractive-index layer 102*a*.

Manufacturing Method

A manufacturing method for the optical element serving as an optical part according to the present embodiment including the amorphous hafnium oxide film containing hydrogen serving as a high-refractive-index layer will be described. To be noted, a known film forming method can be used for formation of the low-refractive-index layer 102*b*, and therefore description thereof will be omitted.

Figure 2:
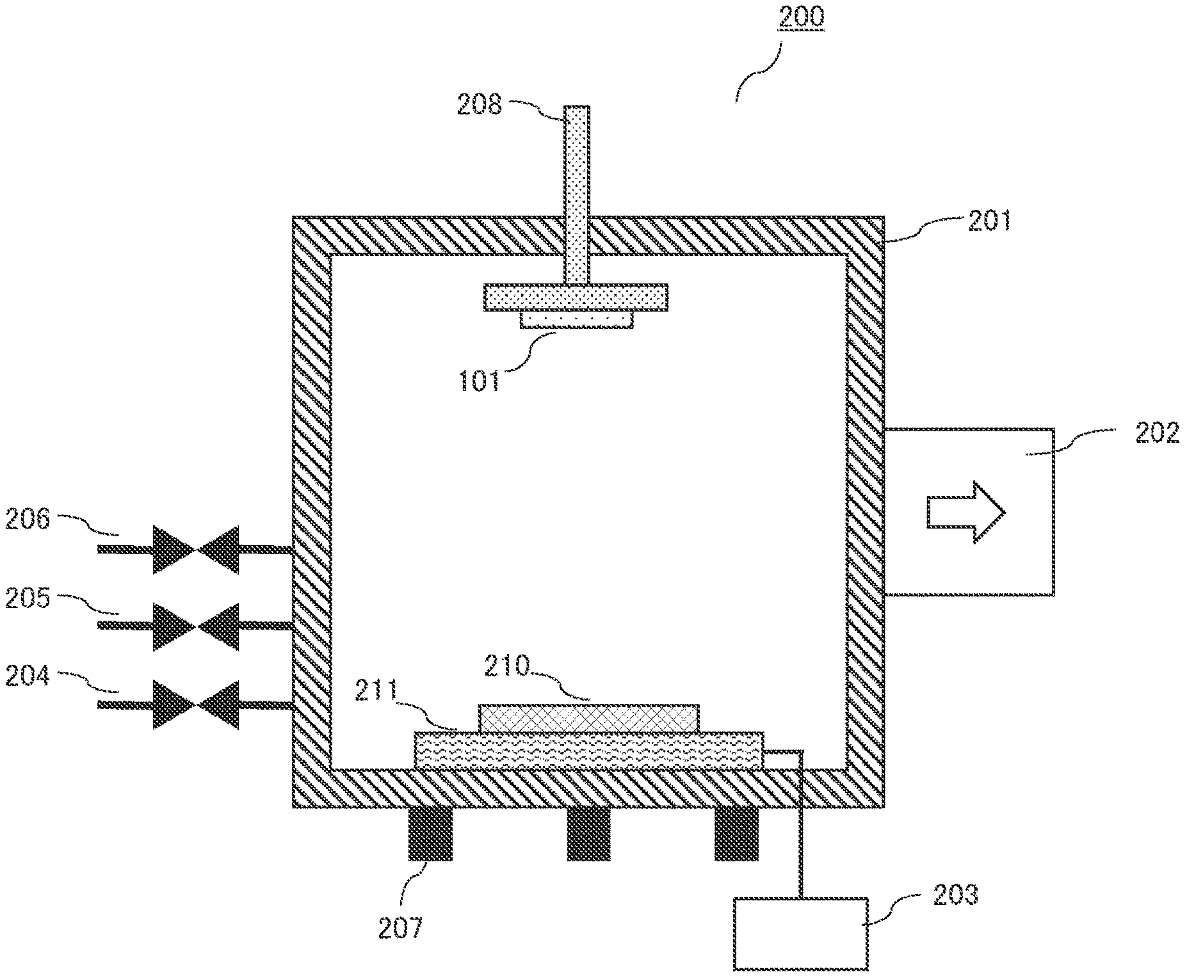
FIG. 2 is a schematic view of a sputtering film forming apparatus used for manufacturing the optical element according to the first embodiment.

FIG. 2 is a schematic view of a sputtering film forming apparatus 200 used for manufacture of the optical element. The sputtering film forming apparatus 200 includes a vacuum chamber 201 serving as an airtight container, and an exhaustion system 202 for exhausting air from the vacuum chamber 201. In addition, the sputtering film forming apparatus 200 includes an argon gas inlet port 204, an oxygen gas inlet port 205, and a hydrogen gas inlet port 206 such that gases required for film formation can be introduced into the vacuum chamber 201. Further, a sputtering target 210, a backing plate 211, a magnet mechanism 207, and a base holding mechanism 208 are provided to the vacuum chamber 201. By holding the base 101 of the optical element by the base holding mechanism 208 and supplying power thereto from a power source 203, film formation by the reactive sputtering method can be performed.

To form an amorphous hafnium oxide film containing hydrogen serving as a high-refractive-index layer, film formation is performed by the reactive sputtering method in accordance with the following procedure. For example, the base 101 constituted by quartz glass processed into a predetermined optical element shape, and 8-inch metal hafnium having a purity of 99.9 wt % or more as the sputtering target 210 are set in the vacuum chamber 201. At this time, the distance between the base 101 and the sputtering target 210 is set to, for example, 125 mm. Further, air in the vacuum chamber 201 is exhausted by an exhaustion system 202 to achieve a vacuum of about $5\times10^{-5}$ Pa. Then, plasma discharge is performed while introducing an argon gas through the argon gas inlet port 204, an oxygen gas through the oxygen gas inlet port 205, and a hydrogen gas through the hydrogen gas inlet port 206. That is, plasma discharge is generated by applying power of 50 W/cm$^2$ to the sputtering target 210 from the power source 203, and an amorphous hafnium oxide film containing hydrogen is formed on the base 101 of, for example, a diameter of 30 mm×thickness of 1 mm, at a thickness of about 100 nm. To be noted, the thickness of each layer is not necessarily limited to about 100 nm, and is appropriately set in accordance with the wavelength of light used in the optical element and the number of layers constituting the optical structure. The thickness of the hafnium oxide film in the optical element is, for example, in the range of 10 nm to 1000 nm, or in the range of 10 nm to 100 nm. Hafnium oxide layers of a thickness of 100 nm may be laminated to form a 1000 nm-thick hafnium oxide film. Specific examples and comparative examples will be described below.

Examples 1 to 4 and Comparative Examples 1 and 2

The high-refractive-index layer used in the optical structure will be described with reference to Examples 1 to 4 and Comparative Examples 1 and 2. The high-refractive-index layer according to Examples 1 to 4 and Comparative Example 2 was formed while introducing an oxygen gas through the oxygen gas inlet port 205 at a flow rate of 20 sccm. In addition, the high-refractive-index layer according to Comparative Example 1 was formed while introducing an oxygen gas through the oxygen gas inlet port 205 at a flow rate of 60 sccm. At this time, in all examples and comparative examples, the film was formed by introducing an argon gas through the argon gas inlet port 204 at a flow rate of 60 sccm. In addition, in Example 1, plasma discharge was performed while introducing a hydrogen gas through the hydrogen gas inlet port 206 at a flow rate of 30 sccm. In the other examples and comparative examples, the amount of hydrogen contained in the film was adjusted by changing the flow rate of the hydrogen gas from Example 1 as will be described later. To be noted, the conditions described above are merely examples, and can be changed in accordance with the structure of the film forming apparatus or the like. Generally, there is a tendency that the film quality becomes closer to crystalline rather than amorphous when the flow rate of oxygen introduced into the chamber is increased, and there is a tendency that the amount of hydrogen contained in the film increases when the flow rate of hydrogen is increased. It is assumed that when the flow rate of introduced oxygen is increased, more negative ions of oxygen are generated in the chamber, thus energy charged onto the base increases, and crystallization is prompted.

For a single film of the hafnium oxide film of each example and each comparative example, crystallinity, hydrogen content, light absorptance, and refractive index were evaluated.

Figure 7:
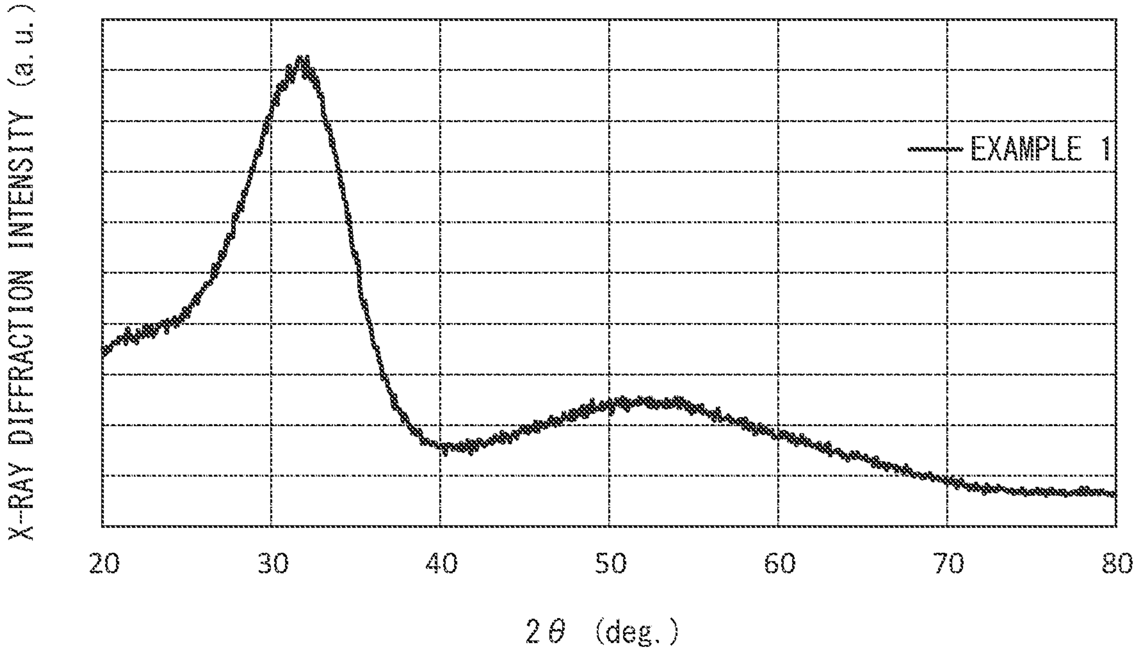
FIG. 7 is a diagram illustrating an X-ray diffraction pattern of a hafnium oxide film of Example 1 of the first embodiment.
Figure 8:
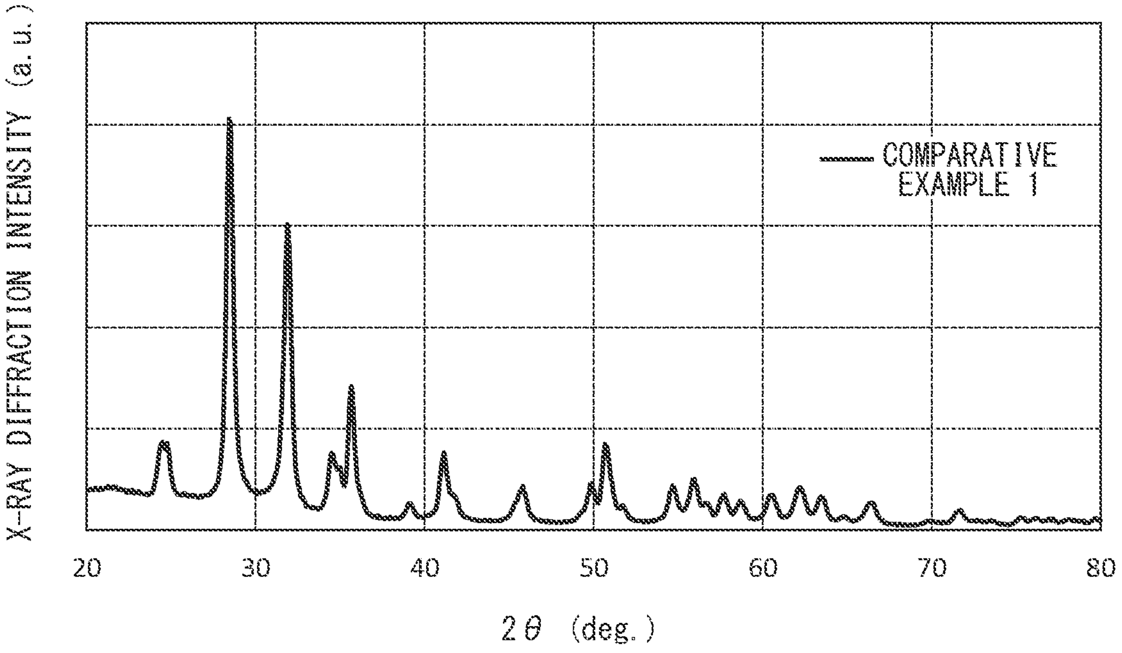
FIG. 8 is a diagram illustrating an X-ray diffraction pattern of a hafnium oxide film of Comparative Example 1 of the first embodiment.

The evaluation of the crystallinity was performed by X-ray diffraction analysis. In the description below, being amorphous refers to a case where, when an X-ray is radiated onto a film serving as a measurement target at a small incident angle of about 0.5° and a diffraction pattern is observed, a clear diffraction peak is not detected, in other words, a halo pattern is observed. Therefore, being amorphous mentioned herein does not necessarily exclude a state in which a material of a slightly crystalline state is included. For example, FIG. 7 illustrates the X-ray diffraction pattern (incident angle: 0.4°) of the hafnium oxide film of Example 1, in which only a halo pattern is observed and no clear crystalline peak is observed, and it can be determined that the film quality of Example 1 is amorphous. In addition, for example, FIG. 8 illustrates the X-ray diffraction pattern (incident angle: 0.4°) of the hafnium oxide film of Comparative Example 1, in which a clear crystalline peak can be observed, and it can be determined that the film quality of Comparative Example 1 is crystalline. The crystallinity was also evaluated for the other examples and comparative examples by using similar criteria.

In addition, evaluation of the hydrogen content of the film was performed by, for example, irradiating the hafnium oxide film with a high-energy ion beam of the MeV order and performing elastic recoil detection analysis: ERDA. For the other materials than hydrogen in the film, evaluation was performed by irradiating the film with a high-energy ion beam of the MeV order and performing Rutherford backscattering spectrometry: RBS. The hydrogen content at % of the hafnium oxide film was obtained by using these results.

In addition, the light absorptance and the refractive index were evaluated by measuring the transmittance and reflectance at a light beam incident angle of 5° in the wavelength range of 200 nm to 500 nm by using an ultraviolet-visible-near infrared spectrometer.

The light absorptance was calculated by using the following formula.

$$A(\%) = 100 - T(\%) - R(\%) \quad \text{(Formula 1)}$$

In the formula, A (%) represents the light absorptance, T (%) represents the transmittance, and R (%) represents reflectance.

The refractive index was calculated by performing analysis on the measured reflectance by using optical thin film analysis/design software Film Wizard™ available from Scientific Computing International.

The light absorptance and the refractive index were evaluated using light of a wavelength of 280 nm as a standard to evaluate the aptitude thereof for optical elements for an exposing apparatus (semiconductor manufacturing apparatus) that utilizes wavelengths in the ultraviolet region such as the i-line and the h-line. As a matter of course, in the case of an optical element for a different use, the evaluation may be performed by using a wavelength suitable for the different use as a standard. The wavelength suitable for the optical element is not limited to a wavelength of the ultraviolet region, and may be a wavelength of a visible light region or a wavelength of an infrared region.

Table 1 shows evaluation results of Examples 1 to 4 and Comparative Examples 1 and 2.

TABLE 1

| | Crystallinity | Hydrogen content | Absorptance | Refractive index |
|---|---|---|---|---|
| Example 1 | Amorphous | 6.5 at % | 0.08% | 2.253 |
| Example 2 | Amorphous | 15.8 at % | 0.04% | 2.225 |
| Example 3 | Amorphous | 1.0 at % | 0.77% | 2.260 |
| Example 4 | Amorphous | 17.0 at % | 0.06% | 2.031 |
| Comparative Example 1 | Crystalline | 0 at % | 3.43% | 2.171 |
| Comparative Example 2 | Amorphous | 0 at % | 0.80% | 2.262 |

Regarding the crystallinity of the hafnium oxide film of Example 1, the hafnium oxide film was amorphous, and the hydrogen content of the hafnium oxide film was 6.5 at %. In addition, the light absorptance of the hafnium oxide film of Example 1 for a wavelength of 280 nm was 0.08%, and the refractive index for the wavelength of 280 nm was 2.253.

Regarding the crystallinity of the hafnium oxide film of Example 2, the hafnium oxide film was amorphous, and the hydrogen content of the hafnium oxide film was 15.8 at %. In addition, the light absorptance of the hafnium oxide film of Example 2 for the wavelength of 280 nm was 0.04%, and the refractive index for the wavelength of 280 nm was 2.225.

Regarding the crystallinity of the hafnium oxide film of Example 3, the hafnium oxide film was amorphous, and the hydrogen content of the hafnium oxide film was 1.0 at %. In addition, the light absorptance of the hafnium oxide film of Example 3 for the wavelength of 280 nm was 0.77%, and the refractive index for the wavelength of 280 nm was 2.260.

Regarding the crystallinity of the hafnium oxide film of another example employing film formation conditions between Examples 1 and 3, the hafnium oxide film was amorphous, and the hydrogen content of the hafnium oxide film was 3.8 at %. In addition, the light absorptance of the hafnium oxide film for the wavelength of 280 nm was 0.61%, and the refractive index for the wavelength of 280 nm was 2.252.

Regarding the crystallinity of the hafnium oxide film of Example 4, the hafnium oxide film was amorphous, and the hydrogen content of the hafnium oxide film was 17.0 at %. In addition, the light absorptance of the hafnium oxide film of Example 4 for the wavelength of 280 nm was 0.06%, and the refractive index for the wavelength of 280 nm was 2.031.

Regarding the crystallinity of the hafnium oxide film of Comparative Example 1, the hafnium oxide film was crystalline, and the hydrogen content of the hafnium oxide film was 0 at %. In addition, the light absorptance of the hafnium oxide film of Comparative Example 1 for the wavelength of 280 nm was 3.43%, and the refractive index for the wavelength of 280 nm was 2.171.

Regarding the crystallinity of the hafnium oxide film of Comparative Example 2, the hafnium oxide film was amorphous, and the hydrogen content of the hafnium oxide film was 0 at %. In addition, the light absorptance of the hafnium oxide film of Comparative Example 2 for the wavelength of 280 nm was 0.80%, and the refractive index for the wavelength of 280 nm was 2.262.

Regarding the crystallinity of the hafnium oxide film of a reference example in which the flow rate of hydrogen was increased from Comparative Example 1, the hafnium oxide film was crystalline, and the hydrogen content of the hafnium oxide film was 7.5 at %. In addition, the light absorptance of the hafnium oxide film of the reference example for the wavelength of 280 nm was 0.53%, and the refractive index for the wavelength of 280 nm was 2.205.

Comparing Comparative Examples 1 and 2 substantially not containing hydrogen, Comparative Example 2 that is amorphous has a higher refractive index and a lower light absorptance than Comparative Example 1 that is crystalline. Comparing Example 1 and the reference example in which the hydrogen content is in the range of 6 at % to 8 at %, Example 1 that is amorphous has a higher refractive index and a lower light absorptance than the reference example that is crystalline. Examples 1 to 4 in which the hydrogen content is higher than in Comparative Example 2 that is amorphous have a lower light absorptance than Comparative Example 2. The reference example in which the hydrogen content is higher than in Comparative Example 1 that is crystalline has a lower light absorptance and a higher refractive index than Comparative Example 1. For the light absorptance, a first aim is less than 1.0%, a more preferable second aim is 0.5% or less, and a further more preferable third aim is 0.2% or less. For the refractive index, a first aim is 2.10 or more, a more preferable second aim is 2.15 or more, and a further more preferable third aim is 2.20 or more. From Example 4, it can be seen that the refractive index decreases to 2.031 in the case where the hydrogen content exceeds 17% even if the film quality is amorphous. In addition, from Comparative Example 1, it can be seen that the light absorptance becomes as high as 3.43% in the case where the film quality is crystalline and the film substantially does not contain hydrogen.

As described above, the variation of the absorptance and refractive index depending on the hydrogen content may be larger in an amorphous film than in a crystalline film. Therefore, the absorptance and refractive index can be significantly controlled in an amorphous film by setting the hydrogen content to 1 at % or more. To be noted, the hydrogen content being 1 at % or more includes a case where the hydrogen content is 1.0 at % as in Example 3, and includes a case where the hydrogen content is 1.0 at % or more.

From what has been described above, it can be seen that an amorphous hafnium oxide film containing hydrogen in the range of 1 at % to 16 at % is suitable for a high-performance optical film in which a high refractive index and a low light absorptance are achieved at a good balance. Particularly, a hafnium oxide film containing hydrogen in the range of 6.5 at % to 15.8 at % is preferable because a high refractive index of 2.22 or more and an extremely low light absorptance less than 0.1% (0.08% or less) can be simultaneously achieved. To be noted, for the hafnium oxide film of the embodiment, silicon does not need to be actively added to the hafnium oxide film, and it is preferable that the silicon content O of the hafnium oxide film is lower than the hydrogen content L (O<L). The silicon content O of the hafnium oxide film described in the above examples is less than 1 at %, 0.1 at % or less, or less than the detection limit. In the case of a hafnium oxide film to which silicon is added, not only the addition of silicon can lower the refractive index, but also the light absorption is not necessarily suppressed enough. For example, in a hafnium oxide film to which 1 at % to 10 at % of silicon is added, there is a possibility that the transmission loss per film can be suppressed to 1% or less. However, in the case where, for example, forty surfaces are coated, the loss can be accumulated to 10% or more, which is not necessarily sufficient as optical performance. In the hafnium oxide film of the embodiment, carbon does not need to be actively added to the hafnium oxide film, and it is preferable that the carbon content P of the hafnium oxide film is less than the hydrogen content L (P<L). The carbon content P of the hafnium oxide film described in the above examples is less than 1 at %, 0.1 at % or less, or less than the detection limit. In the hafnium oxide film of the embodiment, nitrogen does not need to be actively added to the hafnium oxide film, and it is preferable that the nitrogen content Q of the hafnium oxide film is less than the hydrogen content L (Q<L). The nitrogen content Q of the hafnium oxide film described in the above examples is less than 1 at %, 0.1 at % or less, or less than the detection limit.

In addition, the hafnium oxide film of the embodiment may contain an element other than hafnium, oxygen, and hydrogen. For example, the hafnium oxide film described in the above examples can contain argon. This argon originates from the argon gas introduced through the argon gas inlet port 204 at the time of film formation. It is preferable that the argon content M of the hafnium oxide film is less than the hydrogen content L (M<L). The argon content M of the hafnium oxide film is, for example, in the range of 0.5 at % to 5 at %. In the hafnium oxide film described in the above examples can contain zirconium. This zirconium originates from the sputtering target 210 used for film formation. It is preferable that the zirconium content N of the hafnium oxide film is less than the hydrogen content L (N<L). The zirconium content N of the hafnium oxide film is, for example, in the range of 0.05 at % to 0.5 at %. The zirconium content N is preferably less than the argon content M (N<M). The silicon content 0 of the hafnium oxide film is preferably lower than the argon content M (O<M). The silicon content O of the hafnium oxide film is preferably lower than the zirconium content N (O<N). The present embodiment can realize a high refractive index and a low light absorption even in the case where the film contains argon or zirconium. In the hafnium oxide films of Examples 1 to 4 and Comparative Examples 1 and 2 described above, the content of elements other than hafnium, oxygen, hydrogen, argon and zirconium is below the detection limit. The zirconium content N in Examples 1 to 4 is in the range of 0.2 to 0.3 at %. Therefore, the sum (J+K+L+M) of the hafnium content J, the oxygen content K, the hydrogen content L, and the argon content M is in the range of 99.7 to 99.8 at %. In Examples 1 to 4, the hafnium content J is in the range of 25 to 33 at %, the oxygen content K is in the range of 50 to 66 at %, and the argon content M is in the range of 1 to 2 at %. be. The ratio (K/M) of oxygen content K to hafnium content M is greater than 2.00 and less than 2.10 (2.00<K/M<2.10). In Examples 1, 2 and 4 in which the hydrogen content L exceeds 2 at %, the hydrogen content L is larger than the argon content M (L>M).

Figure 3:
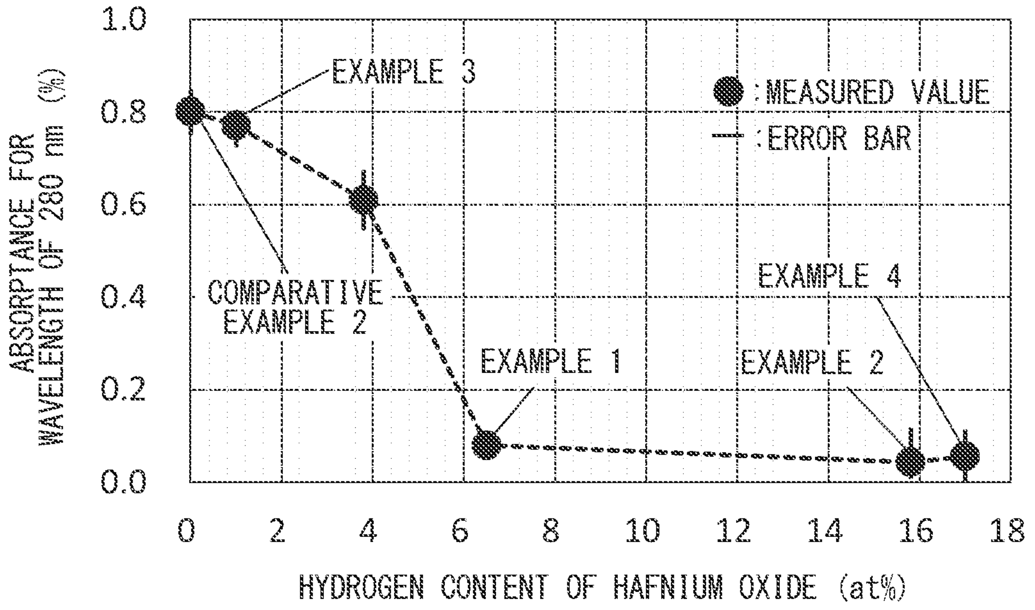
FIG. 3 is a graph illustrating a light absorptance characteristic with respect to the hydrogen content of a hafnium oxide film.
Figure 4:
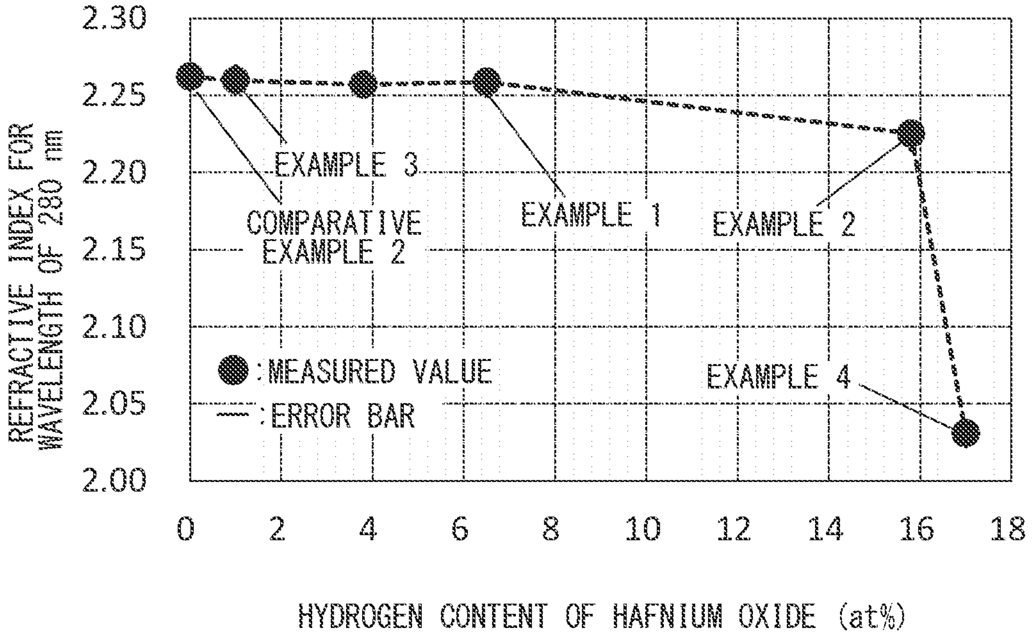
FIG. 4 is a graph illustrating a refractive index characteristic with respect to the hydrogen content of the hafnium oxide film.
Figure 5:
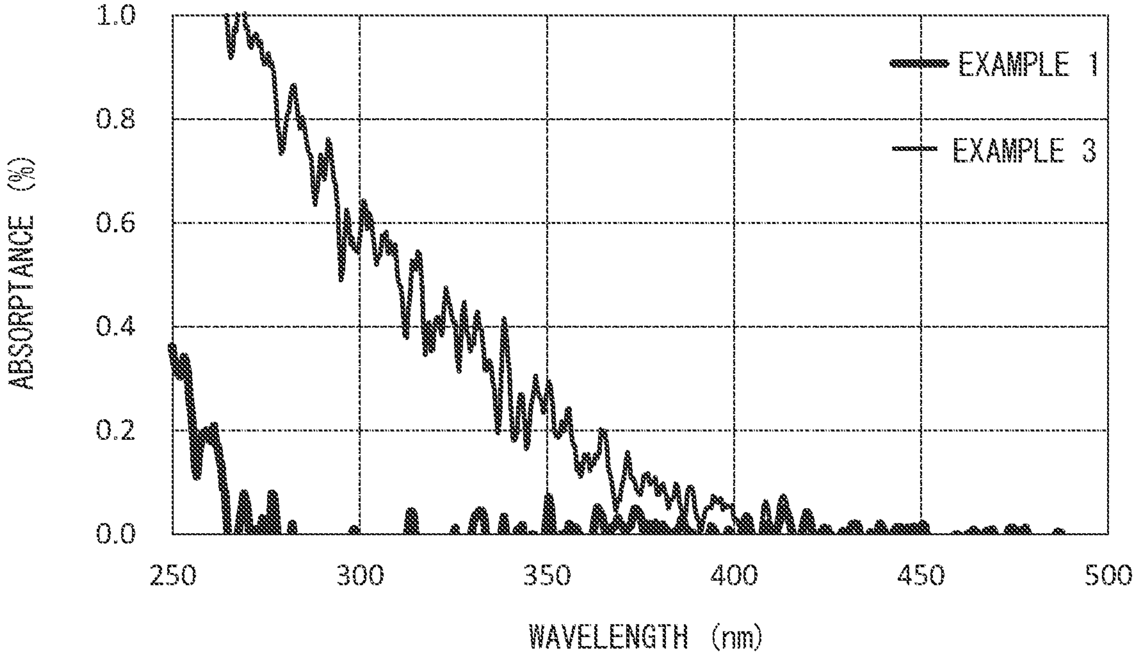
FIG. 5 is a graph illustrating wavelength dependency of light absorption of Examples 1 and 3 of the first embodiment.
Figure 6:
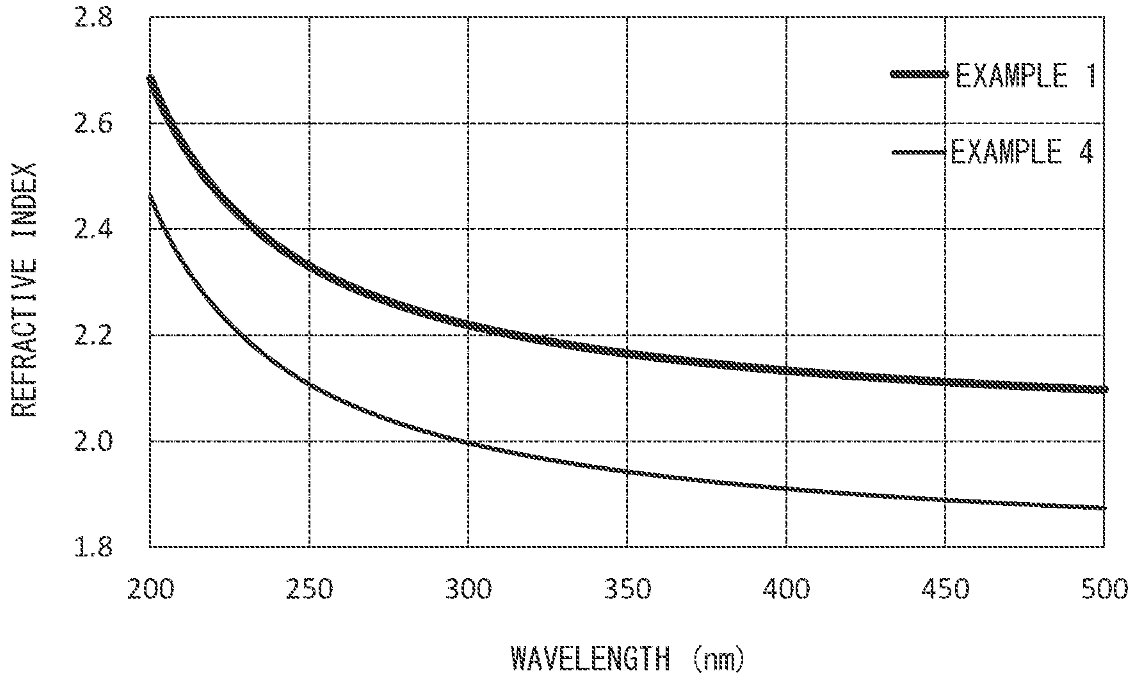
FIG. 6 is a graph illustrating wavelength dependency of refractive index of Examples 1 and 4 of the first embodiment.

For reference, FIG. 3 illustrates a graph showing the light absorptance characteristic with respect to the hydrogen content, and FIG. 4 illustrates a graph showing the refractive index characteristic with respect to the hydrogen content. In addition, FIG. 5 illustrates the wavelength dependency of the light absorption of Examples 1 and 3, and FIG. 6 illustrates the wavelength dependency of the refractive index of Examples 1 and 4.

From FIG. 3, it can be assumed that the absorptance of amorphous hafnium oxide having a hydrogen content of 5 at % or more can be suppressed to half or less of the absorptance of the case where the hydrogen content is 0 at %. As illustrated in FIG. 3, the absorptance of amorphous hafnium oxide having a hydrogen content of 6 at % or more is 0.1% or less, which is sufficiently low. As illustrated in FIG. 5, particularly in Example 1, the absorptance is remarkably low in the region of the wavelength of 400 nm or less. Further, as illustrated in FIG. 4, a high refractive index can be maintained in the range where the hydrogen content is 16 at % or less. The inventors have assumed a model in which in hafnium oxide containing hydrogen, hydrogen fills in oxygen defects generated in the hafnium oxide. When the stoichiometric composition of hafnium oxide whose hydrogen content is 0 at % is assumed to be $HfO_2$, the hafnium oxide containing hydrogen can be modelized as $HfO_{2-x}H_x$. The hydrogen concentration calculated by simulation using this model is about $1\times10^{21}$ atoms/cm$^3$ in the case where the hydrogen content is 1 at %, about $5\times10^{21}$ atoms/cm$^3$ in the case where the hydrogen content is 5 at %, about $6\times10^{21}$ atoms/cm$^3$ in the case where the hydrogen content is 6 at %, about $1\times10^{22}$ atoms/cm$^3$ in the case where the hydrogen content is 10 at %, about $1.6\times10^{22}$ atoms/cm$^3$ in the case where the hydrogen content is 16 at %, and about $2\times10^{22}$ atoms/cm$^3$ in the case where the hydrogen content is 20 at %. The hydrogen concentration of the hafnium oxide film of the present embodiment can be in the range of $1\times10^{21}$ atoms/cm$^3$ to $2\times10^{22}$ atoms/cm$^3$. It is preferable that an appropriate hydrogen content (at %) is satisfied in this range of hydrogen concentration indicated by atoms/cm$^3$. Further, the hydrogen concentration of the hafnium oxide film of the present embodiment can be $5\times10^{21}$ atoms/cm$^3$ or more, $6\times10^{21}$ atoms/cm$^3$ or more, and $1.6\times10^{22}$ atoms/cm$^3$ or less. However, depending on the amount of impurities such as argon and zirconium and the packing density of the hafnium oxide film, the hydrogen content of 1 at % to 16 at % or 6 at % to 16 at % may be satisfied in the range of hydrogen concentration less than $1\times10^{21}$ atoms/cm$^3$, and the hydrogen content of 1 at % to 16 at % or 6 at % to 16 at % may be satisfied in the range of hydrogen concentration more than $1\times10^{21}$ atoms/cm$^3$. The hydrogen content of 1 at % to 16 at % or 6 at % to 16 at % may be satisfied in the range of hydrogen concentration more than $2\times10^{22}$ atoms/cm$^3$.

It is assumed that the reason why the light absorptance is improved by causing hafnium oxide to contain hydrogen is because lattice defects serving as a main cause of deterioration of light absorption are fixed by hydrogen. In addition, although the reason why the refractive index quickly dropped after the hydrogen content exceeded 16 at % is unclear, it is assumed that this is because hydrogen entered not only into the lattice defects of the hafnium oxide but also into the lattice itself and thus the packing of the hafnium oxide deteriorated. Further, it is assumed that the reason why the light absorption of the crystallized hafnium oxide is not fully improved even if the hafnium oxide contains hydrogen is because a level derived from the crystal is formed in the band gap and this causes new light absorption.

Examples 5 and 6

Specific examples in which an optical structure serving as an antireflection structure is formed on the surface of the transmission-type optical element will be described. As Example 5, an optical structure serving as an antireflection structure in which amorphous hafnium oxide films containing 6.5 at % of hydrogen serving as high-refractive-index films described as Example 1 and low-refractive-index films were alternately laminated was formed. In addition, as Example 6, an optical structure serving as an antireflection structure in which amorphous hafnium oxide films containing 17.0 at % of hydrogen serving as high-refractive-index films described as Example 4 and low-refractive-index films were alternately laminated was formed.

Figure 9:
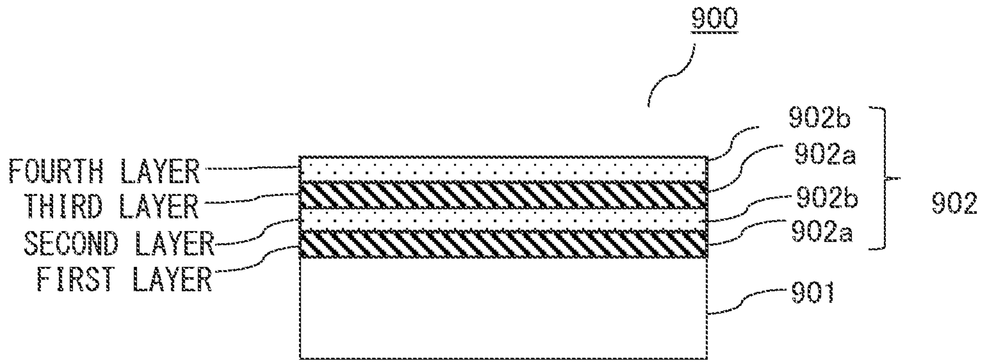
FIG. 9 is a section view of a layer structure of Examples 5 and 6 of the first embodiment.

FIG. 9 is a section view of the layer structure of Examples 5 and 6. In an optical element 900, high-refractive-index layers 902*a* formed from a high-refractive-index material and low-refractive-index layers 902*b* formed from a low-refractive-index material, which are four layers in total are alternately laminated on a quartz substrate 901 serving as a base to constitute an optical structure 902. The low-refractive-index layers 902*b* were formed from silicon oxide. In view of the use purpose of the optical element 900, the configuration of the optical structure was determined by optimizing the physical film thickness of each layer on the basis of the refractive index values of Examples 1 and 4 for a wavelength of 280 nm to maximize the antireflection characteristic in the wavelength range from 280 nm to 400 nm.

Table 2 shows specifications of each layer of Example 5.

TABLE 2

| | Material | Refractive index | Physical film thickness (nm) |
|---|---|---|---|
| Fourth layer | Silicon oxide | 1.506 | 53.02 |
| Third layer | Hafnium oxide (*1) | 2.253 | 50.13 |

TABLE 2-continued

| | Material | Refractive index | Physical film thickness (nm) |
|---|---|---|---|
| Second layer | Silicon oxide | 1.506 | 15.08 |
| First layer | Hafnium oxide (*1) | 2.253 | 12.62 |
| Base | Quartz glass | 1.489 | — |

(*1) Amorphous; hydrogen content: 6.5 at %

Table 3 shows specifications of each layer of Example 6.

TABLE 3

| | Material | Refractive index | Physical film thickness (nm) |
|---|---|---|---|
| Fourth layer | Silicon oxide | 1.506 | 55.68 |
| Third layer | Hafnium oxide (*2) | 2.031 | 47.01 |
| Second layer | Silicon oxide | 1.506 | 19.76 |
| First layer | Hafnium oxide (*2) | 2.031 | 12.94 |
| Base | Quartz glass | 1.489 | — |

(*2) Amorphous; hydrogen content: 17.0 at %

Figure 10:
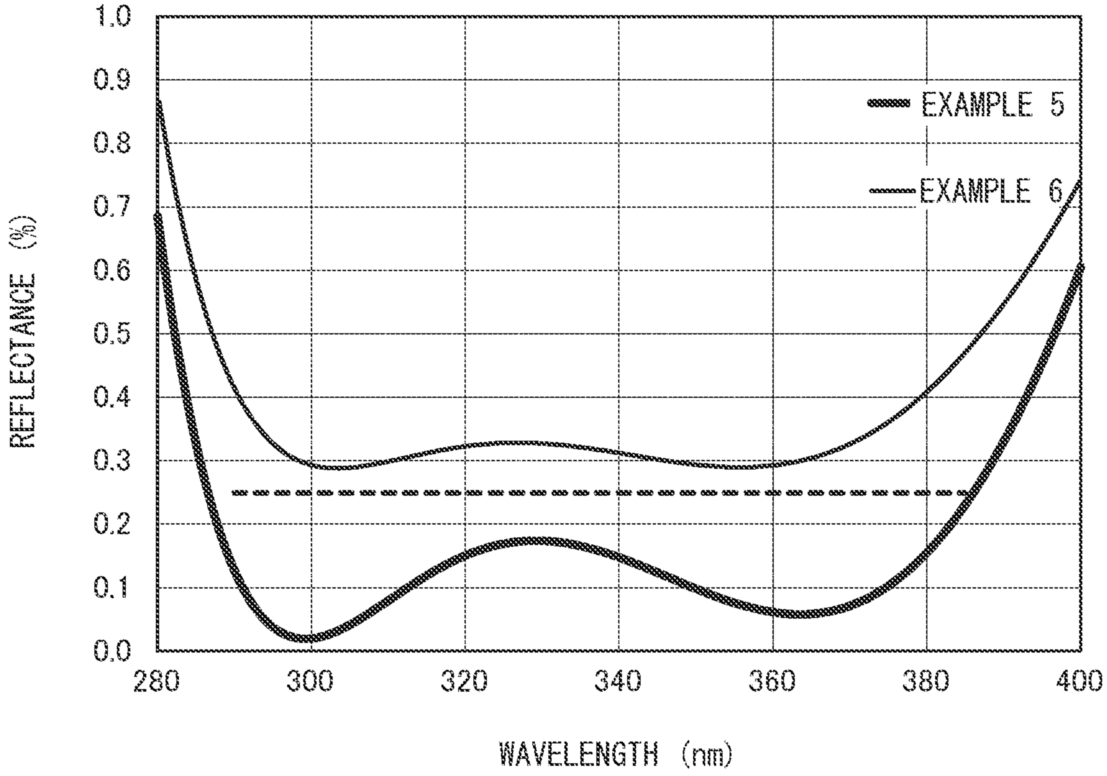
FIG. 10 is a graph illustrating a refractive index characteristic of an optical structure (antireflection structure) of Examples 5 and 6 of the first embodiment.

FIG. 10 shows the reflectance characteristics of the optical structure of Examples 5 and 6 serving as an antireflection structure. In the wavelength range of 280 nm to 400 nm, a lower reflectance was achieved in Example 5 in which an amorphous film with a hydrogen content of 6.5 at % and a high refractive index was used than in Example 6 in which an amorphous film with a hydrogen content of 17.0 at % was used. The average reflectance in this wavelength range was 0.10% in Example 5 and 0.33% in Example 6. In addition, in the case of Example 5, the reflectance was 0.25% or less in any wavelength in the wavelength range of 290 nm to 385 nm, and an extremely good antireflection characteristic could be obtained.

Examples 7 and 8

Specific examples in which an optical structure serving as a reflection structure is formed on the surface of a reflection-type optical element will be described. As Example 7, an optical structure serving as a reflection structure in which amorphous hafnium oxide films containing 6.5 at % of hydrogen serving as high-refractive-index films described as Example 1 and low-refractive-index films were alternately laminated was formed. In addition, as Example 8, an optical structure serving as a reflection structure in which amorphous hafnium oxide films containing 17.0 at % of hydrogen serving as high-refractive-index films described as Example 4 and low-refractive-index films were alternately laminated was formed.

Figure 11:
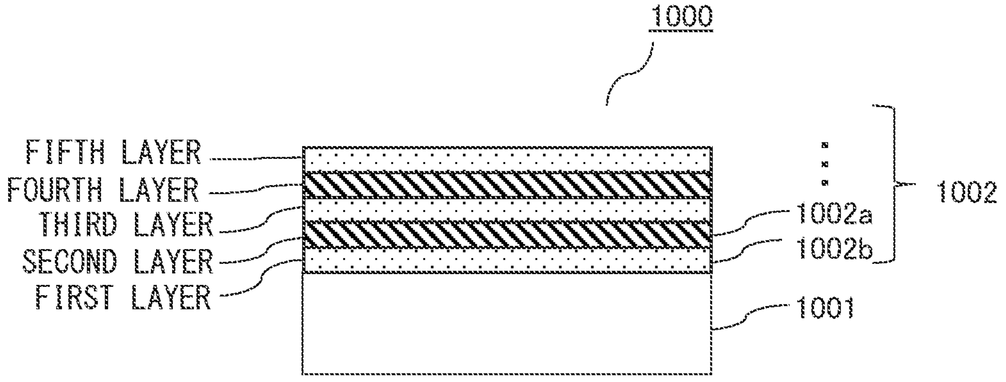
FIG. 11 is a section view of a layer structure of Examples 7 and 8 of the first embodiment.

FIG. 11 is a section view of a layer structure of Examples 7 and 8, which is different from the layer structure of the antireflection structure of Examples 5 and 6. That is, low-refractive-index layers 1002*b* formed from a low-refractive-index material and high-refractive-index layers 1002*a* formed from a high-refractive-index material, which are five layers in total are alternately laminated on base 1001 of a reflection-type optical element 1000 to constitute an optical structure 1002. The base 1001 of the Examples 7 and 8 is made of aluminum, which is an aluminum film of about 100 nm thick and coated on a glass plate. The base 1001 made of aluminum may be an aluminum plate. The low-refractive-index layers 1002*b* were formed from silicon oxide. In view of the use purpose of the optical element 1000, the configuration of the optical structure was determined by optimizing the physical film thickness of each layer on the basis of the refractive index values of Examples 1 and 4 for a wavelength of 280 nm to maximize the reflection characteristic in the wavelength range from 280 nm to 400 nm.

Table 4 shows specifications of each layer of Example 7.

TABLE 4

| | Material | Refractive index | Physical film thickness (nm) |
|---|---|---|---|
| Fifth layer | Silicon oxide | 1.506 | 44.11 |
| Fourth layer | Hafnium oxide (*1) | 2.253 | 44.11 |
| Third layer | Silicon oxide | 1.506 | 53.81 |
| Second layer | Hafnium oxide (*1) | 2.253 | 28.49 |
| First layer | Silicon oxide | 1.506 | 40.40 |
| Base | Aluminum | 0.361 | — |

(*1) Amorphous; hydrogen content: 6.5 at %

Table 5 shows specifications of each layer of Example 8.

TABLE 5

| | Material | Refractive index | Physical film thickness (nm) |
|---|---|---|---|
| Fifth layer | Silicon oxide | 1.506 | 46.22 |
| Fourth layer | Hafnium oxide (*2) | 2.031 | 46.22 |
| Third layer | Silicon oxide | 1.506 | 56.88 |
| Second layer | Hafnium oxide (*2) | 2.031 | 30.12 |
| First layer | Silicon oxide | 1.506 | 42.70 |
| Base | Aluminum | 0.361 | — |

(*2) Amorphous; hydrogen content: 17.0 at %

Figure 12:
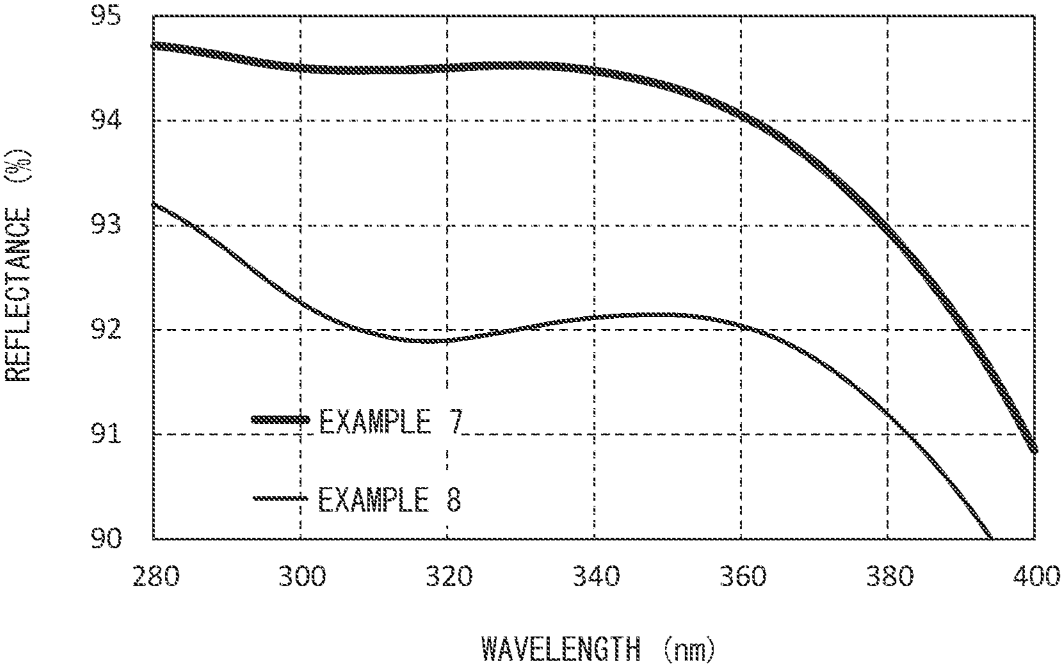
FIG. 12 is a graph illustrating a refractive index characteristic of an optical structure (antireflection structure) of Examples 7 and 8 of the first embodiment.

FIG. 12 shows the reflectance characteristics of the optical structure of Examples 7 and 8 serving as a reflection structure. In the wavelength range of 280 nm to 400 nm, a higher reflectance was achieved in Example 7 in which an amorphous film with a hydrogen content of 6.5 at % and a high refractive index was used than in Example 8 in which an amorphous film with a hydrogen content of 17.0 at % was used. The average reflectance in this wavelength range was 93.9% in Example 7 and 91.8% in Example 8. In addition, in the case of Example 7, the reflectance was 93% or more in any wavelength in the wavelength range of 290 nm to 380 nm, and an extremely good reflection characteristic could be obtained.

Examples 9 and 10

Specific examples in which at least one lens among a lens group included in an exposing apparatus serving as a semiconductor manufacturing apparatus is coated with an optical structure serving as an antireflection structure will be described. As Example 9, a lens group in which both surfaces of twenty lenses included in the exposing apparatus, that is, forty surfaces in total are coated with the optical structure serving as an antireflection structure described as Example 5 was produced. That is, an optical structure serving as an antireflection structure in which amorphous hafnium oxide films containing 6.5 at % of hydrogen serving as high-refractive index layers and low-refractive-index layers are alternately laminated was formed on the surface of each lens. In addition, as Example 10, a lens group in which both surfaces of twenty lenses included in the exposing apparatus, that is, forty surfaces in total are coated with the optical structure serving as an antireflection structure described as Example 6 was produced. That is, an optical structure serving as an antireflection structure in which amorphous oxide films containing 17.0 at % of hydrogen serving as high-refractive-index layers and low-refractive-index layers are alternately laminated was formed on the surface of each lens.

For Examples 9 and 10, transmission loss was measured by using ultraviolet light of 280 nm to evaluate the aptitude for lenses of an exposing apparatus including an ultraviolet light source. Table 6 shows results of this. Since in a lens for an exposing apparatus including an ultraviolet light source, the hafnium oxide film of the lens is irradiated with ultraviolet light generated by the ultraviolet light source, the hafnium oxide film was irradiated with ultraviolet light in a similar manner. Also, in the case where a light source of infrared light or visible light is provided, the aptitude for the optical element may be evaluated by using light that irradiates the hafnium oxide film.

TABLE 6

| | | Example 9 | Example 10 |
|---|---|---|---|
| Crystallinity of high-refractive-index layer | | Amorphous | Amorphous |
| Hydrogen content of high-refractive-index layer | | 6.5 at % | 17.0 at % |
| Per lens | Light absorptance | 0.08% | 0.06% |
| | Reflectance | 0.10% | 0.33% |
| | Transmission loss | 0.18% | 0.39% |
| Transmission loss for 40 surfaces of lenses | | 6.9% | 14% |

In the lens group of Example 9, a low light absorptance and a low reflectance are simultaneously achieved in each surface, transmission loss can be greatly reduced, and thus the total transmission loss for the forty surfaces of the lenses can be suppressed to 10% or less. In contrast, in Example 10, the reflectance is remarkably higher than in Example 9, and therefore the total transmission loss for the forty surfaces of the lenses is as high as 10% or more. To be noted, the reason why the reflectance of Example 10 is not as good as in Example 9 can be considered to be because the refractive index of the hafnium oxide layers is low.

The lens group of Example 9 has an effect of, for example, increasing the exposure intensity of an exposing apparatus when used for an illumination lens group or a projection lens group of the exposing apparatus. Therefore, the exposure time can be shortened, and thus the processing performance of the exposing apparatus can be improved.

SECOND EMBODIMENT

A second embodiment is an embodiment in which an amorphous hafnium oxide film containing hydrogen in the range of 1 at % to 16 at % is implemented in a semiconductor element.

In Examples 11 and 12, the hafnium oxide film described above is used as a gate insulating film (high-k gate insulating film) of a transistor. The hafnium oxide film as a highly dielectric material film can be formed by substantially the same method using substantially the same apparatus as in the first embodiment, and the film thickness is set to a value appropriate for a gate insulating film. The relationship between the refractive index and dielectric constant can be considered separately for electronic polarization and ionic polarization, and the dielectric constant can be obtained in consideration of both the electronic polarization and ionic polarization. The dielectric constant that can be calculated from the refractive index is a dielectric constant of electronic polarization, and the dielectric constant c derived from electronic polarization has correlation with the refractive index n ($\varepsilon^2$=n). The refractive index being high can mean that the dielectric constant is high due to electronic polarization. Since hafnium oxide is a material made up of ionic bonds, ionic polarization occurs in addition to electronic polarization in the case of using hafnium oxide in the presence of an electric field. In the case of using hafnium oxide as the gate insulating film, the dielectric constant needs to be evaluated in consideration of both polarizations. However, if the hydrogen content of hafnium oxide is set to 1 at % to 16 at %, at least decrease in the dielectric constant due to electronic polarization can be suppressed. To be noted, in the case where a silicon-containing film is formed by dispersing silicon in a hafnium oxide film, although there is a possibility of lowering the possibility of occurrence of crystallization, there is a possibility that the dielectric constant decreases due to the inclusion of silicon.

In addition, in Example 13, the hafnium oxide film described above can be provided on the light receiving surface side of an image pickup element as an antireflection structure.

Example 11

Figure 13:
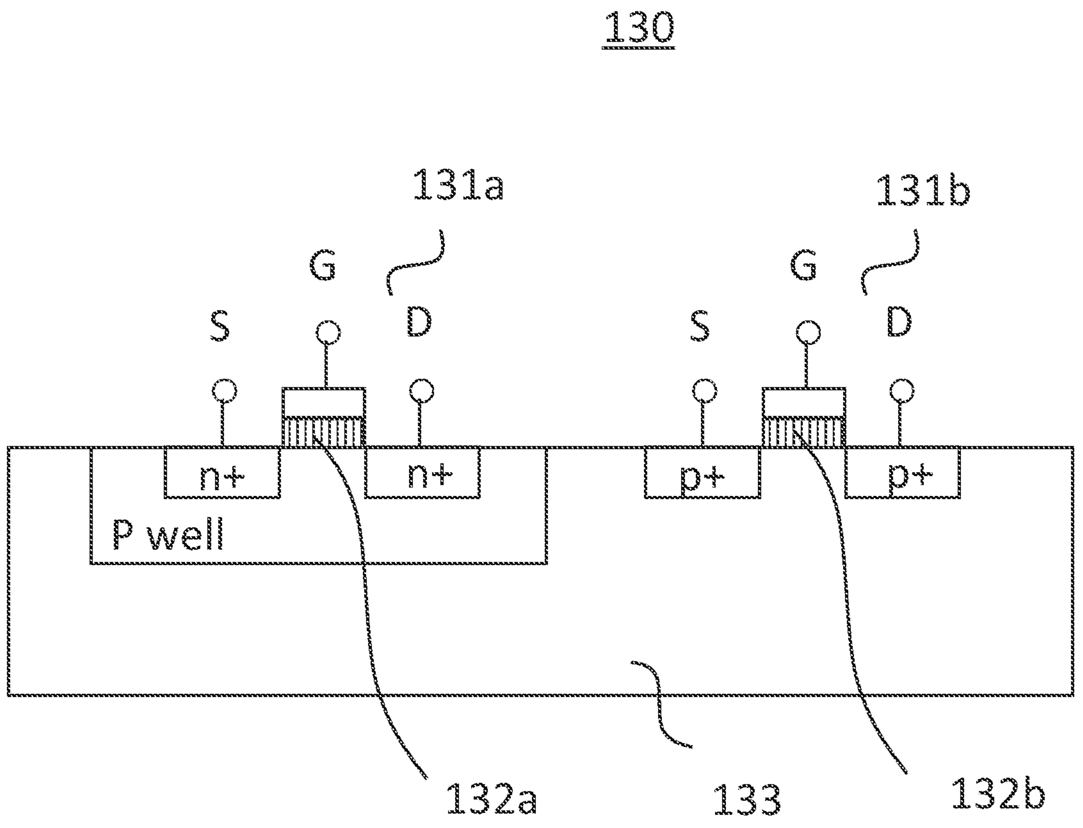
FIG. 13 is a schematic section view of a semiconductor element including a CMOS transistor according to Example 11 of a second embodiment.

FIG. 13 is a schematic section view for describing an example related to a semiconductor element including MOS transistors. A semiconductor element 130 includes an n-channel metal-oxide-semiconductor field-effect transistor: MOSFET 131*a* and a p-channel MOSFET 131*b* that are formed in a semiconductor layer 133 such as n-type single crystal silicon. The n-channel MOSFET 131*a* and the p-channel MOSFET 131*b* constitute a complementary circuit (complementary metal-oxide-semiconductor: CMOS circuit). An amorphous hafnium oxide film containing hydrogen in the range of 1 at % to 16 at % is used for a gate insulating film 132*a* of the n-channel MOSFET 131*a* and a gate insulating film 132*b* of the p-channel MOSFET 131*b*. The thickness of each of the gate insulating films 132*a* and 132*b* of the MOS transistors is typically 1 nm to 10 nm. Since the film is amorphous and contains a predetermined amount of hydrogen, the number of crystal grain boundaries therein is extremely small, and a high dielectric constant can be achieved. Therefore, according to the MOS transistors of the present embodiment including the gate insulating films 132*a* and 132*b*, the leak current can be reduced greatly.

To be noted, application of the amorphous hafnium oxide film containing hydrogen in the range of 1 at % to 16 at % to the gate insulating film of a MOSFET is not limited to the example of FIG. 13. For example, this film can be applied to a gate insulating film of a MOS transistor formed in a semiconductor layer such as p-type single crystal silicon, or a gate insulating film of a single n-channel MOSFET or a single p-channel MOSFET instead of a complementary circuit to greatly reduce the leak current.

Example 12

Figure 14:
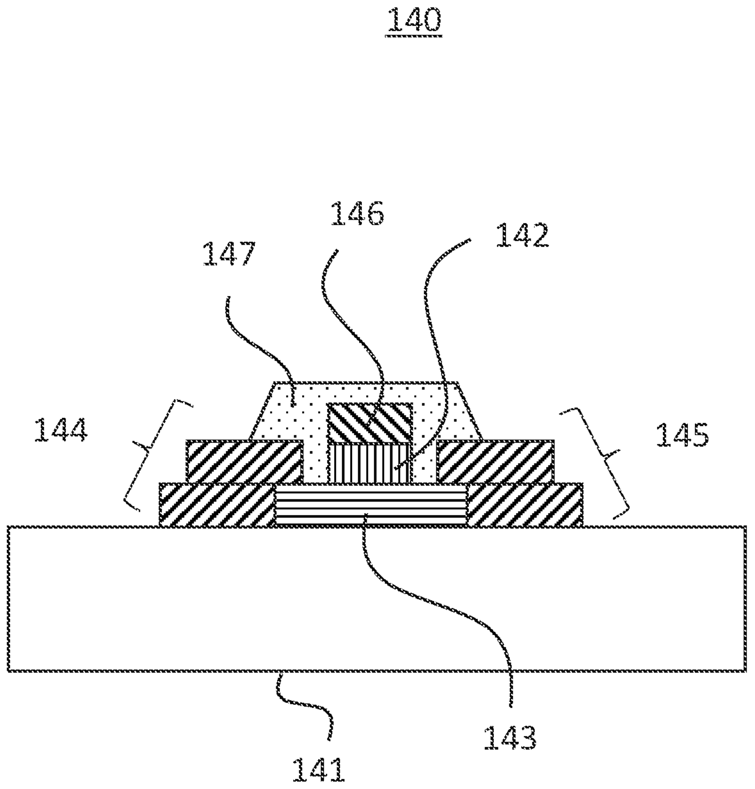
FIG. 14 is a schematic section view of a semiconductor element including a thin film transistor according to Example 12 of the second embodiment.

FIG. 14 is a schematic section view for describing an example related to a semiconductor element including a thin-film transistor: TFT. A semiconductor element 140 includes a thin-film transistor formed on a glass substrate 141. The thin-film transistor includes a semiconductor layer 143 such as low-temperature polysilicon, a source electrode 144, a drain electrode 145, a gate electrode 146, a gate insulating film 142, and a protective film 147. An amorphous hafnium oxide film containing hydrogen in the range of 1 at % to 16 at % is used for the gate insulating film 142. The thickness of the gate insulating film 142 of the thin-film transistor is typically 50 nm to 500 nm. Since the film is amorphous and contains a predetermined amount of hydrogen, the number of crystal grain boundaries therein is extremely small, and a high dielectric constant can be achieved. Therefore, according to the thin-film transistor of the present embodiment including the gate insulating film 142, the leak current can be reduced greatly. A liquid crystal display and an organic electroluminescence: OEL display are semiconductor elements including a thin-film transistor. The highly dielectric film according to the second embodiment can be used as the gate insulating film of a thin-film transistor of a liquid crystal display or an OEL display.

To be noted, application of the amorphous hafnium oxide film containing hydrogen in the range of 1 at % to 16 at % to the gate insulating film of a thin-film transistor is not limited to the example of FIG. 14. For example, the semiconductor layer constituting the channel part is not limited to a low-temperature polysilicon layer and can be constituted by an amorphous silicon layer or an oxide semiconductor layer such as IGZO, and the substrate is not limited to a glass substrate. Also in this case, the leak current can be also greatly reduced in a thin-film transistor including the gate insulating film described above.

Example 13

Figure 15:
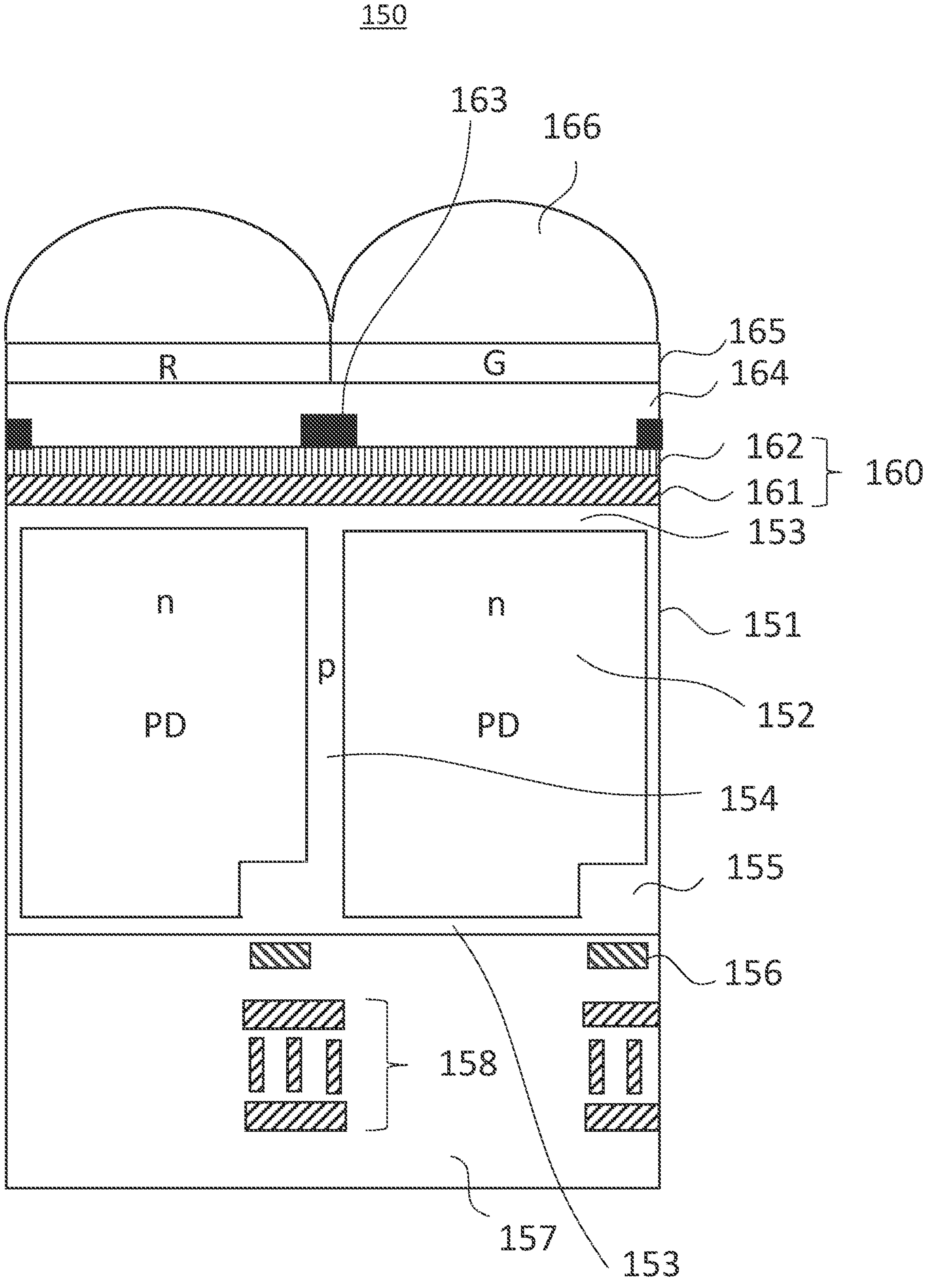
FIG. 15 is a schematic partial section view of an image pickup element of a backside illumination type according to Example 13 of the second embodiment.

The base on which the optical structure of the first embodiment is provided may have a photoelectric structure. The photoelectric structure is a structure that converts an electric signal into an optical signal or an optical signal into an electric signal. FIG. 15 is a schematic partial section view for describing an example of an image pickup element of a backside illumination type. The image pickup element is a kind of an optical element because the image pickup element handles light, and is a kind of a semiconductor element because the image pickup element includes a photodiode and a transistor. In an image pickup element 150 of a backside illumination type, photodiodes PD corresponding to respective pixels are formed in a semiconductor substrate 151. The semiconductor substrate 151 functions as a base including a photoelectric structure that converts an optical signal into an electric signal. The photodiodes PD each include a pn junction formed by an n-type region 152 extending in the thickness direction of the semiconductor substrate 151, and a p-type region 153 in contact with the n-type region 152 on both the front side and back side of the substrate. The photodiodes PD of the pixels are each sectioned by a p-type element isolation region 154. A p-type semiconductor well region 155 in contact with the element isolation region 154 is formed on the front side of the semiconductor substrate 151, that is, the lower side in FIG. 15, and a pixel transistor corresponding to each pixel is provided. The pixel transistor is constituted by a source region, a drain region, a gate insulating film, and a gate electrode 156. Further, an interlayer insulating film 157 and multilayer wiring 158 are provided on the front side.

Meanwhile, an antireflection structure 160 having a function of electric insulation and antireflection is formed on the back side of the semiconductor substrate 151 serving as a light receiving side, that is, the upper side in FIG. 15. The antireflection structure 160 has a bilayer structure, and a silicon oxide film 161 and a hafnium oxide film 162 are laminated in this order from the semiconductor substrate 151 side. A film having a refractive index of 1.506 as in Example 5 is preferably used for the silicon oxide film 161. An amorphous hafnium oxide film having a hydrogen content of 6.5 at % and a refractive index of 2.253 as in Example 5 is preferably used for the hafnium oxide film 162.

To suppress crosstalk of incident light between pixels, for example, a light shielding film 163 formed from aluminum is disposed on the antireflection structure 160, and further a flattening film 164 formed from resin is provided thereon to provide a flat upper surface. An on-chip color filter 165 of, for example, Bayer arrangement, and an on-chip microlens 166 are formed on the flattening film 164. The light shielding film 163 is formed from metal such as aluminum or tungsten, and can also function as an electrode imparted with a fixed potential. The antireflection structure 160 also functions as an insulating film that insulates the light shielding film 163 from the semiconductor substrate 151 serving as a semiconductor layer.

In the present example, by providing the amorphous hafnium oxide film containing hydrogen in the range of 1 at % to 16 at % on a photodiode, high antireflection performance and a low light absorption property can be realized, and thus a highly sensitive image pickup element can be realized.

To be noted, the image pickup element to which the amorphous hafnium oxide film containing hydrogen in the range of 1 at % to 16 at % is applied is not limited to the example of FIG. 15, and the hafnium oxide film can be preferably used as an antireflection structure also in, for example, an image pickup element of a frontside illumination type instead of an image pickup element of a backside illumination type. In the image pickup element of a frontside illumination type, the amorphous hafnium oxide film may function as both an antireflection film and a gate insulating film. For example, the amorphous hafnium oxide film may be used as the gate insulating film of a transistor of a pixel circuit, and this amorphous hafnium oxide film may be extended to the upper side of the photodiode and used as an antireflection film.

In addition, various cameras such as lens-replacing cameras and lens-integrated cameras, and camera modules for smartphones and vehicles can be produced by using an image pickup element including the antireflection structure described above. A camera module can include, in addition to a lens and an image pickup element, a holding part such as a frame that holds a plurality of optical parts including the lens and the image pickup element. As a matter of course, the lens of the camera module may be coated with the hafnium oxide film. In addition, the optical element including a base including a photoelectric structure may be a liquid crystal display or an OEL display. An electronic equipment such as a camera or a smartphone can include, in addition to the optical element including the base including the photoelectric structure, a controller for electrically controlling the photoelectric structure. In addition, in the case where the optical element is an image pickup element, the electronic equipment can include a processor for processing a signal output from the image pickup element. In addition, in the case where the optical element is a display element, the electronic equipment can include a processor for processing a signal input to the display element. The electronic equipment to which the present embodiment is applicable may be an information equipment such as a smartphone or a personal computer. Alternatively, the electronic equipment is an office appliance such as a printer or a copier, a medical equipment such as an X-ray imaging apparatus or an endoscope, an industrial equipment such as a robot or a semiconductor manufacturing apparatus, or a transportation equipment such as a vehicle, an airplane, or a ship.

Modification Examples of First and Second Embodiments

To be noted, the present invention is not limited to the embodiments and examples described above, and can be modified in many ways within the technical concept of the present invention.

The high-refractive-index film according to the first embodiment can be widely used for coating optical elements such as lenses, mirrors, prisms, image pickup elements (image pickup devices) such as image sensors, and display elements (display devices) such as displays. Further, the high-refractive-index film can be used for pieces of optical equipments such as exposing apparatuses, various cameras, and replacing lenses including the optical element. These pieces of optical equipments can include, in addition to a plurality of optical parts including optical elements coated with hafnium oxide films, a holding part such as a lens barrel that holds the plurality of optical parts. By laminating high-refractive-index films according to the first embodiment with low-refractive-index films having a lower refractive index, a high-performance antireflection structure or reflection structure can be formed. For example, in an exposing apparatus including an ultraviolet light source, the exposure performance of the exposing apparatus using ultraviolet light can be improved by providing the antireflection structure according to the first embodiment to a lens and/or providing the reflection structure according to the first embodiment to a mirror.

The highly dielectric film according to the second embodiment is widely applicable to gate insulating films of various transistors, and can be implemented in various semiconductor elements (semiconductor devices) such as memories, processors, and logical integrated circuits, and various pieces of electronic equipments such as smartphones and personal computers. The electronic equipment to which the present embodiment can be applied may be an information equipment such as a smartphone or a personal computer, or a communication equipment such as a modem or a router. Alternatively, the electronic equipment may be an office appliance such as a printer or a copier, a medical equipment such as an X-ray imaging apparatus or an endoscope, an industrial equipment such as a robot or a semiconductor manufacturing apparatus, or a transportation equipment such as a vehicle, an airplane, or a ship.

Hereinafter, embodiments in which tantalum oxide is used as the transition metal oxide will be described as third and fourth embodiments. Tantalum oxide has a high refractive index and a high dielectric constant, and therefore application thereof in the fields of optical elements and semiconductor elements is considered. In various pieces of optical equipments such as an exposing apparatus, an optical element is coated with an optical film to improve the optical characteristics such as antireflection characteristics and reflection characteristics. In capacitor elements and semiconductor elements, an insulating film is used for insulating a capacitor electrode or a gate electrode from other parts.

In the field of optical elements, realization of an optical film that has a high refractive index and a low light absorptance at a good balance, and has high performance has been desired.

In the field of electric elements, realization of an insulating film that has a high dielectric constant and a low leak current at a good balance and has high performance has been desired.

Therefore, the present embodiment aims to provide a technique advantageous in realizing high performance for a film containing tantalum oxide. One mode of the third and fourth embodiments is a film including amorphous tantalum oxide as a main component and has a hydrogen content of 1.0 at % or more.

According to the present embodiment, a technique advantageous in realizing high performance by achieving a high refractive index and a low absorptance at a good balance, and achieving a high dielectric constant and a low leak current at a good balance can be provided.

A tantalum oxide film containing hydrogen by an amount in a predetermined range, a piece of optical equipment including the film, and the like serving as embodiments of the present invention will be described with reference to drawings. To be noted, although the terms “film” and “layer” are used in this description, these terms are used customarily without strict distinction therebetween in the technical field, and there is neither any intension to strictly distinguish these two in this description.

THIRD EMBODIMENT

Figure 16:
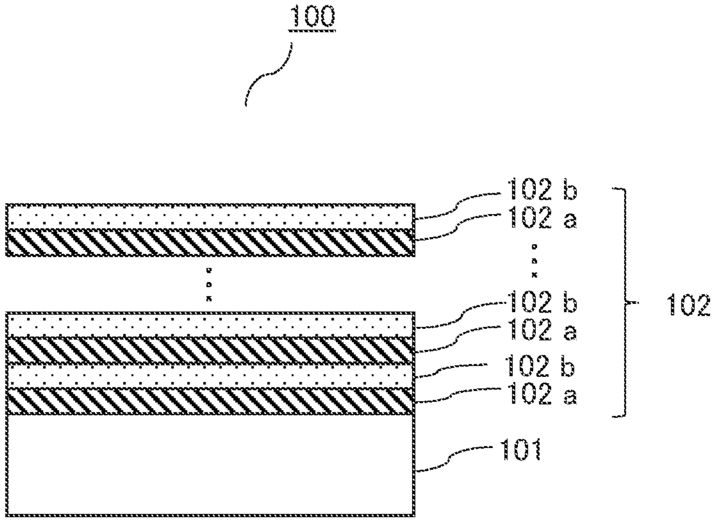
FIG. 16 is a schematic section view of an optical element according to a third embodiment.

FIG. 16 is a schematic section view of an optical element according to the present embodiment. An optical element 100 includes a base 101, and an optical structure 102 formed on the base 101. The optical structure 102 can be referred to as a multilayer film in which high-refractive-index layers **102*a* formed from a high-refractive-index material and low-refractive-index layers 102*b*** formed from a low-refractive index material are alternately laminated. Here, layers of a first type and layers of a second type being alternately laminated means that at least one layer of the second type is positioned between two layers of the first type, and at least one layer of the first type is positioned between two layers of the second type. Therefore, a configuration including at least four layers in total of layers of a first type and layers of a second type is shown.

The base 101 can be constituted by a material such as a calcium fluoride crystal, a quartz glass, an optical glass such as borosilicate-crown glass BK7, resin, metal, or the like. In addition, the base 101 of various shapes such as a flat plane shape and a shape with a curved surface can be used in accordance with the use and type of the optical element such as a lens, mirror, filter, or prism.

The material used as a main component of the high-refractive-index layers **102*a* is tantalum oxide ($Ta_2O_5$), and the tantalum oxide ($Ta_2O_5$) of the present embodiment contains hydrogen by an amount in a predetermined range as will be described later. To be noted, in the description below, a film containing tantalum oxide ($Ta_2O_5$) as a main component will be also described as a tantalum oxide film in some cases. In the present embodiment, the tantalum oxide film is an optical film, and constitutes the optical structure 102**. Tantalum oxide is a metal oxide whose metal component is tantalum. In a film containing metal oxide as a main component, the content of the metal component (tantalum) is represented by J (at %), and the oxygen content is represented by K (at %). Here, a film containing tantalum oxide as a main component means that in the case where, for example, it is assumed that the film contains two other elements than the tantalum oxide, the content of each element (at %) satisfies the following relationships. That is, this means that the sum of the tantalum content J (at %) and the oxygen content K (at %) is larger than each of the contents L (at %) and M (at %) of respective elements other than tantalum and oxygen (J+K>L, and J+K>M). Since the tantalum oxide film of the present embodiment necessarily contains hydrogen by an amount in a predetermined range, J+K is less than 100 at %. According to the stoichiometric composition $Ta_2O_5$, typically 2×J<K<3×J holds. The tantalum content J is, for example, in the range of 15 at % to 35 at % and typically in the range of 20 at % to 30 at %, and the oxygen content K is, for example, in the range of 50 at % to 75 at % and typically in the range of 60 at % to 70 at %. It is preferable that sum of the tantalum content J (at %) and the oxygen content K (at %) of the tantalum oxide film is larger than the sum of the contents L (at %) and M (at %) of all the elements other than tantalum and oxygen contained in the tantalum oxide film (J+K>L+M). In this case, J+K is higher than 50 at %. Although a case where two elements other than tantalum and oxygen are provided has been described as an example herein, the number of elements other than tantalum and oxygen is not limited to two and may be one. The two elements in the tantalum oxide film of the present embodiment are hydrogen and argon in the former case, and the one element in the latter case is hydrogen.

In a film of the present embodiment containing tantalum oxide as a main component, the element necessarily contained in addition to tantalum and oxygen is hydrogen, and an element that can be optionally contained is argon. The argon content may be, for example, 0.5 at % or more, 5.0 at % or less, 3.0 at % or less, and 2.0 at % or less. For example, argon can be contained in a range of 0.9 at % to 1.6 at %. As a result of analysis of the tantalum oxide film of the present embodiment, contents of elements other than tantalum, oxygen, hydrogen, and argon were below the detection limit. Therefore, typically, elements other than these four are substantially not contained in the film of the present embodiment containing tantalum oxide as a main component. Elements that the tantalum oxide film can contain in addition to these four elements are, for example, in main-group elements, boron (B), carbon (C), nitrogen (N), fluorine (F), aluminum (Al), silicon (Si), phosphorus (P), sulfur (S), and chlorine (Cl). Elements that the tantalum oxide film can contain in addition to these four elements are, for example, in transition elements, iron (Fe), nickel (Ni), chromium (Cr), niobium (Nb), and tungsten (W). In the film of the present embodiment, if the content of each of the elements other than the four is less than 0.5 at %, particularly 0.1 at % or less, light absorption caused by the elements other than the four can be sufficiently suppressed. The elements other than the four being below the detection limit means that the content of each of the elements other than the four can be 0 at %.

Examples of the material used for the low-refractive-index layers 102*b* include materials containing silicon oxide or aluminum oxide as a main component, but the configuration is not limited to this. For example, $MgF_2$, $CaF_2$, $LaF_3$, $CeF_3$, $YF_3$, or the like may be used.

As illustrated in FIG. 16, the optical structure 102 has a configuration in which the high-refractive-index layers 102*a* and the low-refractive-index layers 102*b* are alternately laminated in this order from the base 101 side, and the outermost layer is the low-refractive-index layer 102*b*. To be noted, the configuration may be changed in accordance with the use of the optical element. For example, a configuration in which the low-refractive-index layers 102*b* and the high-refractive-index layers 102*a* are alternately laminated in this order from the base 101 side, and the outermost layer is the low-refractive-index layer 102*b* may be employed. In addition, a protective layer may be provided on the low-refractive-index layer 102*b* serving as the outermost layer to be the outermost layer, and an intermediate-refractive-index layer formed from a material having an intermediate refractive index may be disposed between the high-refractive-index layer 102*a* and the low-refractive-index layer 102*b*. Alternatively, a base layer such as an adhesion layer may be provided between the base 101 and the optical structure 102. To be noted, the optical structure 102 of the embodiment does not have to have an alternate lamination structure in which the low-refractive-index layers 102*b* and the high-refractive-index layers 102*a* are alternately laminated as illustrated. In addition, the optical structure 102 does not have to have a multilayer structure including a high-refractive-index layer 102*a* and a low-refractive-index layer 102*b*, and may have a single-layer structure including only one layer of the high-refractive-index layer 102*a*.

A manufacturing method for the optical element of the present embodiment including the tantalum oxide film containing hydrogen by an amount in a predetermined range serving as a high-refractive-index layer will be described. To be noted, a known film forming method can be used for formation of the low-refractive-index layer 102*b*, and therefore description thereof will be omitted.

Figure 17:
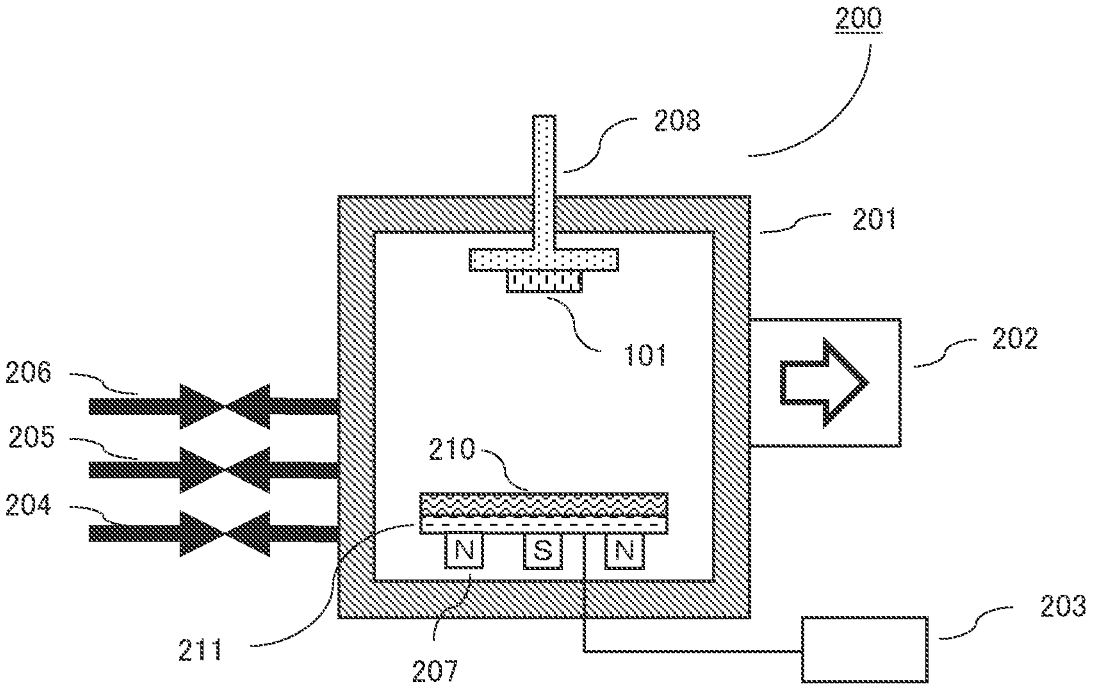
FIG. 17 is a schematic view of a sputtering film forming apparatus used for manufacturing the optical element according to the third embodiment.

FIG. 17 is a schematic view of a sputtering film forming apparatus 200 used for manufacture of the optical element. The sputtering film forming apparatus 200 includes a vacuum chamber 201 serving as an airtight container, and an exhaustion system 202 that exhaust air in the vacuum chamber 201. In addition, the sputtering film forming apparatus 200 includes an argon gas inlet port 204, an oxygen gas inlet port 205, and a hydrogen gas inlet port 206 such that gases required for film formation can be introduced into the vacuum chamber 201. Further, a sputtering target 210, a backing plate 211, a magnet mechanism 207, and a base holding mechanism 208 are provided to the vacuum chamber 201. By holding the base 101 of the optical element by the base holding mechanism 208 and supplying power thereto from a power source 203, film formation by the reactive sputtering method can be performed.

To form a tantalum oxide film containing hydrogen serving as a high-refractive-index layer, film formation is performed by the reactive sputtering method in accordance with the following procedure. For example, the base 101 constituted by quartz glass processed into a predetermined optical element shape, and 9-inch metal tantalum having a purity of 99.9 wt % or more as the sputtering target 210 are set in the vacuum chamber 201. At this time, the distance between the base 101 and the sputtering target 210 is set to, for example, 200 mm. Further, air in the vacuum chamber 201 is exhausted by an exhaustion system 202 to achieve a vacuum of about $5\times10^{-5}$ Pa. Then, plasma discharge is performed while introducing an argon gas through the argon gas inlet port 204, an oxygen gas through the oxygen gas inlet port 205, and a hydrogen gas through the hydrogen gas inlet port 206. That is, plasma discharge is generated by applying power of 10 $W/cm^2$ to the sputtering target 210 from the power source 203, and a tantalum oxide film containing hydrogen is formed on the base 101 of, for example, a diameter of 30 mm× a thickness of 1 mm, at a thickness of about 100 nm. The amount of hydrogen contained in the film is adjusted by changing the flow rate of the hydrogen gas. To be noted, the thickness of each layer is not necessarily limited to about 100 nm, and is appropriately set in accordance with the wavelength of light used in the optical element and the number of layers constituting the optical structure. The physical thickness of the tantalum oxide film in the optical element is, for example, in the range of 8 nm to 1000 nm, and preferably in the range of 8 nm to 100 nm. Tantalum oxide layers of a thickness of 100 nm may be laminated without any other layers to form a 1000 nm-thick tantalum oxide film. Specific examples and comparative examples will be described below.

Examples 1 to 5 and Comparative Examples 1 and 2

The high-refractive index layer used in the optical structure will be described with reference to Examples 1 to 5 and Comparative Examples 1 and 2. All the high-refractive-index layers according to Examples 1 to 5 and Comparative Example 2 were formed while introducing an oxygen gas through the oxygen gas inlet port 205 at a flow rate of 200 sccm. At this time, in all examples and comparative examples, the film was formed by introducing an argon gas through the argon gas inlet port 204 at a flow rate of 200 sccm. In addition, in Example 1, plasma discharge was performed while introducing a hydrogen gas through the hydrogen gas inlet port 206 at a flow rate of 20 sccm. In the other examples and comparative examples, the amount of hydrogen contained in the film was adjusted by changing the flow rate of the hydrogen gas from Example 1 as will be described later. In all the examples and comparative examples, film formation was performed such that the film thickness was about 100 nm. To be noted, the film formation conditions described above are mere examples, and can be appropriately modified in accordance with the structure of the film forming apparatus or the like.

For a single film of the tantalum oxide film of each example and each comparative example, hydrogen content, light absorptance, refractive index, and crystallinity were evaluated.

Evaluation of the hydrogen content of the film was performed by, for example, irradiating the tantalum oxide film with a high-energy ion beam of the MeV order and performing hydrogen forward scattering spectrometry: HFS. For the other materials than hydrogen in the film, evaluation was performed by irradiating the film with a high-energy ion beam of the MeV order and performing Rutherford backscattering spectrometry: RBS. The content (at %) of hydrogen, tantalum, oxygen, and argon in the tantalum oxide film was obtained by using these results. To be noted, the measurement precision of the hydrogen content was ±0.1% in the region of a minute amount equal to or smaller than 1%, and was ±0.4% in the region of 3% or more.

In addition, the light absorptance and the refractive index were evaluated by measuring the transmittance and reflectance at a light beam incident angle of 5° in the wavelength range of 200 nm to 500 nm by using an ultraviolet-visible-near infrared spectrometer.

The light absorptance was calculated by using the following formula.

$$A(\%) = 100 - T(\%) - R(\%) \qquad \text{(Formula 1)}$$

In the formula, A (%) represents the light absorptance, T (%) represents the transmittance, and R (%) represents the reflectance.

The refractive index was calculated by performing analysis on the measured reflectance by using optical thin film analysis/design software Film Wizard™ available from Scientific Computing International.

Evaluation of the crystallinity was performed by X-ray diffraction analysis. In the description below, being amorphous refers to a case where, when an X-ray is radiated onto a film serving as a measurement target at a small incident angle of about 0.5° and a diffraction pattern is observed, a clear diffraction peak is not detected, in other words, a halo pattern is observed. Therefore, being amorphous mentioned herein does not necessarily exclude a state in which a material of a slightly crystalline state is included.

Figure 27:
FIG. 27 is a diagram illustrating an X-ray diffraction pattern of a tantalum oxide film of the third embodiment.

FIG. 27 illustrates the X-ray diffraction pattern (incident angle: 0.4°) of the high-refractive-index layer of the present embodiment, that is, a tantalum oxide film containing hydrogen by an amount in a predetermined range as an example. Since only a halo pattern is observed and no clear crystalline peak is observed as illustrated, it can be determined that the high-refractive-index film of the present embodiment is an amorphous film. All tantalum oxide films containing hydrogen by an amount of 1.0 at % or more and less than 10.0 at % such as the tantalum oxide film described as an example were amorphous. To be noted, for a crystalline tantalum oxide film such as a tantalum oxide single crystal or polycrystal, no merit was found in setting the hydrogen content to 1.0 at % as compared with a case where the hydrogen content was set to a value of the ppm order. In addition, in a film formation condition in which the hydrogen content could be 10.0 at % or more, a film that was easy to analyze was not obtained.

Tables 7 and 8 show evaluation results of Examples 1 to 5 and Comparative Examples 1 and 2. Table 7 is a table showing, for each film, the hydrogen content, the refractive index for light having a wavelength of 313 nm, the light absorptance for the light having a wavelength of 313 nm, an average value of the light absorptance in a wavelength range of 290 nm to 310 nm, and an average value of the light absorptance in a wavelength range of 350 nm to 500 nm. Table 8 shows the content (at %) of each element contained in each film. To be noted, in Table 8, although the sum of the contents of each example is not 100 at %, this is because the second decimal place of each content is rounded off, and the sum is 100 at % if the second decimal place, the third decimal place, and so on are taken into consideration.

TABLE 7

| | Hydrogen content (at %) | Absorptance (%) (313 nm) | Refractive index (313 nm) | Absorptance (%) (290~310 nm) | Absorptance (%) (350~500 nm) |
|---|---|---|---|---|---|
| Example 1 | 1.0 | 0.40 | 2.48 | 2.50 | 0.00 |
| Example 2 | 3.0 | 0.30 | 2.46 | 3.09 | 0.03 |
| Example 3 | 6.3 | 0.14 | 2.44 | 2.23 | 0.00 |
| Example 4 | 9.0 | 0.07 | 2.43 | 1.24 | 0.01 |
| Example 5 | 9.6 | 0.03 | 2.43 | 1.19 | 0.08 |

TABLE 7-continued

| | Hydrogen content (at %) | Absorptance (%) (313 nm) | Refractive index (313 nm) | Absorptance (%) (290~310 nm) | Absorptance (%) (350~500 nm) |
|---|---|---|---|---|---|
| Comparative Example 1 | 0.2 | 0.42 | 2.46 | 3.72 | 0.01 |
| Comparative Example 2 | 0.6 | 0.42 | 2.46 | 3.66 | 0.01 |

TABLE 8

| | Hydrogen content (at %) | Tantalum content (at %) | Oxygen content (at %) | Argon content (at %) |
|---|---|---|---|---|
| Example 1 | 1.0 | 27.6 | 69.9 | 1.6 |
| Example 2 | 3.0 | 26.9 | 68.6 | 1.4 |
| Example 3 | 6.3 | 25.8 | 66.4 | 1.5 |
| Example 4 | 9.0 | 24.6 | 64.9 | 1.5 |
| Example 5 | 9.6 | 24.4 | 65.1 | 0.9 |
| Comparative Example 1 | 0.2 | 27.8 | 70.1 | 1.9 |
| Comparative Example 2 | 0.6 | 27.7 | 70.1 | 1.6 |

Regarding the crystallinity of the tantalum oxide film of Example 1, the tantalum oxide film was amorphous, and the hydrogen content of the tantalum oxide film was 1.0 at %. In addition, the light absorptance and refractive index of the tantalum oxide film of Example 1 for a wavelength of 313 nm were 0.40% and 2.48, respectively. The average light absorptance in the wavelength range of 290 nm to 310 nm was 2.50%, and the average light absorptance in the wavelength range of 350 nm to 500 nm was 0.00%.

Regarding the crystallinity of the tantalum oxide film of Example 2, the tantalum oxide film was amorphous, and the hydrogen content of the tantalum oxide film was 3.0 at %. In addition, the light absorptance and refractive index of the tantalum oxide film of Example 2 for a wavelength of 313 nm were 0.30% and 2.46, respectively. The average light absorptance in the wavelength range of 290 nm to 310 nm was 3.09%, and the average light absorptance in the wavelength range of 350 nm to 500 nm was 0.03%.

Regarding the crystallinity of the tantalum oxide film of Example 3, the tantalum oxide film was amorphous, and the hydrogen content of the tantalum oxide film was 6.3 at %. In addition, the light absorptance and refractive index of the tantalum oxide film of Example 3 for a wavelength of 313 nm were 0.14% and 2.44, respectively. The average light absorptance in the wavelength range of 290 nm to 310 nm was 2.23%, and the average light absorptance in the wavelength range of 350 nm to 500 nm was 0.00%.

Regarding the crystallinity of the tantalum oxide film of Example 4, the tantalum oxide film was amorphous, and the hydrogen content of the tantalum oxide film was 9.0 at %. In addition, the light absorptance and refractive index of the tantalum oxide film of Example 4 for a wavelength of 313 nm were 0.07% and 2.43, respectively. The average light absorptance in the wavelength range of 290 nm to 310 nm was 1.24%, and the average light absorptance in the wavelength range of 350 nm to 500 nm was 0.01%.

Regarding the crystallinity of the tantalum oxide film of Example 5, the tantalum oxide film was amorphous, and the hydrogen content of the tantalum oxide film was 9.6 at %. In addition, the light absorptance and refractive index of the tantalum oxide film of Example 5 for a wavelength of 313 nm were 0.03% and 2.43, respectively. The average light absorptance in the wavelength range of 290 nm to 310 nm was 1.19%, and the average light absorptance in the wavelength range of 350 nm to 500 nm was 0.08%.

Regarding the crystallinity of the tantalum oxide film of Comparative Example 1, the tantalum oxide film was amorphous, and the hydrogen content of the tantalum oxide film was 0.2 at %. In addition, the light absorptance and refractive index of the tantalum oxide film of Comparative Example 1 for a wavelength of 313 nm were 0.42% and 2.46, respectively. The average light absorptance in the wavelength range of 290 nm to 310 nm was 3.72%, and the average light absorptance in the wavelength range of 350 nm to 500 nm was 0.01%.

Regarding the crystallinity of the tantalum oxide film of Comparative Example 2, the tantalum oxide film was amorphous, and the hydrogen content of the tantalum oxide film was 0.6 at %. In addition, the light absorptance and refractive index of the tantalum oxide film of Comparative Example 2 for a wavelength of 313 nm were 0.42% and 2.46, respectively. The average light absorptance in the wavelength range of 290 nm to 310 nm was 3.66%, and the average light absorptance in the wavelength range of 350 nm to 500 nm was 0.01%.

To be noted, for the tantalum oxide film of the embodiment, any impurity other than hydrogen does not need to be actively added to the tantalum oxide film, and it is preferable that the impurity content X of the tantalum oxide film is lower than the hydrogen content L ($X<L$). Here, an impurity is an element other than oxygen, tantalum, and hydrogen, and the impurity content X is the sum of contents of impurities. The impurity content X of the tantalum oxide film described in the above examples is less than 5.0 at %, 3.0 at % or less, or 2.0 at % or less. In the case of a tantalum oxide film to which a large amount of impurities ($X>L$) are added, not only the addition of impurities can lower the refractive index, but also the light absorption is not necessarily suppressed enough. The tantalum oxide film of the present embodiment may contain an element other than tantalum, oxygen, and hydrogen. For example, the tantalum oxide film described in the above examples can contain argon. This argon originates from the argon gas introduced through the argon gas inlet port 204 at the time of film formation. It is preferable that the argon content M of the tantalum oxide film is less than the hydrogen content L ($M<L$). The argon content M of the tantalum oxide film is, for example, in the range of 0.5 at % to 5 at %.

The present embodiment can realize a high refractive index and a low light absorptance even in the case where the film contains argon. To be noted, for the tantalum oxide film of the embodiment, silicon does not need to be actively added to the tantalum oxide film, and it is preferable that the silicon content O of the tantalum oxide film is lower than the hydrogen content L ($O<L$). The silicon content O of the tantalum oxide film described in the above examples is less than 1 at %, 0.1 at % or less, or less than the detection limit. In the case of a tantalum oxide film to which silicon is added, not only the addition of silicon can fluctuate the refractive index, but also the light absorption is not necessarily suppressed enough. In the tantalum oxide film of the embodiment, carbon does not need to be actively added to the tantalum oxide film, and it is preferable that the carbon content P of the tantalum oxide film is less than the hydrogen content L (P<L). The carbon content P of the tantalum oxide film described in the above examples is less than 1 at %, 0.1 at % or less, or less than the detection limit. In the tantalum oxide film of the embodiment, nitrogen does not need to be actively added to the tantalum oxide film, and it is preferable that the nitrogen content Q of the tantalum oxide film is less than the hydrogen content L (Q<L). The nitrogen content Q of the tantalum oxide film described in the above examples is less than 1 at %, 0.1 at % or less, or less than the detection limit.

The inventors have assumed a model in which in tantalum oxide containing hydrogen, addition reaction of hydrogen to tantalum oxide occurs. When the stoichiometric composition of tantalum oxide whose hydrogen content is 0 at % is assumed to be $Ta_2O_5$, the tantalum oxide containing hydrogen can be modelized as $Ta_2O_5H_x$. The hydrogen added to $Ta_2O_5$ bonds to tantalum or oxygen, and can terminate dangling bonds of tantalum or oxygen. The hydrogen may enter into bonds between tantalum and oxygen or enter between the lattice. The hydrogen concentration calculated by simulation using this model is about $4\times10^{20}$ atoms/cm$^3$ in the case where the hydrogen content is 1 at %, about $1\times10^{21}$ atoms/cm$^3$ in the case where the hydrogen content is 3 at %, about $2\times10^{21}$ atoms/cm$^3$ in the case where the hydrogen content is 6 at %, about $4\times10^{21}$ atoms/cm$^3$ in the case where the hydrogen content is 9 at %, and about $5\times10^{21}$ atoms/cm$^3$ or more in the case where the hydrogen content is 10 at % or more. The hydrogen concentration of the tantalum oxide film of the present embodiment can be $4\times10^{20}$ atoms/cm$^3$ or more and less than $5\times10^{21}$ atoms/cm$^3$. It is preferable that an appropriate hydrogen content (at %) is satisfied in this range of hydrogen concentration indicated by atoms/cm$^3$. Further, the hydrogen concentration of the tantalum oxide film of the present embodiment can be $1\times10^{21}$ atoms/cm$^3$ or more, $2\times10^{21}$ atoms/cm$^3$ or more, and $4\times10^{22}$ atoms/cm$^3$ or less. However, depending on the amount of impurities such as argon and the packing density of the tantalum oxide film, the hydrogen content of 1 at % to 10 at % or 3 at % to 9 at % may be satisfied in the range of hydrogen concentration less than $4\times10^{20}$ atoms/cm$^3$, and the hydrogen content of 1 at % to 10 at % or 3 at % to 9 at % may be satisfied in the range of hydrogen concentration more than $5\times10^{21}$ atoms/cm$^3$.

Since a high-output light source is used in an exposing apparatus, when an optical film formed in an optical element in the apparatus is irradiated with light from the light source and light absorption occurs in this optical film, the light absorption can cause increase in the temperature of the optical element and the atmosphere around the optical element. When thermal expansion occurs in the optical element or mechanical parts therearound due to the increase in the temperature, the thermal expansion can cause decrease in or de-stabilization of the focusing performance of the exposing apparatus. In addition, although a multilayer film is typically used to improve the optical characteristics of the optical film, since the loss of light amount due to light absorption becomes more noticeable when the number of layers is larger, the effective intensity of the exposing light can decrease in some cases when the number of layers is large.

In addition, although light sources of light emission wavelengths of visible light region such as the g-line (436 nm) and the h-line (405 nm), ultraviolet region such as the i-line (365 nm) and the j-line (313 nm), and DUV range (290 nm to 310 nm) can be used, and the highest resolution that can be achieved depends on the wavelength of the exposing light. The exposing light emitted from the light source of the exposing apparatus can include, for example, light of at least one wavelength within the range of 280 nm to 330 nm such as the j-line, and light of at least one wavelength within the range of 330 nm to 380 nm such as the i-line.

Therefore, to stably achieve a high resolution, it is desirable to use light of a small wavelength such as the j-line (313 nm) as the exposing light. Therefore, it is desirable that films and layers disposed in the optical path are constituted by materials whose light absorption of light of a small wavelength such as the j-line (313 nm) is small. In addition to the increase in the resolution, the exposing time can be shortened and the throughput can be improved by increasing the illuminance on the photoresist by using light of a wide wavelength range.

Tantalum oxide has a characteristic that the refractive index thereof is high in the visible wavelength range, and therefore is a material that is widely used in the field of optical equipments using the visible wavelength range. However, since relatively large light absorption occurs in the wavelength range near the j-line in tantalum oxide, there is a problem that generation of heat or loss of light occurs in the case where tantalum oxide is disposed in the optical path of ultraviolet light such as the j-line.

For example, as a condition to suppress the thermal influence on the exposing performance of the exposing apparatus or to suppress the light quantity loss, the light absorptance of the tantalum oxide film for the wavelength of the j-line (313 nm) being 0.40% or less, and more preferably 0.30% or less can be mentioned. In addition, for the wavelength range of 350 nm to 500 nm including the g-line, h-line, and i-line, the average of the light absorptance is preferably 0.10% or less, more preferably 0.08% or less, and further preferably 0.05% or less. In the description below, a case where these conditions are satisfied will be sometimes referred to as “low absorption”.

Comparing Examples 1 to 5 in which the film contains hydrogen by an amount in the range of 1.0 at % or more and less than 10.0 at % with Comparative Examples 1 and 2 in which the hydrogen content is less than 1.0 at %, it can be said that all are of low absorption in the wavelength range of 350 nm to 500 nm. In contrast, whereas the light absorption for the wavelength of 313 nm exceeds 0.40% in Comparative Examples 1 and 2, it is confirmed that the light absorption is 0.40% or less, which is low absorption, in Examples 1 to 5.

Figure 18:
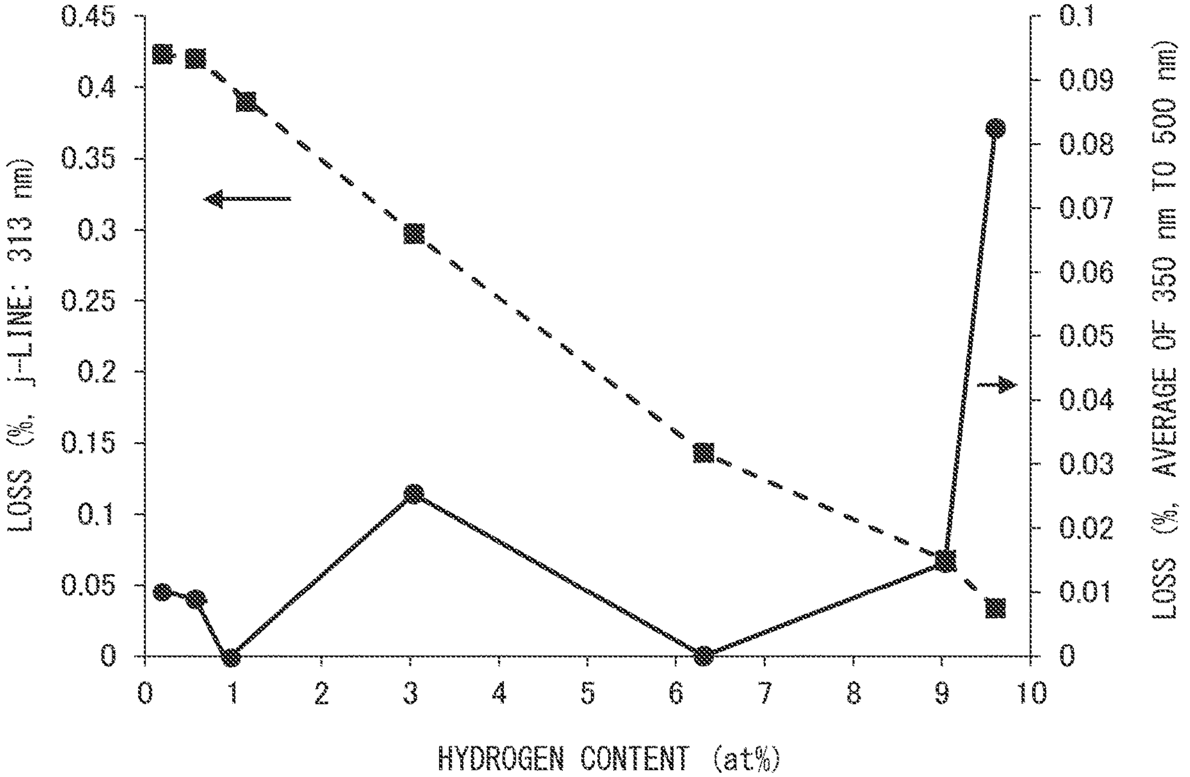
FIG. 18 is a graph illustrating a light absorptance characteristic with respect to the hydrogen content of a tantalum oxide film.
Figure 19:
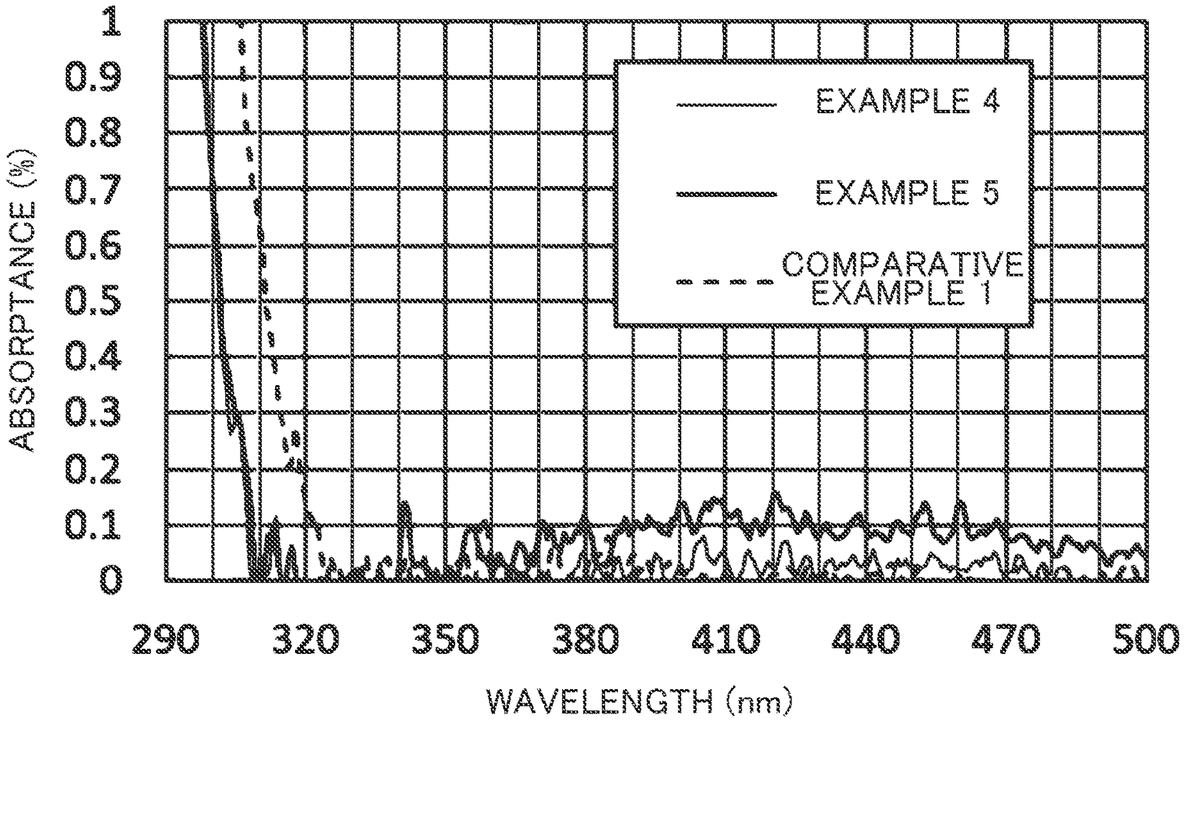
FIG. 19 is a graph illustrating wavelength dependency of light absorption of Examples 4 and 5 and Comparative Example 1 of the third embodiment.

FIG. 18 illustrates a graph of a dot line indicating the relationship between the hydrogen content and the light absorptance (wavelength: 313 nm), and a graph of a solid line indicating the relationship between the hydrogen content and the light absorptance (average value in the wavelength range of 350 nm to 500 nm). In addition, FIG. 19 illustrates absorption spectra of Examples 4 and 5 and Comparative Example 1, and it can be seen that the light absorptance in the wavelength range of 325 nm or less is greatly reduced in Examples as compared with Comparative Example.

As illustrated in FIG. 18, in Examples 1 to 5, the light absorption for the wavelength of 313 nm decreases as the hydrogen content increases from 1.0 at %. In addition, the light absorption shows an increasing tendency in the wavelength range of 350 nm to 500 nm when the hydrogen content exceeds 9.0 at %. As described above, it can be seen that the change in the light absorption according to the difference in the hydrogen content of the film is exhibited differently for each wavelength range instead of a simple tendency of increase or decrease for the entire wavelength range.

Figure 24:
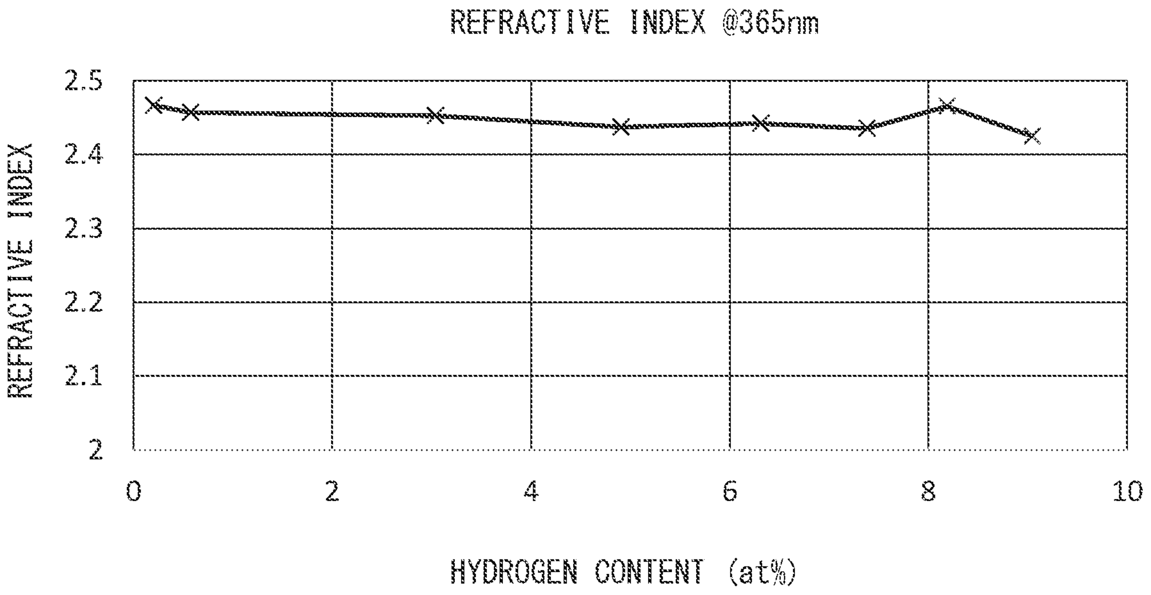
FIG. 24 is a graph illustrating a relationship between the hydrogen content and a refractive index for light of a wavelength of 365 nm.

FIG. 24 illustrates the relationship between the hydrogen content of the tantalum oxide and the refractive index for the wavelength of 365 nm. As exemplified by the value at the wavelength of 313 nm shown in Table 7 and the value at the wavelength of 365 nm shown in FIG. 24, the refractive index is high similarly to the case where the hydrogen content is extremely low as long as the hydrogen content is in the range of 1.0 at % or more and less than 10.0 at %. For example, the refractive index for light of a wavelength of 313 nm can be 2.40 or more and 2.43 or more.

As described above, as a high-performance optical film that has a high refractive index and achieves low light absorption in the ultraviolet region including the j-line, the tantalum oxide film of the present embodiment containing hydrogen by an amount in the range of 1.0 at % or more and less than 10.0 at % is preferable. Among this, an amorphous tantalum oxide film containing hydrogen by an amount of 3.0 at % or more is particularly preferable because a high refractive index of 2.40 or more and low ultraviolet light absorption of 0.3% or less can be achieved. To achieve low light absorption in the ultraviolet region including the j-line, the hydrogen content of the tantalum oxide film is preferably 3.0 at % or more, and more preferably 6.0 at % or more. A tantalum oxide film containing hydrogen by an amount more than 9.0 at % can achieve low light absorption for also light in the wavelength range of 350 nm to 500 nm. However, the tantalum oxide film of the present embodiment containing hydrogen by an amount of 9.0 at % or less can achieve especially low light absorption for light in the wavelength range of 350 nm to 500 nm.

The mechanism of how the light absorption increases and decreases in accordance with the hydrogen content of the tantalum oxide film can be considered as follows. To consider difference of absorption occurrence factor of each wavelength range, the wavelength range is divided into a first wavelength range and a second wavelength range. The first wavelength range is a range of wavelength larger than 320 nm that includes the ultraviolet region and the visible light region. The second wavelength range is a region of wavelength of 320 nm or less that is close to the absorption edge. To be noted, the absorption edge is a wavelength at which absorption derived from the size of the band gap starts occurring, and as a standard, the absorption edge is set to a wavelength at which light absorption of 0.3% occurs.

First, as an effect of addition of hydrogen, an effect of reducing the light absorption in the first wavelength range can be considered. This is because a crystal lattice defect level formed in the band gap causes the light absorption in the first wavelength range. When hydrogen is added to the film, it is expected that the hydrogen fills in the defects to exhibit an effect of passivation, and thus the film becomes a low-absorption film. In addition, it is also expected that the film becomes a high-durability film whose optical characteristics do not change much. However, as can be seen from Comparative Examples 1 and 2, in the case where the hydrogen content is as small as less than 1.0%, the band gap is hardly affected, and therefore it is not expected that a film whose light absorption is low for the second wavelength range is obtained.

Considering the case where the hydrogen content of the tantalum oxide film is 1.0 at % or more and less than 10.0%, firstly, for the first wavelength range, the passivation effect is exhibited, and the light absorption is suppressed to a low level. Further, the light absorption for the second wavelength range is also suppressed to a low level because the hydrogen content is appropriate.

It is considered that the light absorption in the second wavelength range depends on a band gap unique to the material of tantalum oxide. A dielectric material like tantalum oxide has a band gap unique to the material thereof, and the absorption edge is determined depending on the size of the band gap. In the case of tantalum oxide, the unique light absorption starts occurring at a wavelength smaller than 320 nm. In the case where the hydrogen content is 1.0 at % or more and less than 10.0 at % (preferably 3.0 at % or more and 9.0 at % or less), the amount of hydrogen required for filling in the defects as described above is exceeded, and thus excessive hydrogen is present in the film. The state of the excessive hydrogen in the film is unclear, and it is assumed that the excessive hydrogen is trapped between bonds, or generates a new bond as an OH group. As a result of this, the band structure itself unique to the material is also affected, and therefore it is considered that the band gap is expanded and the light absorption edge shifts to the small wavelength side. It is assumed that this is why the light absorption for the second wavelength range is reduced.

To be noted, in the case where the hydrogen content of the tantalum oxide film exceeds 9 at %, the amount of excessive hydrogen is large, and thus it is considered that part of the hydrogen reduces oxygen to generate oxygen deficiency, and the light absorption increases in the first wavelength range. However, since the effect of reducing the light absorption in the second wavelength range (for example, the j-line) is remarkable, the film is industrially useful in the range of less than 10.0 at %.

In addition, impurities can be also considered as other factors that affect light absorption. Argon mixed in the film during film formation can be considered as an impurity, but in all the examples and comparative examples described above, the argon contained in the film is less than 2 at %. It can be seen that in the present embodiment, a film having a high refractive index and low light absorption can be realized even in the case where the film contains argon as an impurity. In addition, since the tantalum oxide of the present embodiment does not contain an impurity other than hydrogen and argon, no light absorption derived from an element other than hydrogen and argon occurs.

As described above, in the present embodiment, the tantalum oxide film containing hydrogen by an amount in a predetermined range is used. The tantalum oxide film of the present embodiment containing hydrogen in the range of 1.0 at % or more and less than 10.0 at % is suitable for a high-performance optical film that can achieve low light absorption in the ultraviolet region (for example, including the j-line) while having a high refractive index. The tantalum oxide film of the present embodiment containing hydrogen in the range of 3.0 at % or more and 9.0 at % or less is further suitable.

Examples 6 and 7 and Comparative Example 3

Figure 20:
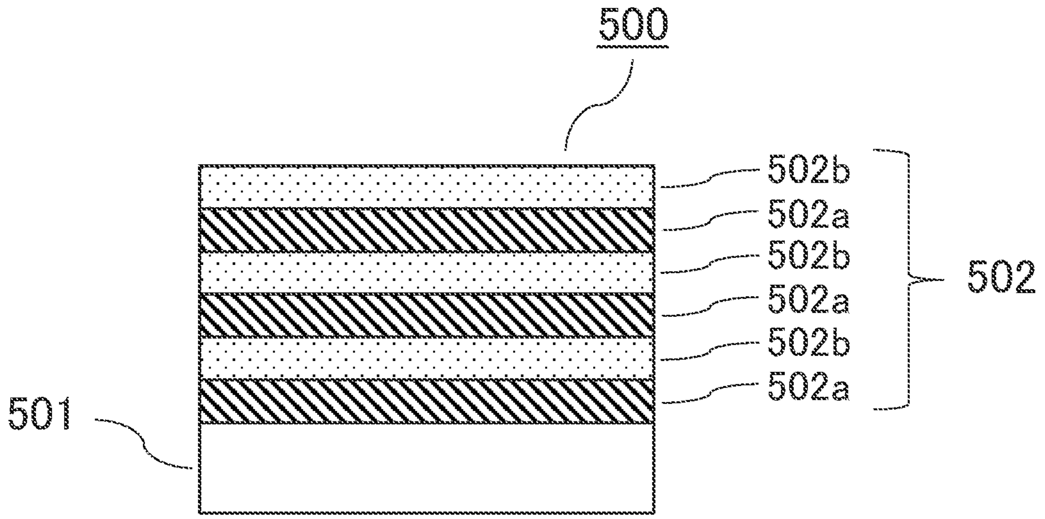
FIG. 20 is a section view of a layer structure of Examples 6 and 7 and Comparative Example 3 of the third embodiment.

Next, specific examples in which an optical structure serving as an antireflection structure is constituted by using a tantalum oxide film will be described with reference to Examples 6 and 7 and Comparative Example 3. FIG. 20 is a section view of a transmission-type optical element in which the optical structure serving as the antireflection structure is provided.

An optical element 500 includes a quartz substrate 501 serving as a base, and an optical structure 502 in which high-refractive-index layers 502*a* formed from a high-refractive-index material and low-refractive-index layers 502*b* formed from a low-refractive-index material, which are six layers in total are alternately laminated.

The high-refractive-index layers 502*a* were formed from tantalum oxide containing hydrogen. The low-refractive-index layers 502*b* serving as the second and fourth layers were formed from silicon oxide, and the low-refractive-index layer 502*b* serving as the sixth layer that was the outermost layer was formed from magnesium fluoride. Here, the configuration of the optical structure was determined by optimizing the physical film thickness of each layer of the optical element 500 in consideration of application to an exposing apparatus. That is, a design to maximize the antireflection characteristic in the wavelength range of 310 nm to 450 nm including the g-line, h-line, i-line, and j-line, which are characteristic bright-lines of an exposing light source is employed. To be noted, it goes without saying that the design to optimize the antireflection characteristic can be changed in accordance with the wavelength range of the used light source.

Example 6 is an optical element in which high-refractive-index layers formed from tantalum oxide containing 9.0 at % of hydrogen described as Example 4 and the low-refractive-index layers described above are alternately laminated on the quartz substrate 501.

Example 7 is an optical element in which high-refractive-index layers formed from tantalum oxide containing 9.6 at % of hydrogen described as Example 5 and the low-refractive-index layers described above are alternately laminated on the quartz substrate 501.

Comparative Example 3 is an optical element in which high-refractive index layers formed from tantalum oxide containing 0.2 at % of hydrogen described as Comparative Example 1 and the low-refractive-index layers described above are alternately laminated on the quartz substrate 501.

Table 9 shows specifications of each layer of the optical element of Example 6.

TABLE 9

| | Material | Refractive index | Physical film thickness (nm) |
|---|---|---|---|
| Sixth layer | Magnesium fluoride | 1.47 | 70.5 |
| Fifth layer | Tantalum oxide | 2.43 | 23.7 |
| Fourth layer | Silicon oxide | 1.49 | 17.5 |
| Third layer | Tantalum oxide | 2.43 | 27.6 |
| Second layer | Silicon oxide | 1.49 | 30.8 |
| First layer | Tantalum oxide | 2.43 | 8.8 |
| Base | Quartz glass | 1.48 | — |

Table 10 shows specifications of each layer of the optical element of Example 7.

TABLE 10

| | Material | Refractive index | Physical film thickness (nm) |
|---|---|---|---|
| Sixth layer | Magnesium fluoride | 1.47 | 70.5 |
| Fifth layer | Tantalum oxide | 2.43 | 23.7 |
| Fourth layer | Silicon oxide | 1.49 | 17.5 |
| Third layer | Tantalum oxide | 2.43 | 27.6 |
| Second layer | Silicon oxide | 1.49 | 30.8 |
| First layer | Tantalum oxide | 2.43 | 8.8 |
| Base | Quartz glass | 1.48 | — |

Table 11 shows specifications of each layer of the optical element of Comparative Example 3.

TABLE 11

| | Material | Refractive index | Physical film thickness (nm) |
|---|---|---|---|
| Sixth layer | Magnesium fluoride | 1.47 | 70.5 |
| Fifth layer | Tantalum oxide | 2.46 | 23.7 |
| Fourth layer | Silicon oxide | 1.49 | 17.5 |
| Third layer | Tantalum oxide | 2.46 | 27.6 |
| Second layer | Silicon oxide | 1.49 | 30.8 |
| First layer | Tantalum oxide | 2.46 | 8.8 |
| Base | Quartz glass | 1.48 | — |

Figure 21:
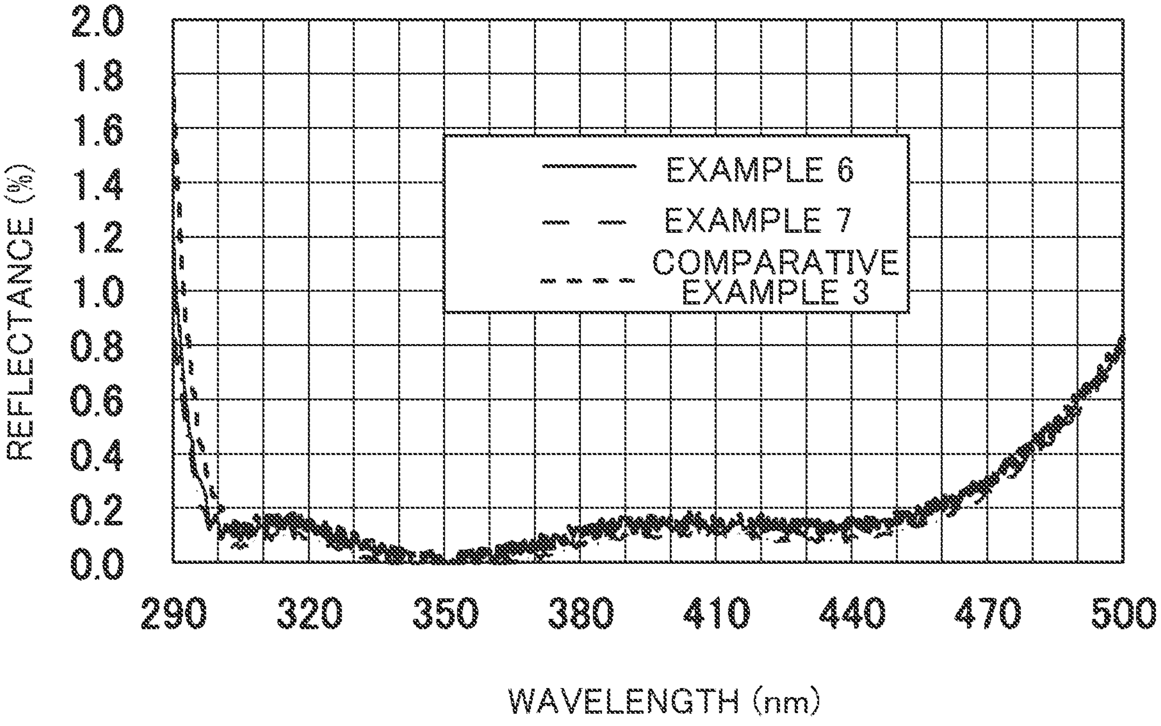
FIG. 21 is a graph illustrating wavelength dependency of reflectance of Examples 6 and 7 and Comparative Example 3 of the third embodiment.
Figure 22:
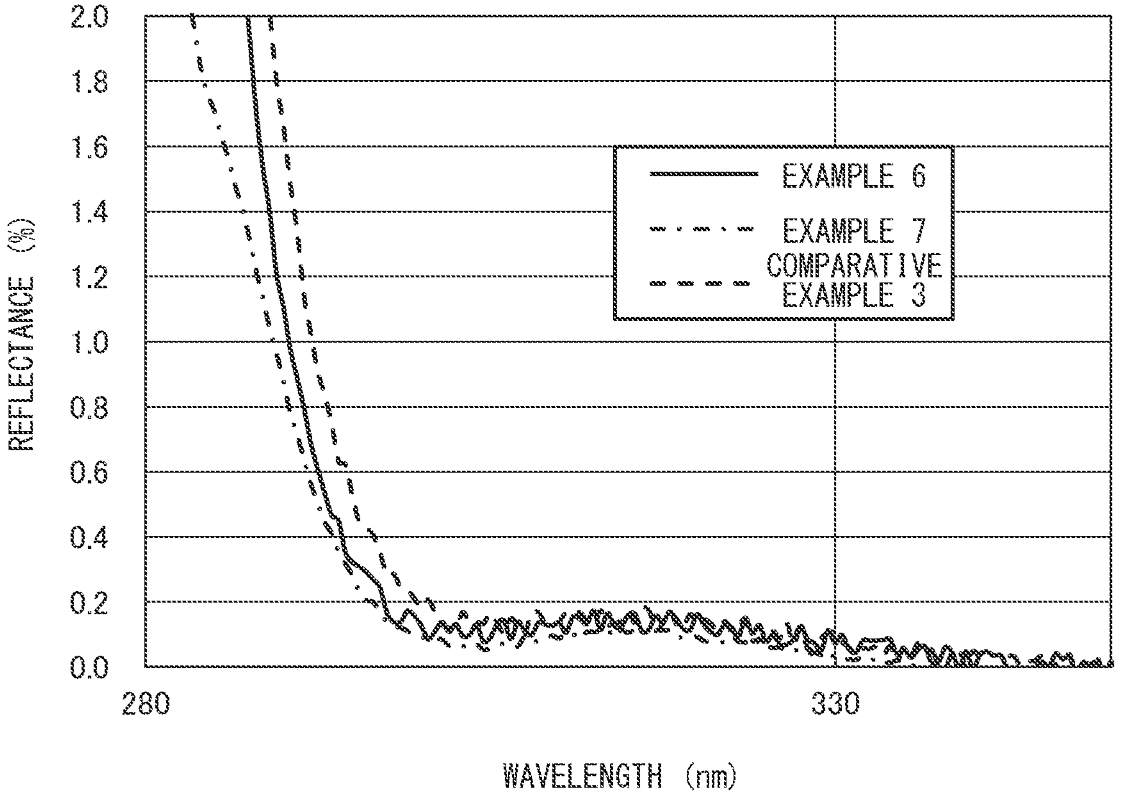
FIG. 22 is a partial enlarged view of the short wavelength side of the graph of FIG. 21.
Figure 23:
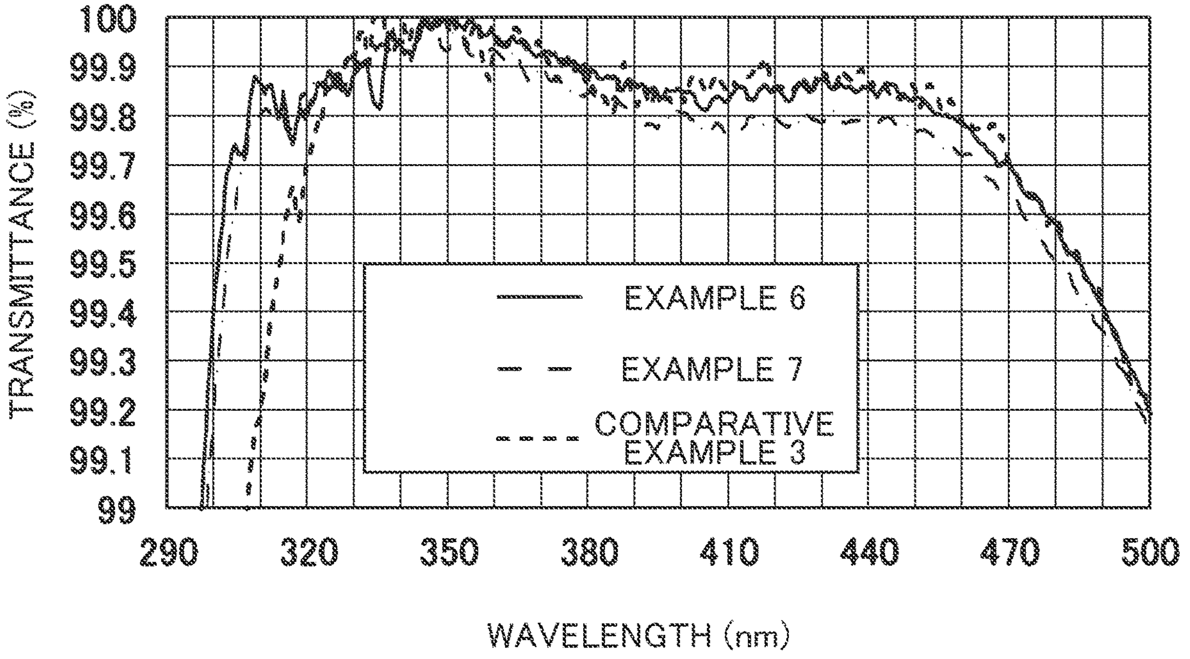
FIG. 23 is a graph illustrating wavelength dependency of transmittance of Examples 6 and 7 and Comparative Example 3 of the third embodiment.

FIG. 21 illustrates a graph showing the refractive index characteristic of the optical structures of Examples 6 and 7 and Comparative Example 3. FIG. 22 is a graph in which the small wavelength side of FIG. 21 is extracted and enlarged. FIG. 23 is a graph showing the transmittance characteristic of the optical structures of Examples 6 and 7 and Comparative Example 3.

As can be seen from FIG. 23, Examples 6 and 7 achieve higher transmittance than Comparative Example 3 particularly in the ultraviolet region. This matches the results that the tantalum oxide film having a high refractive index and low light absorption in the ultraviolet region is obtained in Examples 4 and 5.

In addition, as can be seen from FIG. 21, Examples 6 and 7 are equivalent to Comparative Example 3 in the wavelength range of 300 nm to 500 nm. In addition, as illustrated in FIG. 22, in the DUV region of the wavelength of 290 nm to 300 nm, the reflectance is remarkably reduced in Examples 6 and 7 as compared with Comparative Example 3. This suggests the possibility that containing hydrogen by an amount in a predetermined range improves the refractive index for the light of the DUV region. In addition, the tantalum oxide film has a lower refractive index in Examples 6 and 7 than in Comparative Example 3, and therefore the reflectance theoretically obtained just from the relationship with the refractive index assuming that there is no absorption should be higher in Examples 6 and 7 than in Comparative Example 3. However, the results shown in FIGS. 21 and 22 which take absorption into consideration indicate that the difference in the reflectance between Examples 6 and 7 and Comparative Example 3 is smaller than that of the theoretical reflectance or that the reflectance is lower in Examples 6 and 7 than in Comparative Example 3. This is assumed to be because the reflection characteristic is affected by the absorption. That is, regarding an optical structure theoretically designed to be optimized to a virtual complex refractive index (extinction coefficient=0), the imaginary part (extinction coefficient) of the complex refractive index is smaller and difference thereof from the virtual complex refractive index is smaller in Examples 6 and 7 than in Comparative Example 3. Therefore, it can be considered that deviation from the optimized design of the optical structure is smaller in Examples 6 and 7 than in Comparative Example 3, and therefore better optical characteristics can be realized.

According to these results, in the case of using a light source whose light intensity is high in a wavelength range of the j-line or shorter, the hydrogen content of the tantalum oxide film that constitutes an optical structure serving as an antireflection structure is preferably set in the range of 1.0 at % or more and less than 10.0 at %, and is particularly preferably set in the range of 3.0 at % or more and 9.0 at % or less.

In addition, in the case of using a light source that outputs light of a wide wavelength range including the j-line and the g-line, the hydrogen content of the tantalum oxide film that constitutes an optical structure serving as an antireflection structure is preferably set in the range of 1.0 at % or more and less than 10.0 at %. The hydrogen content is particularly preferably set in the range of 3.0 at % or more and 9.0 at % or less because low light absorption can be also achieved for light of the wavelength range of 350 nm to 500 nm.

As described above, by using a tantalum oxide film containing hydrogen by an amount in a predetermined range, a film having small light loss in a wide wavelength range while maintaining a high antireflection characteristic can be realized.

Example 8 and Comparative Example 4

Figure 25:
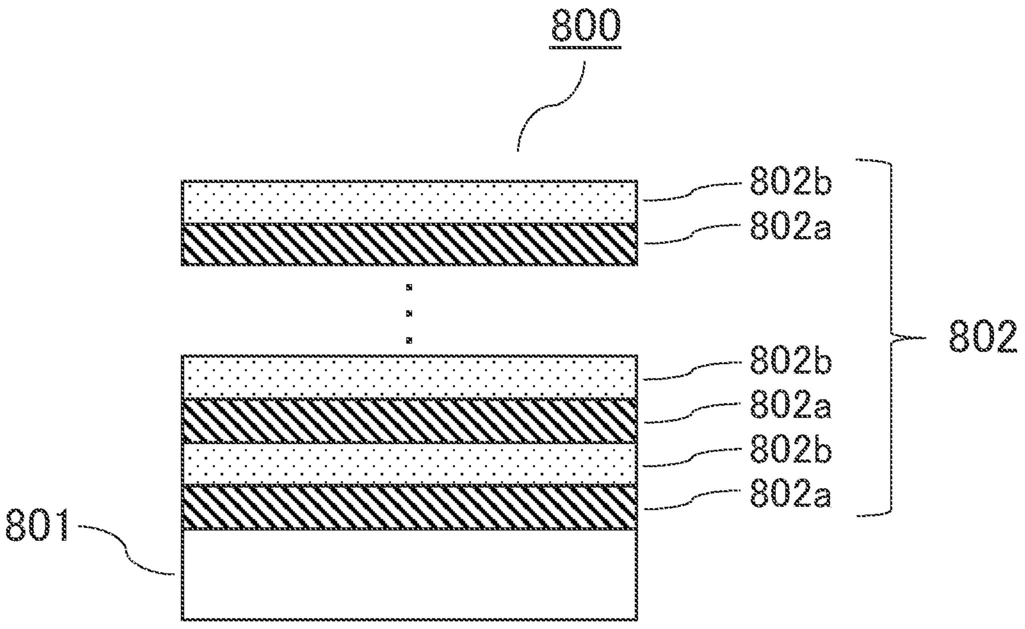
FIG. 25 is a section view of a layer structure of Example 8 and Comparative Example 4 of the third embodiment.

Next, specific examples in which an optical structure serving as a reflection structure is constituted by using a tantalum oxide film will be described with reference to Example 8 and Comparative Example 4. FIG. 25 is a section view of a reflection-type optical element in which the optical structure serving as the reflection structure is provided.

An optical element 800 includes a quartz substrate 801 serving as a base, and an optical structure 802 in which high-refractive-index layers **802*a* formed from a high-refractive-index material and low-refractive-index layers 802*b*** formed from a low-refractive-index material, which are 52 layers in total are alternately laminated.

The high-refractive-index layers **802*a* were formed from tantalum oxide containing hydrogen. The low-refractive-index layers 802*b* were formed from silicon oxide. The configuration of the optical structure was determined by optimizing the physical film thickness of each layer of the optical element 800 to maximize the reflection characteristic in the wavelength range of 310 nm to 450 nm in consideration of the use purpose of the optical element 800**. To be noted, it goes without saying that the design to optimize the reflection characteristic can be changed in accordance with the wavelength range of the used light source.

Example 8 is an optical element in which high-refractive index layers formed from tantalum oxide containing 9.0 at % of hydrogen described as Example 4 and the low-refractive-index layers described above are alternately laminated on the quartz substrate 801.

Comparative Example 4 is an optical element in which high-refractive index layers formed from tantalum oxide containing 0.2 at % of hydrogen described as Comparative Example 1 and the low-refractive-index layers described above are alternately laminated on the quartz substrate 801.

Table 12 shows specifications of each layer of the optical element of Example 8.

TABLE 12

| | Material | Refractive index | Physical film thickness (nm) |
|---|---|---|---|
| 52nd layer | Silicon oxide | 1.49 | 59.25 |
| 51st layer | Tantalum oxide | 2.43 | 25.14 |
| 50th layer | Silicon oxide | 1.49 | 58.5 |
| 42nd to 49th layers | Tantalum oxide | 2.43 | 35.69 |
| | Silicon oxide | 1.49 | 56.6 |
| 41st layer | Tantalum oxide | 2.43 | 31.17 |
| 40th layer | Silicon oxide | 1.49 | 53.89 |
| 32nd to 39th layers | Tantalum oxide | 2.43 | 38.78 |
| | Silicon oxide | 1.49 | 72.62 |
| 31st layer | Tantalum oxide | 2.43 | 48.3 |
| 30th layer | Silicon oxide | 1.49 | 63.18 |
| 22nd to 29th layers | Tantalum oxide | 2.43 | 42.67 |
| | Silicon oxide | 1.49 | 75.74 |
| 21st layer | Tantalum oxide | 2.43 | 44.23 |
| 20th layer | Silicon oxide | 1.49 | 73.43 |
| 12th to 19th layers | Tantalum oxide | 2.43 | 54.97 |
| | Silicon oxide | 1.49 | 83 |
| 11th layer | Tantalum oxide | 2.43 | 44.19 |
| 10th layer | Silicon oxide | 1.49 | 90.67 |
| 2nd to 9th layers | Tantalum oxide | 2.43 | 43.52 |
| | Silicon oxide | 1.49 | 100.98 |
| 1st layer | Tantalum oxide | 2.46 | 48.44 |
| Base | Quartz glass | 1.48 | — |

Table 13 shows specifications of each layer of the optical element of Comparative Example 4.

TABLE 13

| | Material | Refractive index | Physical film thickness (nm) |
|---|---|---|---|
| 52nd layer | Silicon oxide | 1.49 | 59.25 |
| 51st layer | Tantalum oxide | 2.46 | 25.14 |
| 50th layer | Silicon oxide | 1.49 | 58.5 |
| 42nd to 49th layers | Tantalum oxide | 2.46 | 35.69 |
| | Silicon oxide | 1.49 | 56.6 |
| 41st layer | Tantalum oxide | 2.46 | 31.17 |
| 40th layer | Silicon oxide | 1.49 | 53.89 |
| 32nd to 39th layers | Tantalum oxide | 2.46 | 38.78 |
| | Silicon oxide | 1.49 | 72.62 |
| 31st layer | Tantalum oxide | 2.46 | 48.3 |
| 30th layer | Silicon oxide | 1.49 | 63.18 |
| 22nd to 29th layers | Tantalum oxide | 2.46 | 42.67 |
| | Silicon oxide | 1.49 | 75.74 |
| 21st layer | Tantalum oxide | 2.46 | 44.23 |
| 20th layer | Silicon oxide | 1.49 | 73.43 |
| 12th to 19th layers | Tantalum oxide | 2.46 | 54.97 |
| | Silicon oxide | 1.49 | 83 |
| 11th layer | Tantalum oxide | 2.46 | 44.19 |
| 10th layer | Silicon oxide | 1.49 | 90.67 |
| 2nd to 9th layers | Tantalum oxide | 2.46 | 43.52 |
| | Silicon oxide | 1.49 | 100.98 |
| 1st layer | Tantalum oxide | 2.46 | 48.44 |
| Base | Quartz glass | 1.48 | — |

Figure 26:
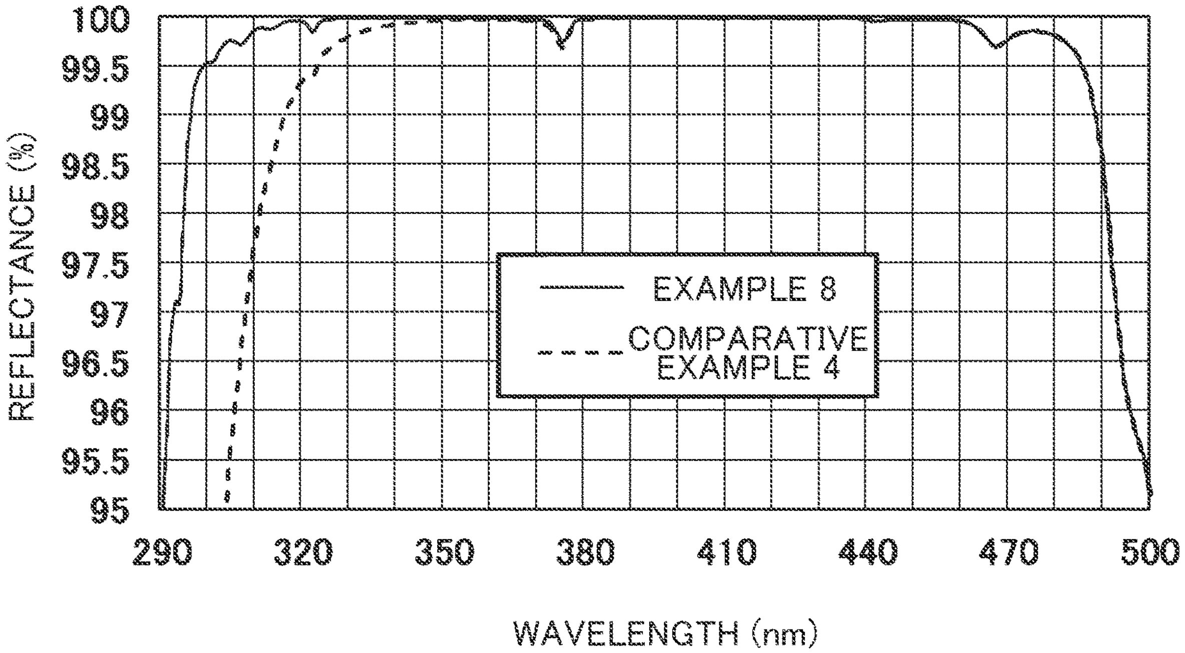
FIG. 26 is a graph illustrating wavelength dependency of reflectance of Example 8 and Comparative Example 4 of the third embodiment.

FIG. 26 shows the reflectance characteristics of the optical structure of Example 8 and Comparative Example 4. For example, when comparison is made for the reflectance for 313 nm, the reflectance of Comparative Example 4 in which tantalum oxide containing 0.2 at % of hydrogen is used is 98.5%. In contrast, the reflectance of Example 8 in which tantalum oxide containing 9.0 at % of hydrogen is used is 99.9%, which is higher than in Comparative Example 4. Since the variation of the refractive index depending on the hydrogen content is small, it can be considered that this difference in the reflectance originates from difference in the light absorption of light near 313 nm in the tantalum oxide film or layer. As described above, by using the tantalum oxide film containing hydrogen by an amount in a predetermined range, absorption of ultraviolet light can be suppressed, and high reflectance can be realized.

In the case of using a light source whose light intensity is high in a wavelength range of the j-line or shorter, the hydrogen content of the tantalum oxide film that constitutes an optical structure serving as a reflection structure is preferably set in the range of 1.0 at % or more and less than 10.0 at %, and is particularly preferably set in the range of 3.0 at % or more and 9.0 at % or less.

In addition, in the case of using a light source that outputs light of a wide wavelength range including the j-line and the g-line, the hydrogen content of the tantalum oxide film that constitutes an optical structure serving as a reflection structure is preferably set in the range of 1.0 at % or more and less than 10.0 at %. The hydrogen content is particularly preferably set in the range of 3.0 at % or more and 9.0 at % or less because low light absorption can be also achieved for light of the wavelength range of 350 nm to 500 nm.

Example 9 and Comparative Example 5

Specific examples in which at least one lens among a lens group included in an exposing apparatus is coated with an optical structure serving as an antireflection structure will be described. Example 9 is a lens group in which both surfaces of fifteen lenses included in the exposing apparatus, that is, thirty surfaces in total are provided with the optical structure serving as an antireflection structure described as Example 6. That is, in Example 9, an optical structure in which tantalum oxide films containing 9.0 at % of hydrogen serving as high-refractive-index layers and low-refractive-index layers were alternately laminated was formed on the surface of each lens. In addition, Comparative Example 5 is a lens group in which both surfaces of fifteen lenses included in the exposing apparatus, that is, thirty surfaces in total are provided with the optical structure serving as an antireflection structure described as Comparative Example 3. That is, in Comparative Example 5, an optical structure in which tantalum oxide films containing 0.2 at % of hydrogen serving as high-refractive index layers and low-refractive-index layers were alternately laminated was formed on the surface of each lens.

For Example 9 and Comparative Example 5, transmission loss was measured by using ultraviolet light of 313 nm to evaluate the aptitude for lenses of an exposing apparatus including a light source of a wavelength range up to the j-line. Although evaluation was made by focusing on the j-line at which absorption occurs in a conventional tantalum oxide film, the aptitude for an optical element may be evaluated for the light emission wavelength of the light source in the case of using a light source of a light emission wavelength range including infrared light and visible light.

Table 14 shows the evaluation results.

TABLE 14

| | | Example 9 | Comparative Example 5 |
|---|---|---|---|
| Hydrogen content | | 9.0 at % | 0.2 at % |
| Optical characteristics for 313 nm per surface of lens | Light absorptance | 0.06% | 0.40% |
| | Reflectance | 0.14% | 0.14% |
| | Transmission loss | 0.19% | 0.54% |
| Transmission loss of thirty surfaces of lenses in total | | 5.60% | 15.10% |

In the lens group of Example 9, a low light absorptance and a low refractive index are simultaneously achieved in each surface, transmission loss can be greatly reduced, and thus the total transmission loss for the thirty surfaces of the fifteen lenses can be suppressed to 10% or less. In contrast, in Comparative Example 5, the light absorptance is remarkably higher than in Example 9, and therefore the total transmission loss for the thirty surfaces of the fifteen lenses is as high as 15% or more.

By using the lens group of Example 9 as, for example, an illumination lens group or a projection lens group of the exposing apparatus, the lens group can be used without cutting off ultraviolet light that has been conventionally cut off to prevent heat generation caused by light absorption, and an effect of increasing the total exposure intensity of the exposing apparatus can be obtained. Therefore, the exposure time can be shortened, and thus the processing performance (throughput) of the exposing apparatus can be improved.

Example 10

An example in which the tantalum oxide film containing hydrogen by an amount in a predetermined range such as the film of one of Examples 1 to 5 is applied to an optical part of a FPD exposing apparatus such as a reflection mirror used for manufacture of a flat panel display: FPD such as a liquid crystal display will be described. To be noted, the amount in the predetermined range refers to a hydrogen content (at %) described in the description of the above examples.

Figure 28:
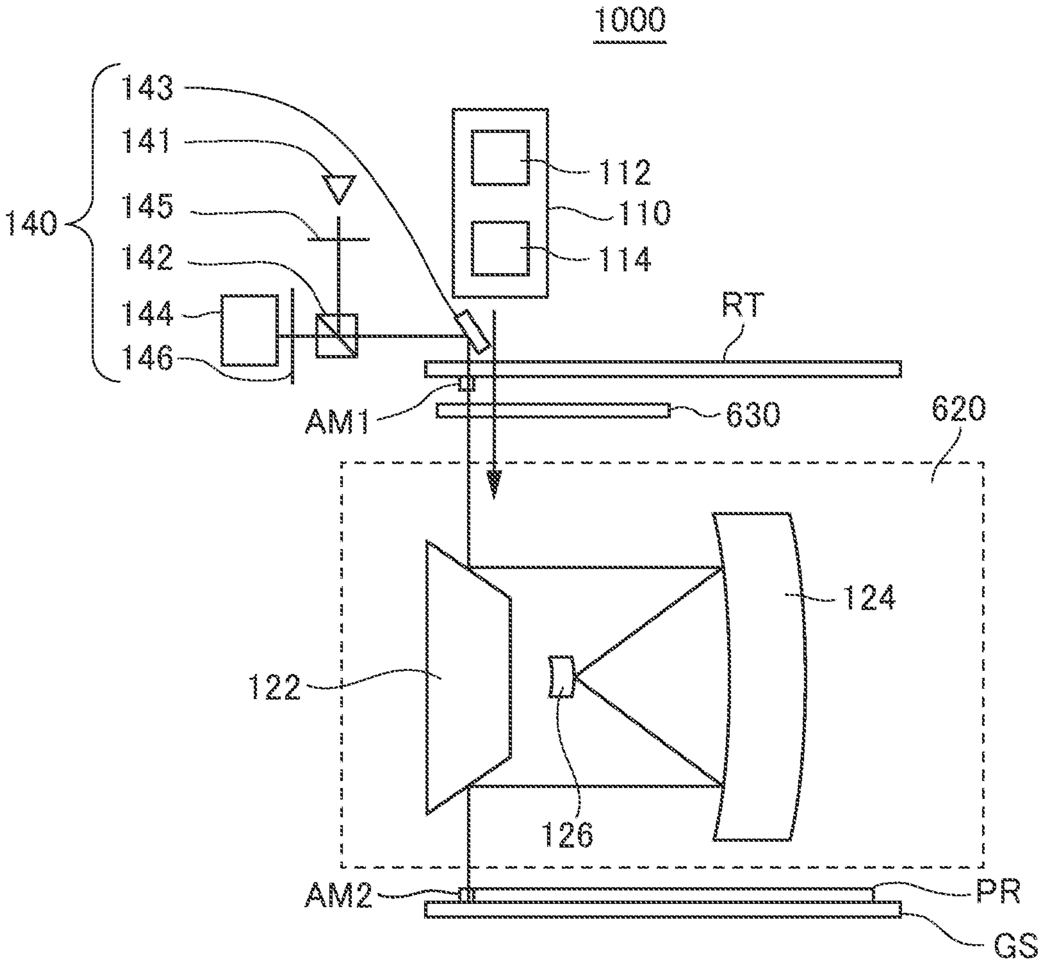
FIG. 28 is a schematic diagram illustrating a configuration of an exposing apparatus of Example 10 of the third embodiment.

FIG. 28 is a schematic section view of an exposing apparatus 1000 of the present example. For example, the exposing apparatus 1000 is a projection exposing apparatus that exposes a processing target GS coated with a photoresist PR to a circuit pattern formed in a reticle RT by the step-and-scan method. For example, the exposing apparatus 1000 is preferably used for manufacture of a liquid crystal display. The processing target GS is, for example, a glass substrate. The exposing apparatus 1000 also includes an observation mechanism for observing the reticle RT and the processing target GS. As illustrated in FIG. 28, the exposing apparatus 1000 includes an illumination apparatus 110, a projection optical system 620, a correction optical system 630, and an alignment mechanism 140.

The illumination apparatus 110 illuminates the reticle RT in which a pattern to be transferred is formed, and includes a light source portion 112 and an illumination optical system 114. A mercury lamp is used for the light source portion 112. Therefore, the light source portion 112 outputs ultraviolet light of a wavelength range of 240 nm to 400 nm including deep ultraviolet light of a wavelength of 300 nm or less. To be noted, the number of light sources is not limited. The illumination optical system 114 is an optical system that illuminates the reticle RT.

The illumination optical system 114 includes a lens, a mirror, an optical integrator, an aperture, and so forth. For example, in the illumination optical system 114, a condenser lens, an optical integrator, an aperture stop, a condenser lens, a slit, and an imaging optical system are arranged in this order. Examples of the optical integrator include a fly eye lens and an integrator constituted by two overlapping cylindrical lens arrays or two overlapping lenticular lenses, but the optical integrator can be replaced by an optical rod or a diffraction grating. In a transmission-type optical element such as a lens included in the illumination optical system 114, an antireflection structure exemplified in Example 6 or 7 is formed. In a reflection-type optical element such as a mirror included in the illumination optical system 114, a reflection structure exemplified in Example 8 is formed.

The projection optical system 620 is an optical system that projects the pattern of the reticle RT onto the processing target GS. The projection optical system 620 of the present example illustrated in FIG. 28 is constituted by a flat mirror 122, a concave mirror 124, and a convex mirror 126, but the configuration is not limited to this. The reflection structure exemplified in Example 8 is formed on the reflection surface of each mirror constituting the projection optical system 620. As described above, a reflection mirror including the reflection structure has an extremely small loss by light absorption, and has a high reflectance for the wavelength range of the exposing light, and thus high illuminance can be obtained, and the exposing process can be executed at a high throughput.

The correction optical system 630 is an optical system that corrects the aberration of the projection optical system 620. The correction optical system 630 includes one or more optical elements. In the present example, the correction optical system 630 is constituted by correction glass on which the antireflection structure exemplified in Example 6 or 7 is formed, and is disposed between the reticle RT and the projection optical system 620.

The alignment mechanism 140 has a function of performing alignment of the reticle RT and the processing target GS, and includes an alignment light source 141, a polarizing plate 145, a half mirror 142, a mirror 143, a polarizing plate 146, and a detector 144. The alignment light source 141 is an illumination light source of the visible light region (wavelength: 510 nm to 760 nm) for alignment. The alignment mechanism 140 is used for alignment between an alignment mark AM1 on the reticle RT and an alignment mark AM2 on the processing target GS. The optical elements included in the alignment mechanism 140 can be provided with the antireflection structure exemplified in Example 6 or 7, or the reflection structure exemplified in Example 8.

The light beam from the alignment light source 141 is linearly polarized by the polarizing plate 145, and illuminates the alignment mark AM1 via the half mirror 142 and the mirror 143. Reflection light reflected on the back surface of the reticle RT is incident on the polarizing plate 146 via the mirror 143 and the half mirror 142, but the polarizing plate 146 is rotated to block the reflection light such that the reflection light is not incident on the detector 144.

Meanwhile, the light transmitted through the alignment mark AM1 is incident on the projection optical system 620. To be noted, in the present example, the arrangement is set such that light reflected five times on the flat mirror 122, the concave mirror 124, and the convex mirror 126 and then reaches the alignment mark AM2 on the processing target GS has a phase difference of 90°, and the light reaches the alignment mark AM2 as circularly polarized light.

The light reflected on the alignment mark AM2 on the processing target GS passes through the projection optical system 620 again and returns to the reticle RT. At this time, a phase difference is given to the light beam again, and therefore the light that reaches the reticle RT is linearly polarized. The polarization plane of the light beam is perpendicular to the polarization plane of an illumination light beam incident on the reticle RT. The reflection light from the processing target GS illuminates the reticle RT, passes through the half mirror 142 and the polarizing plate 146, and is incident on the detector 144. As a result of this, the detector 144 can detect the reticle RT and the processing target GS. Since the reticle RT and the processing target GS are in an optically conjugated relationship, flare derived from linear reflection light from the reticle RT can be suppressed by removing the linearly polarized light reflected on the back surface of the reticle RT. As a result of this, the detector 144 can simultaneously detect images of the reticle RT and the processing target GS at a high contrast, and thus highly precise alignment of the reticle RT and the processing target GS can be performed.

In the exposing apparatus 1000 of the present example, the light beam emitted from the illumination apparatus 110, for example, Köhler-illuminates the reticle RT. Light that passes through the reticle RT and reflects the reticle pattern is focused on the processing target GS by the projection optical system 620. In the present example, antireflection structures or reflection structures using the tantalum oxide film including hydrogen by an amount in a predetermined range are provided on optical surfaces of optical elements disposed on the optical path, and therefore loss of the light amount of the exposing light and alignment light can be suppressed. Particularly, using a reflection mirror on which the tantalum oxide film containing hydrogen of a predetermined content in the projection optical system 620 is effective.

In the exposing apparatus 1000 of the present example, loss of the light amount of the exposing light and alignment light is suppressed, and exposure can be economically performed at a high resolution and a high throughput. Further, since heat generation of optical elements caused by light absorption is suppressed, highly precise alignment and exposure can be stably executed. To be noted, the tantalum oxide film containing hydrogen by an amount in a predetermined range does not have to be formed on all optical surfaces of the optical elements disposed on the optical path as in the examples described above, and the tantalum oxide film may be provided to only arbitrary optical surfaces where it is particularly desired to suppress absorption of ultraviolet light.

FOURTH EMBODIMENT

The substrate on which the optical structure is provided may have a photoelectric structure. The photoelectric structure is a structure that converts an electric signal into an optical signal or an optical signal into an electric signal. An image pickup element (image pickup device) is a kind of an optical element because the image pickup element handles light, and is a kind of a semiconductor element (semiconductor device) because the image pickup element includes a photodiode and a transistor. In an image pickup element of a backside illumination type, photodiodes PD corresponding to respective pixels are formed in a semiconductor substrate. The semiconductor substrate functions as a base including a photoelectric structure for converting an optical signal into an electric signal realized by a photodiode. In addition, various cameras such as lens-replacing cameras and lens-integrated cameras, and camera modules for smartphones and vehicles can be produced by using an image pickup element including the antireflection structure described above. A camera module can include a holding part such as a frame that holds a plurality of optical parts including the lens and the image pickup element. As a matter of course, the lens of the camera module may be coated with the tantalum oxide film.

In addition, the optical element including a substrate including a photoelectric structure may be a liquid crystal display or an OEL display. A reflection structure may be provided to improve the light usage efficiency of the OEL display, and the optical structure including tantalum oxide may be employed for the reflection structure. An electronic equipment such as a camera or a smartphone can include, in addition to the optical element including the substrate having the photoelectric structure, a controller for electrically controlling the photoelectric structure. In addition, in the case where the optical element is an image pickup element (image pickup device), the electronic equipment can include a processor for processing a signal output from the image pickup element. In addition, in the case where the optical element is a display element (display device), the electronic equipment can include a processor for processing a signal input to the display element. The electronic equipment to which the present embodiment is applicable may be an information equipment such as a smartphone or a personal computer. Alternatively, the electronic equipment may be an office appliance such as a printer or a copier, a medical equipment such as an X-ray imaging apparatus or an endoscope, an industrial equipment such as a robot or a semiconductor manufacturing apparatus, or a transportation equipment such as a vehicle, an airplane, or a ship.

Example 11

As Example 11, an example in which the tantalum oxide film containing hydrogen by an amount in a predetermined range is applied to an image pickup element will be described. To be noted, the amount in the predetermined range refers to the content (at %) described in the description of the above examples.

Figure 29:
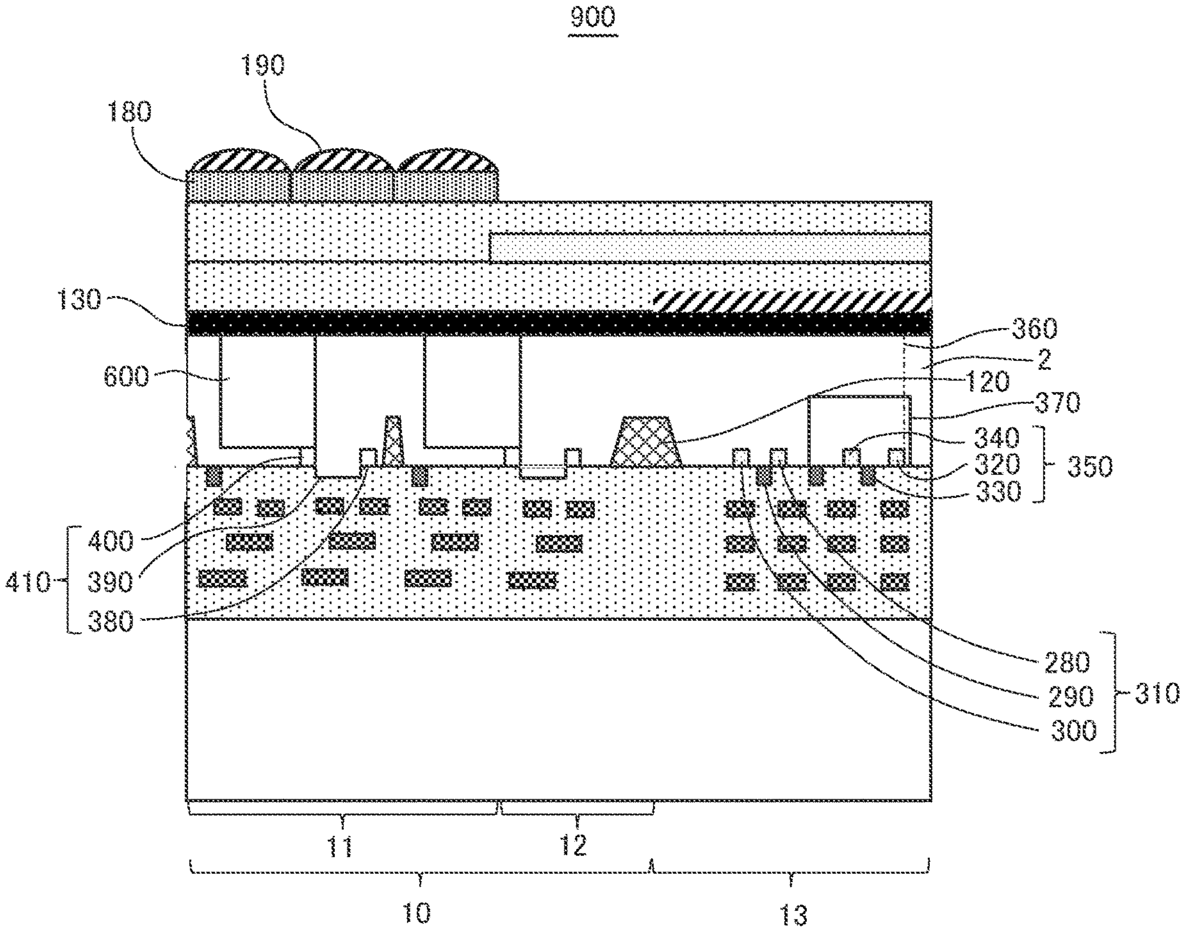
FIG. 29 is a schematic section view of a solid-state image pickup element of Example 11 of a fourth embodiment.

A solid-state image pickup element 900 of Example 11 will be described with reference to FIG. 29. The solid-state image pickup element 900 is a CMOS sensor of a back illumination type. However, implementation of the present invention is not necessarily limited to a CMOS sensor of a back illumination type. That is, the embodiment of the present invention may be a solid-state image pickup element in which the tantalum oxide film containing hydrogen by an amount in a predetermined range is disposed in an optical path of imaging light.

A semiconductor substrate 2 has a first surface on which light is incident, and a second surface opposite to the first surface. As the semiconductor substrate 2, for example, a silicon substrate can be used. The semiconductor substrate 2 includes a photoelectric conversion portion 600 that photoelectrically converts light incident thereon and accumulates first charges, and a first transistor 410 including a first gate 390 on the second surface. The semiconductor substrate 2 includes a second transistor 310 including a second gate 290 on the second surface. The first transistor 410 is an NMOS transistor that is constituted by a source 400, a drain 380, and the first gate 390 and provided in a well (p-type well 360) whose major carrier is holes.

In the semiconductor substrate 2, a separation region 120 is provided between the first transistor 410 and the second transistor 310 in plan view. As a result of this, movement of charges between the first transistor 410 and the second transistor 310 can be suppressed. The separation region 120 is embedded in a trench formed in the semiconductor substrate 2, and is constituted by an insulator, polysilicon, or one of these materials coated with a silicon oxide film. In addition, the separation region 120 may be metal embedded in the trench.

The present example includes a pixel region 10 in which a plurality of photoelectric conversion portions 600 and a plurality of first transistors 410 respectively electrically connected to the plurality of photoelectric conversion portions 600 are two-dimensionally arranged. Further, a plurality of second transistors 310 are provided outside the pixel region 10. To be noted, the semiconductor substrate 2 may include a single photoelectric conversion portion 600, a single first transistor 410, and a single second transistor 310.

The photoelectric conversion portion 600 is, for example, a photodiode. Specifically, the photoelectric conversion portion 600 includes an n-type semiconductor portion serving as part of the upper surface of the semiconductor substrate 2, and a p-type semiconductor portion.

The pixel region 10 includes an effective pixel region 11 including the plurality of photoelectric conversion portions 600, and a light-shielded pixel region (optical black) 12 that is shielded from light. In the effective pixel region 11, a light shielding wall may be provided to section each pixel. As a result of this, color mixing between pixels can be reduced. The outside of the light-shielded pixel region 12 is a peripheral circuit region 13, in which typically a repetitive arrangement structure like the pixel region 10 is not provided.

The plurality of second transistors 310 are disposed in the peripheral circuit region 13. For example, the second transistors 310 may be provided outside a region where a plurality of lens included in a microlens array 190 and a color filter 180 are two-dimensionally arranged in plan view, or may be provided in a region outside the separation region 120.

In the peripheral circuit region 13, a vertical scanning circuit, a horizontal scanning circuit, a timing generator, and an output portion are provided. Further, a signal processing portion including a signal correction portion, an analog-digital conversion portion, and so forth may be provided.

The second transistor 310 includes an NMOS transistor including the second gate 290 on the second surface of the semiconductor substrate 2 and a source 280 and a drain 300 provided in a p-type well 360. The well 360 in which the source 280 and the drain 300 of the second transistor 310 are provided serves as part of the lower surface of the semiconductor substrate 2 and part of the upper surface of the semiconductor substrate 2. For example, this well 360 is continuously provided from the first surface to the second surface of the semiconductor substrate 2. The peripheral circuit region 13 may further include a PMOS transistor 350 including a gate 330 on the second surface and a source 320 and a drain 340 provided in an n-type well 370.

A first optical film 130 constitutes an antireflection structure. In addition, the first optical film 130 can be a fixed charge film having a fixed charge of a first polarity (for example, negative polarity), and has a function of fixing charges of a second polarity (for example, positive polarity) in the semiconductor substrate 2. On the first surface of the semiconductor substrate 2, the first optical film 130 is provided in a region overlapping with at least the photoelectric conversion portions 600 serving as photoelectric structures and the second transistors 310 in plan view. Here, "fixed charge" is a charge that is present in the film and is in a fixed state not moved by an electric field or the like. The first optical film 130 is provided on at least the optical path of the imaging light to the photoelectric conversion portions 600.

In the present example, the first optical film 130 is provided on the first surface of the semiconductor substrate 2 so as to continuously cover a region directly above the plurality of photoelectric conversion portions 600, the plurality of first transistors 410, and the plurality of second transistors 310. That is, in plan view, the first optical film 130 is continuously provided so as to overlap with the plurality of photoelectric conversion portions 600, the plurality of first transistors 410, and the plurality of second transistors 310. The first optical film 130 may be, for example, provided on the entire surface of the pixel region 10 and the peripheral circuit region 13 in the upper surface of the semiconductor substrate 2. As a result of this, the first optical film 130 does not need to be removed by etching or the like, and therefore damage to the semiconductor substrate 2 can be suppressed.

To be noted, the first optical film 130 is a region that overlaps with the photoelectric conversion portions 600 and the second transistors 310 in plan view and provided on the first surface of the semiconductor substrate, and may be partially provided on the first surface of the semiconductor substrate. The first optical film 130 is preferably provided on the entirety of the first surface of the pixel region and the peripheral circuit region.

In the solid-state image pickup element 900 of Example 11, constituent elements of the first optical film 130 include a tantalum oxide film containing hydrogen by an amount in a predetermined range. Since the tantalum oxide film has low light absorption and high transmittance, loss of the amount of imaging light that reaches the photoelectric conversion portions 600 can be suppressed. To be noted, the first optical film 130 may be a single-layer film, or a laminate of a plurality of layers. Examples of a preferable configuration of the first optical film 130 include a configuration in which an aluminum oxide film and a tantalum oxide film containing hydrogen by an amount in a predetermined range are laminated in this order from the semiconductor substrate 2 side.

As the first optical film 130, a laminate of a plurality of layers having different refractive indices is preferable. In the present example, in the optical film 130, a layer of a first refractive index that is lower than a refractive index of the semiconductor substrate 2 and a layer of a second refractive index that is lower than the first refractive index are laminated in this order from the semiconductor substrate 2 side. As a result of this, total reflection on the first optical film 130 can be suppressed, and therefore light can be made incident on the photoelectric conversion portions 600 efficiently.

Although the tantalum oxide film containing hydrogen by an amount in a predetermined range is used for the first optical film 130 in the present example, the tantalum oxide film may be used for a different film provided on the optical path of the imaging light to the photoelectric conversion portions 600. To be noted, Japanese Patent Laid-Open No. 2019-212737 can be referred to for part of the solid-state image pickup element of the present example other than using the tantalum oxide film containing hydrogen by an amount in a predetermined range.

To be noted, when manufacturing the solid-state image pickup element of the present embodiment, reflection of ultraviolet light on the tantalum oxide film serving as a base is suppressed in the ultraviolet light exposure step for forming the color filter 180 and the microlens array 190. That is, halation of ultraviolet light that lowers the patterning precision is suppressed, and therefore an effect that the color filter 180 and the microlens array 190 can be formed with high shape precision can be obtained.

The image pickup element of the present example can be suitably used for imaging apparatuses such as various cameras like lens-replacing cameras and lens-integrated cameras, camera modules for smartphones and moving objects (for example, vehicles and drones), and ultraviolet cameras. Images obtained by the image pickup element may be a still image or a moving image. The imaging apparatus may include a light source (for example, ultraviolet light source).

According to the present example, for example, the sensitivity of an image pickup element for imaging visible light can be enhanced by giving the image pickup element a sensitivity not only to blue light but also to ultraviolet light for a blue image. In addition, the image pickup element may be an image pickup element including a light receiving portion (pixel) for detecting ultraviolet light in addition to a light receiving portion (pixel) of each color of R, G, and B, or an image pickup element including only pixels for imaging ultraviolet light. In the image pickup element of the present embodiment, ultraviolet light can be guided to the light receiving portion at a small loss, and therefore high sensitivity can be achieved.

The image pickup element of the present example can be used for purposes such as imaging a target object illuminated with ultraviolet light (for example, j-line) to detect minute scratches and deficiencies that are difficult to detect with visible light, or to sort plastic materials. Alternatively, the image pickup element can be used for purpose such as imaging a power facility or the like to inspect electric discharge or specify where electric discharge occurs.

Modification Examples of Third and Fourth Embodiments

To be noted, the present invention is not limited to the embodiments and examples described above, and can be modified in many ways within the technical concept of the present invention. For example, a plurality of embodiments can be combined. In addition, part of elements of the embodiments can be omitted or replaced. In addition, new matter can be added to the embodiments.

The number of layers constituting the optical structure (for example, antireflection structure or reflection structure) of the present invention, the thickness of each layer, the material used for the low-refractive-index layers, and the like are not limited to the examples. In short, it suffices as long as the optical structure includes, as a high-refractive-index layer on the optical path of the optical element, tantalum oxide containing hydrogen in a range of 1.0 at % or more and less than 10.0 at %. Particularly, an optical structure including a tantalum oxide film having a hydrogen content of 3.0 at % or more and 9.0 at % or less is preferable.

The optical structure implementing the present invention is preferably provided on the optical path of, for example, light of a wavelength within the range of 290 nm to 500 nm, but light out of the range described above may be incident on the optical path.

An optical element including the high-refractive-index film according to the present invention can be used for pieces of optical equipments such as exposing apparatuses, various cameras, and replacing lenses. These pieces of optical equipments can include, in addition to a plurality of optical parts including optical elements coated with the tantalum oxide film containing hydrogen of a predetermined amount, a holding part (for example, a mirror holder) that holds the plurality of optical parts. In an exposing apparatus including an ultraviolet light source (for example, for manufacture of a flat panel display), the exposing performance of the exposing apparatus can be improved by providing the antireflection structure of the embodiments on a lens and/or providing the reflection structure of the embodiments on a mirror.

The tantalum oxide film as a high-refractive-index film can be applied to not only an optical element but also an electric element such as a transistor or a capacitor. For example, the tantalum oxide film can be applied to a gate insulating film of a MOSFET or TFT that is a semiconductor element, or an insulating film (dielectric film) between electrodes of a capacitor element. In these electric elements, by setting the hydrogen content of amorphous tantalum oxide to 1.0 at % or more, low leak current can be achieved, and thus a high-performance electric element can be realized. To be noted, no merit has been found in setting the hydrogen content of a crystalline (single crystal or polycrystal) tantalum oxide film to 1.0 at % or more with respect to a case where the hydrogen content is less than 1.0 at %. The tantalum oxide film can be also employed for a gate insulating film of at least one of the various transistors of the solid-state image pickup element 900 described above. A highly dielectric film can be widely applied to a gate insulating film of various transistors, and can be implemented in various semiconductor elements such as memories, processors, and logic ICs, and various pieces of electronic equipments such as smartphones and personal computers.

The electronic equipment to which the present embodiment is applicable may be an information equipment such as a smartphone or a personal computer or a communication equipment such as a modem or a router. Alternatively, the electronic equipment may be an office appliance such as a printer or a copier, a medical equipment such as an X-ray imaging apparatus or an endoscope, an industrial equipment such as a robot or a semiconductor manufacturing apparatus, or a transportation equipment such as a vehicle, an airplane, or a ship.

The embodiments described above can be changed appropriately within the technical concept. For example, a plurality of embodiments can be combined. In addition, part of elements of at least one embodiment can be omitted or replaced. In addition, new matter can be added to at least one embodiment.

Furthermore, the contents of disclosure in the present specification include not only contents described in the present specification but also all of the items which are understandable from the present specification and the drawings accompanying the present specification. Moreover, the contents of disclosure in the present specification include a complementary set of concepts described in the present specification. Thus, if, in the present specification, there is a description indicating that, for example, "A is B", even when a description indicating that "A is not B" is omitted, the present specification can be said to disclose a description indicating that "A is not B". This is because, in a case where there is a description indicating that "A is B", taking into consideration a case where "A is not B" is a premise.

In addition, regarding specific ranges of numerical values described as examples in the present specification, description of e to f (e and f are numerical values) means e and more and/or f or less. In addition, regarding specific ranges of numerical values described above, in the case where, a range of i to j and a range of m to n (i, j, m, and n are numerical values) are described together, the pair of the lower limit and the upper limit is not limited to the pair of i and j or the pair of m and n. For example, lower limits and upper limits of a plurality of pairs may be considered in combination. That is, in the case where a range of i to j and a range of m to n are described together, a range of i to n may be considered and a range of m to j may be considered as long as there is no contradiction. In addition, e or more means being equal to e or more than e (exceeding e), and a value larger than e may be employed without employing e. In addition, f or less means being equal to f or less than f (not reaching f), and a value smaller than f may be employed without employing f.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-085226, filed May 20, 2021, Japanese Patent Application No. 2021-203078, filed Dec. 15, 2021, and Japanese Patent Application No. 2022-075657, filed May 2, 2022, which are hereby incorporated by reference herein in their entirety.

What is claimed is:

1. An optical element, comprising:

a base; and an optical structure formed on the base, the optical structure including alternately laminated layers of a first type and layers of a second type; and a film constituting each of the layers of the first type is amorphous and comprises hydrogen and an oxide of transition metal of groups 3 to 11, wherein a sum of contents of the transition metal and oxygen in the film is higher than a content of hydrogen in the film, each content being specified in atomic percentage, and the content of hydrogen in the film is at least 1.0 at %, wherein the oxide of transition metal comprises tantalum oxide, and wherein an absorptance for light of a wavelength of 313 nm is 0.40% or less, and a refractive index for the light of a wavelength of 313 nm is 2.40 or more.

2. The optical element according to claim 1, wherein the content of hydrogen in the film is equal to or less than a half of the content of transition metal.

3. The optical element according to claim 1, wherein the transition metal is of groups 4 or 5.

4. The optical element according claim 3, wherein the transition metal is of periods 5 or 6.

5. The optical element according to claim 1, wherein the content of hydrogen is less than 10.0 at %.

6. The optical element according to claim 1, wherein the content of hydrogen is 3.0 at % or more.

7. The optical element according to claim 1, wherein the film comprises an element of group 18, and a content of the element of group 18 in the film is lower than the content of hydrogen in the film.

8. The optical element according to claim 1, wherein the layers of the second type have a lower refractive index than the refractive index of the layers of the first type.

9. An optical element, comprising:

a base; and an optical structure formed on the base;

the optical structure comprising an amorphous film, the film comprising hydrogen, an oxide of transition metal of groups of 3 to 11, and an element of group 18, wherein a sum of contents of the transition metal and oxygen in the film is higher than a content of hydrogen in the film, each content being specified in atomic percentage, wherein the content of hydrogen in the film is 1.0 at % or more, wherein a sum of the contents of transition metal, oxygen, hydrogen and element of group 18 in the film is 99.0 at % or more, wherein the oxide of transition metal comprises hafnium oxide, and wherein the optical element has a refractive index for light of a wavelength of 280 nm of 2.15 or more, and an absorptance for light of a wavelength of 280 nm of 0.2% or less.

10. The optical element according to claim 9, wherein the content of hydrogen in the film is lower than the content of transition metal and the content of oxygen and higher than the content of element of group 18.

11. The optical element according to claim 9, wherein the content of hydrogen in the film is 16.0 at % or less.

12. The optical element according to claim 9, wherein the content of hydrogen in the film is 6.0 at % or more.

13. The optical element according to claim 9, wherein the hafnium oxide contains 0.05-0.5 at % zirconium.

14. The optical element according to claim 9, wherein a content of argon in the film is 0.5-5.0 at %.

15. The optical element according to claim 1, wherein contents of silicon, carbon, and nitrogen in the film are each less than 0.5 at %.

16. The optical element according to claim 1, wherein the film has a thickness of 10-1000 nm.

17. The optical element according to claim 1, wherein the optical element is a lens.

18. The optical element according to claim 9, wherein the optical structure has an antireflection structure.

19. The optical element according to claim 9, wherein the optical structure has a reflection structure.

20. The optical element according to claim 9, wherein the base has a photoelectric structure.

21. Optical equipment, comprising:

a plurality of optical elements; and a holding part configured to hold the plurality of optical elements, wherein the plurality of optical elements comprise the optical element according to claim 1.

22. Optical equipment, comprising:

the optical element according to claim 9; and a light source configured to generate light to irradiate the film.

23. The optical equipment according to claim 22, wherein the light has at least one wavelength within the range of 280-380 nm.

24. An optical film, comprising:

an amorphous hafnium oxide as a main component; and at least 1.0 at % hydrogen, wherein the optical film has a refractive index for light of a wavelength of 280 nm of 2.15 or more, and the optical film has an absorptance for light of a wavelength of 280 nm of 0.2% or less.

25. An optical film, comprising:

an amorphous tantalum oxide as a main component; and at least 1.0 at % or more of hydrogen, wherein the optical film has a refractive index for the light of a wavelength of 313 nm of 2.40 or more, and the optical film has an absorptance for light of a wavelength of 313 nm of 0.40% or less.

26. An exposing apparatus, comprising an optical system, wherein the optical system comprises the film according to claim 24.

27. An exposing apparatus, comprising an optical system, wherein the optical system comprises the film according to claim 25.

28. The optical element according to claim 1, wherein the film comprises argon, and an argon content of the film is 0.5 at % or more.

29. The optical element according to claim 28, wherein a sum of the transition metal content, the oxygen content, the hydrogen content, and the argon content of the film is at least 99.0 at %.

30. The optical element according to claim 28, wherein the hydrogen content of the film is lower than a sum of the transition metal content of the film and the oxygen content of the film, and the hydrogen content of the film is higher than the argon content of the film.

31. The optical element according to claim 28, wherein an argon content of the film is 5.0 at % or less.

* * * * *